(12) United States Patent
More et al.

(10) Patent No.: US 11,837,507 B2
(45) Date of Patent: Dec. 5, 2023

(54) GATE STRUCTURE AND METHOD OF FORMING SAME

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW); Chun Hsiung Tsai, Xinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/811,651

(22) Filed: Jul. 11, 2022

(65) Prior Publication Data
US 2022/0344210 A1    Oct. 27, 2022

Related U.S. Application Data

(62) Division of application No. 16/564,243, filed on Sep. 9, 2019, now Pat. No. 11,404,327.

(51) Int. Cl.
| | |
|---|---|
| *H01L 21/8238* | (2006.01) |
| *H01L 21/28* | (2006.01) |
| *H01L 21/3213* | (2006.01) |
| *H01L 29/78* | (2006.01) |
| *H01L 29/66* | (2006.01) |
| *H01L 27/092* | (2006.01) |
| *H01L 29/49* | (2006.01) |

(52) U.S. Cl.
CPC .. *H01L 21/82385* (2013.01); *H01L 21/28088* (2013.01); *H01L 21/32134* (2013.01); *H01L 21/823821* (2013.01); *H01L 27/0924* (2013.01); *H01L 29/4966* (2013.01); *H01L 29/66545* (2013.01); *H01L 29/66795* (2013.01); *H01L 29/7851* (2013.01)

(58) Field of Classification Search
CPC ......... H01L 21/82385; H01L 21/28088; H01L 21/32134; H01L 21/823821; H01L 27/0924; H01L 29/4966; H01L 29/66545; H01L 29/66795; H01L 29/7851
See application file for complete search history.

(56) References Cited

U.S. PATENT DOCUMENTS

| | | | |
|---|---|---|---|
| 10,211,108 B2 | 2/2019 | Han et al. | |
| 10,269,917 B2 * | 4/2019 | Chen | ................... H01L 29/4966 |
| 10,468,411 B2 | 11/2019 | Chung et al. | |
| 2016/0315171 A1 | 10/2016 | Hung et al. | |
| 2017/0200798 A1 | 7/2017 | Chen et al. | |
| 2018/0197786 A1 | 7/2018 | Li | |

(Continued)

*Primary Examiner* — Christine A Enad
(74) *Attorney, Agent, or Firm* — Slater Matsil, LLP

(57) ABSTRACT

A semiconductor device and a method of forming the same are provided. A method includes forming a sacrificial gate over an active region of a substrate. The sacrificial gate is removed to form an opening. A gate dielectric layer is formed on sidewalls and a bottom of the opening. A first work function layer is formed over the gate dielectric layer in the opening. A first protective layer is formed over the first work function layer in the opening. A first etch process is performed to widen an upper portion of the opening. The opening is filled with a conductive material.

20 Claims, 54 Drawing Sheets

(56) References Cited

U.S. PATENT DOCUMENTS

2019/0348508 A1 11/2019 Xu et al.
2020/0052125 A1 2/2020 Zhou et al.
2021/0028291 A1* 1/2021 Park .................... H01L 27/092

* cited by examiner

US 11,837,507 B2

GATE STRUCTURE AND METHOD OF FORMING SAME

PRIORITY CLAIM AND CROSS-REFERENCE

This application is a divisional of U.S. patent application Ser. No. 16/564,243, filed on Sep. 9, 2019, entitled "Gate Structure and Method of Forming Same," now U.S. Pat. No. 11,404,327, issued Aug. 2, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
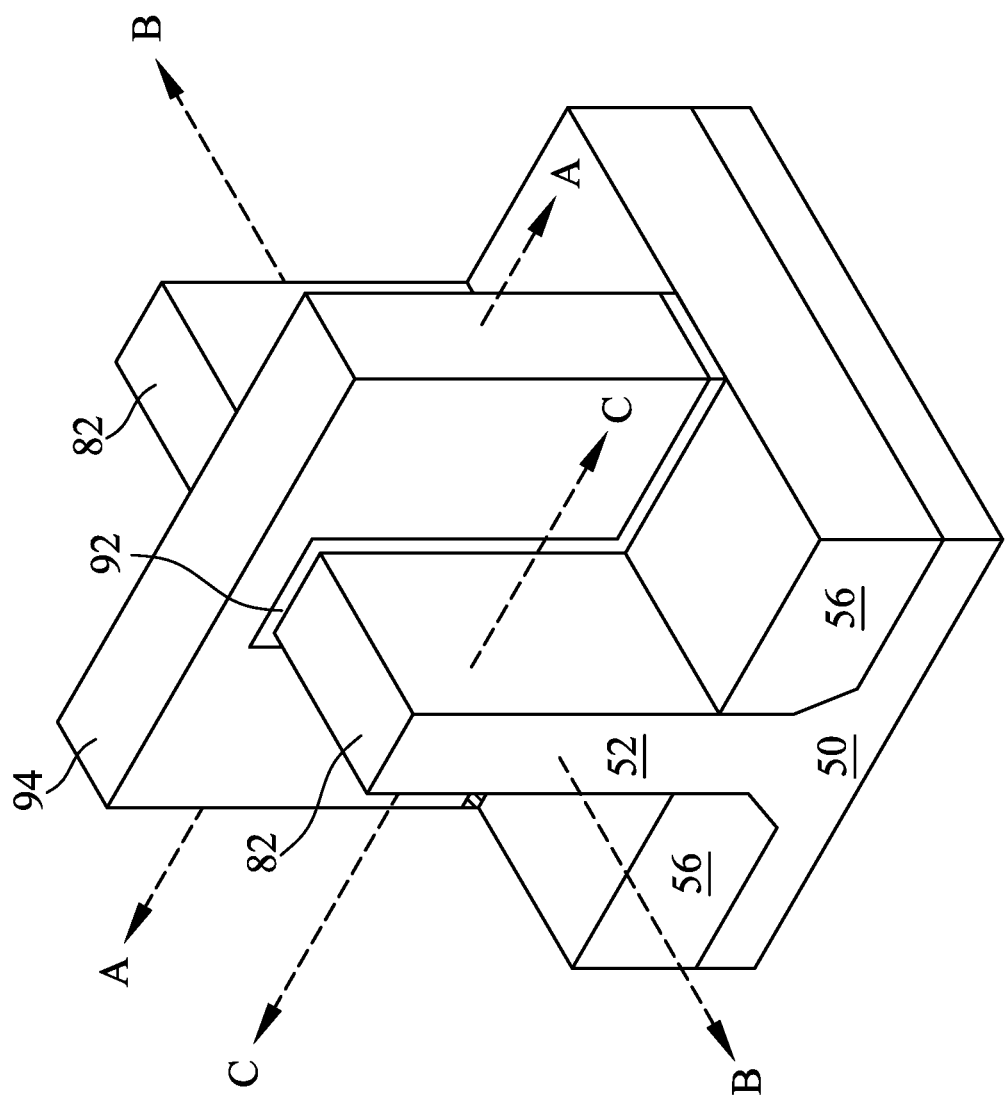
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a FinFET device formed using a gate-last process. Some embodiments contemplate aspects used in planar transistor devices, multiple-gate transistor devices, 2D transistor devices, gate-all-around transistor devices, nanowire transistor devices, or the like. Various embodiments discussed herein allow for avoiding gate structure damage, such as formation of seam void defects in a gate structure and oxidation of work function layers of the gate structure, during subsequent processes, such as a gate cut process. Accordingly, threshold voltage ($V_t$) shift and gate resistance ($R_G$) increase due to the oxidation of work function layers of the gate structure may be reduced or avoided. Furthermore, threshold voltage ($V_t$) roll-off may be reduced or avoided. Various embodiments discussed herein further allow for gate dielectric defect reduction and avoiding gate dielectric leakage and time-dependent gate dielectric breakdown (TDDB).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 15C, 15D, 16A, 16B, 16C, 16D, 17A, 17B, 17C, 17D, 18A, 18B, 19A, and 19B are top and cross-sectional views of intermediate stages in the manufacturing of a FinFET device in accordance with some embodiments. FIGS. 2 through 7 illustrate cross-sectional views along the reference cross-section A-A illustrated in FIG. 1, except for multiple fins/FinFETs. FIGS. 8A-14A, 18A, and 19A are illustrated along the reference cross-section A-A illustrated in FIG. 1 and FIGS. 8B-14B, 18B, and 19B are illustrated along the reference cross-section B-B illustrated in FIG. 1, except for multiple fins/FinFETs. FIGS. 10C and 10D are illustrated along the reference cross-section C-C illustrated in FIG. 1, except for multiple fins/FinFETs. FIGS. 15D-17D illustrate top views. FIGS. 15A-17A are illustrated along the cross-section A-A illustrated in FIGS. 15D-17D, respectively. FIGS. 15B-17B are illustrated along the cross-section B-B illustrated in FIGS. 15D-17D, respectively. FIGS. 15C-17C are illustrated along the cross-section C-C illustrated in FIGS. 15D-17D, respectively.

Figure 2:
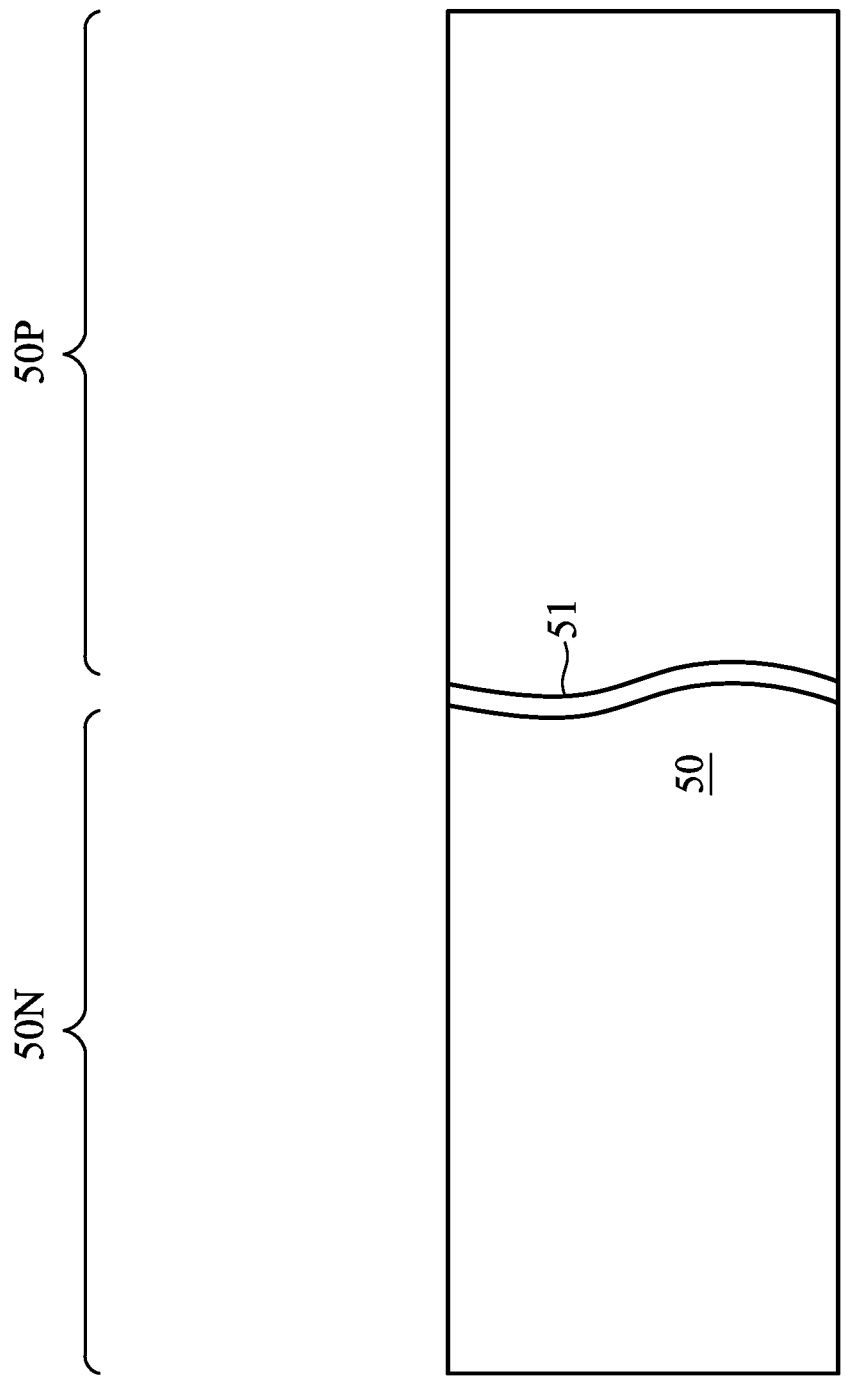
FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 15C, 15D, 16A, 16B, 16C, 16D, 17A, 17B, 17C, 17D, 18A, 18B, 19A, and 19B are top and cross-sectional views of intermediate stages in the manufacturing of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
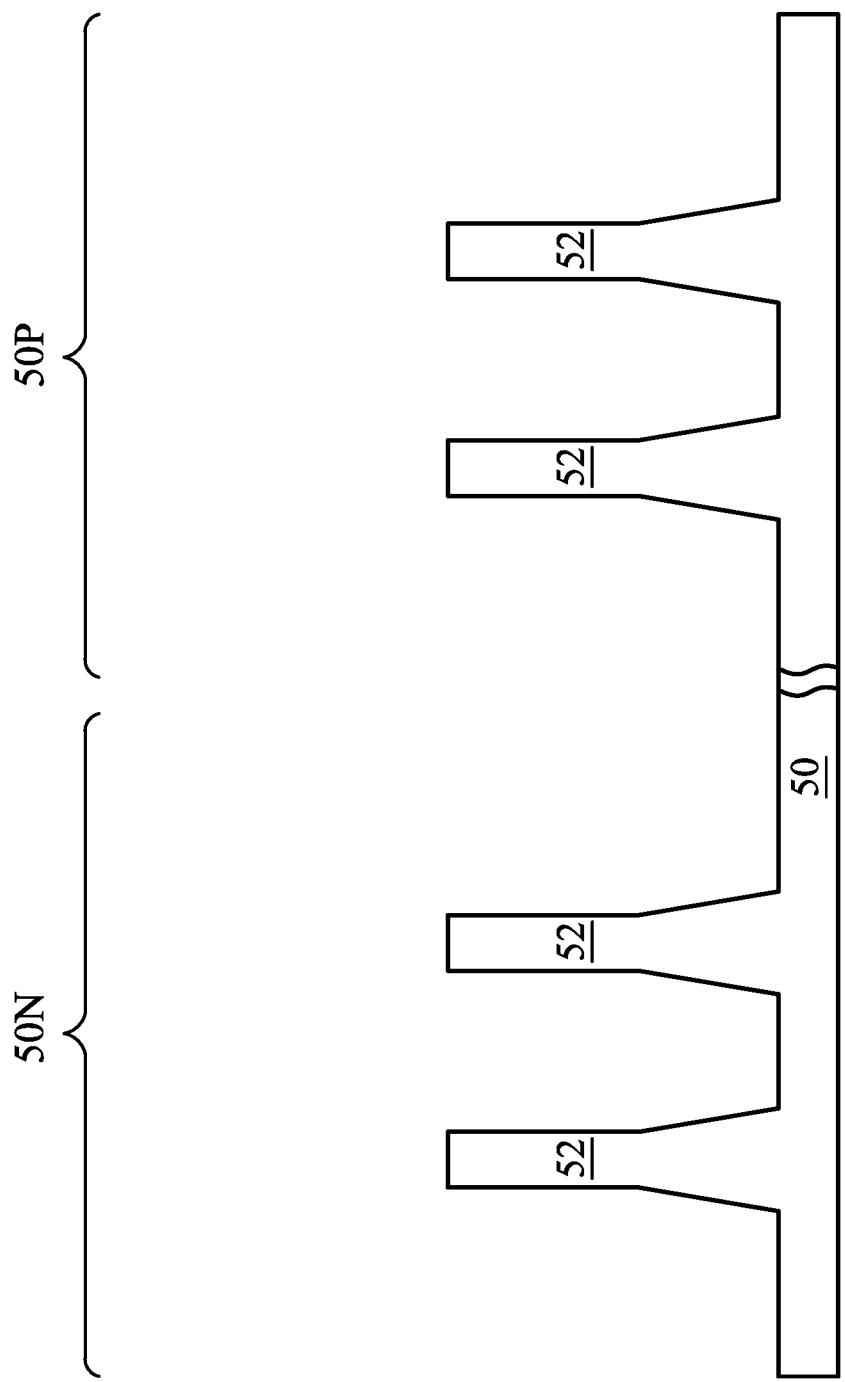

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch process may be anisotropic.

The fins may be formed by any suitable method. For example, the fins may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins.

Figure 4:
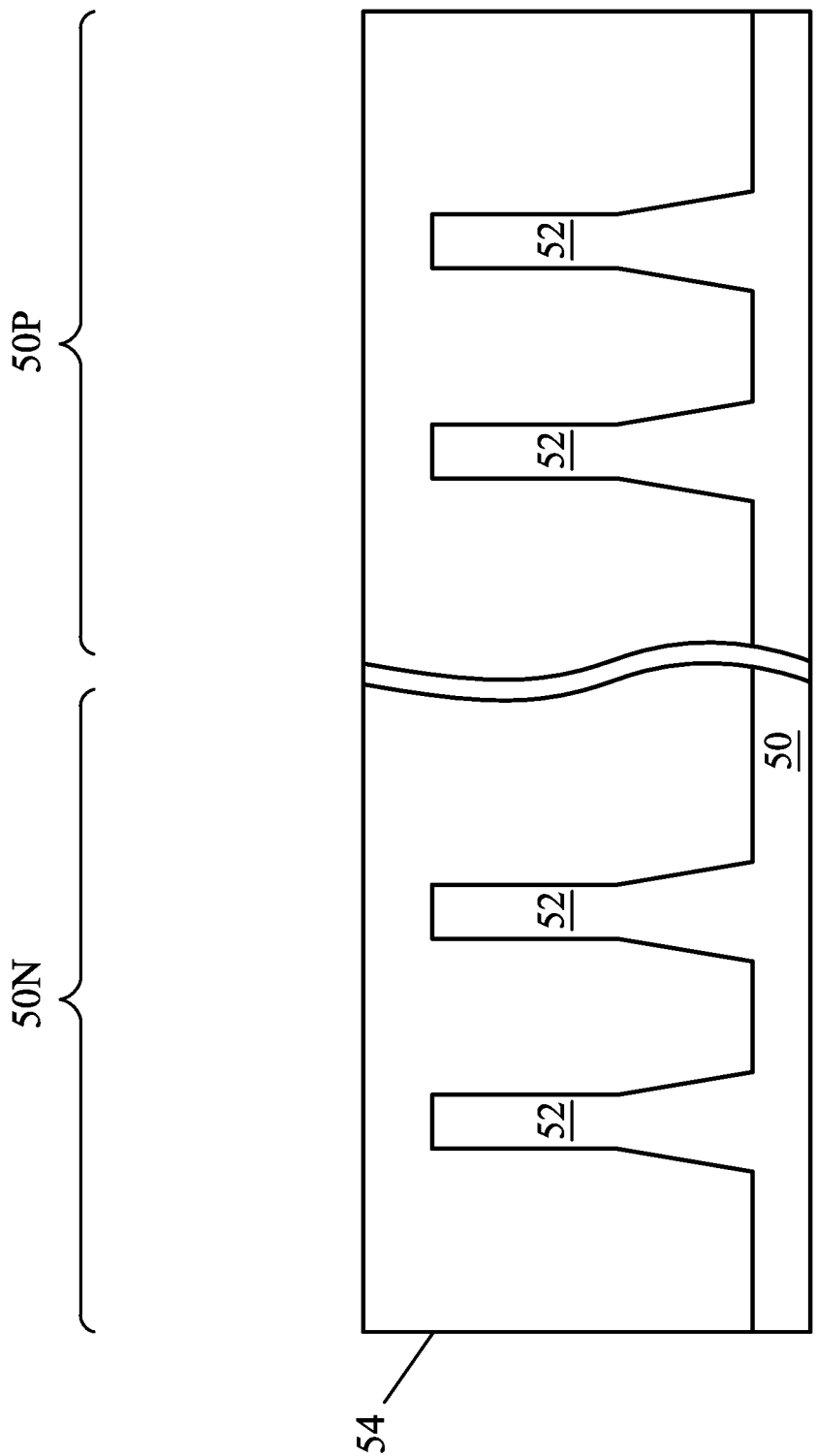

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along a surface of the substrate 50 and the fins 52. Thereafter, a fill material, such as those discussed above may be formed over the liner.

Figure 5:
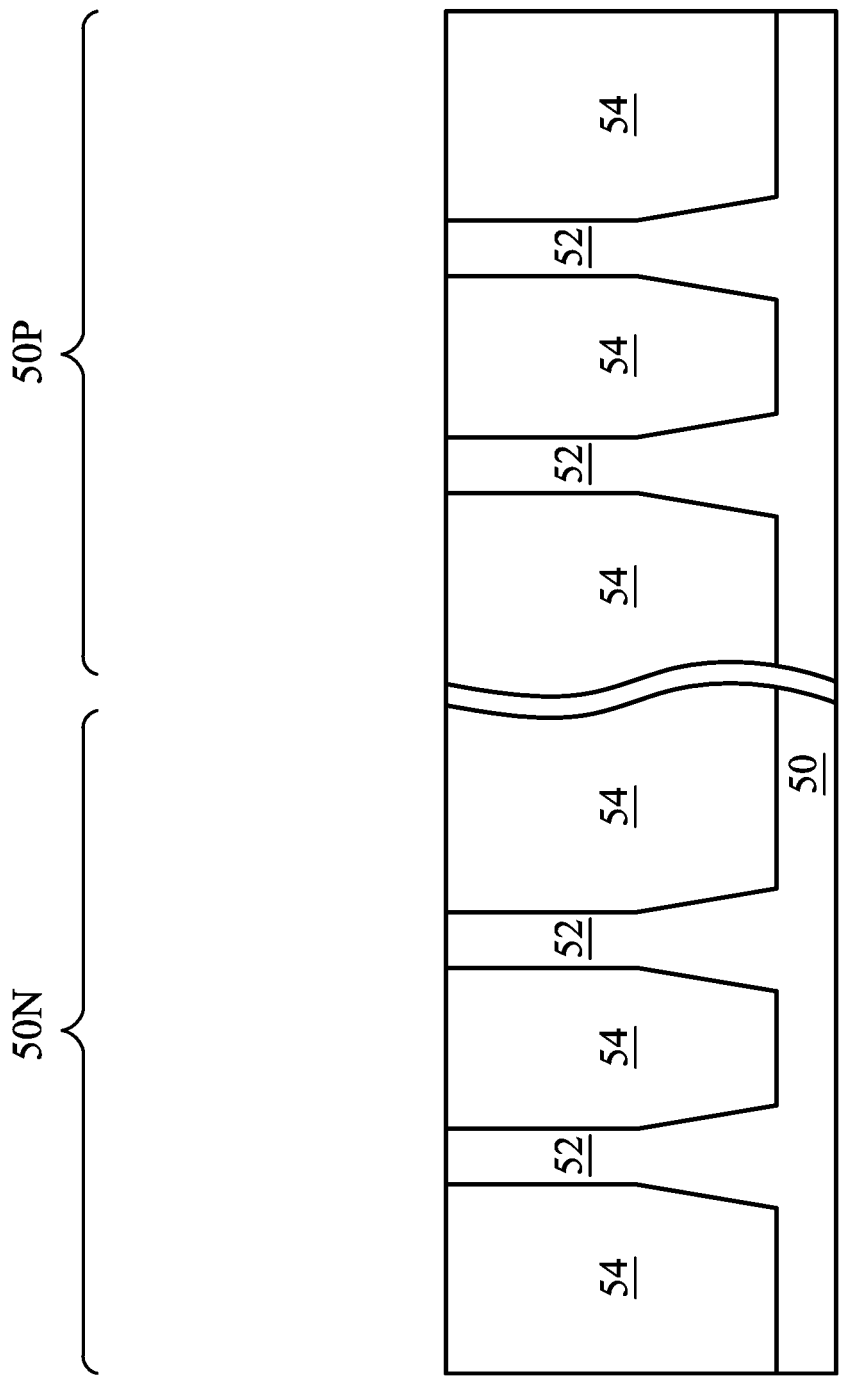

In FIG. 5, a removal process is applied to the insulation material 54 to remove excess portions of the insulation material 54 over the fins 52. In some embodiments, a planarization process, such as a chemical mechanical polish (CMP) process, an etch back process, combinations thereof, or the like, may be utilized. The planarization process exposes the fins 52 such that top surfaces of the fins 52 and the insulation material 54 are level after the planarization process is completed.

Figure 6:
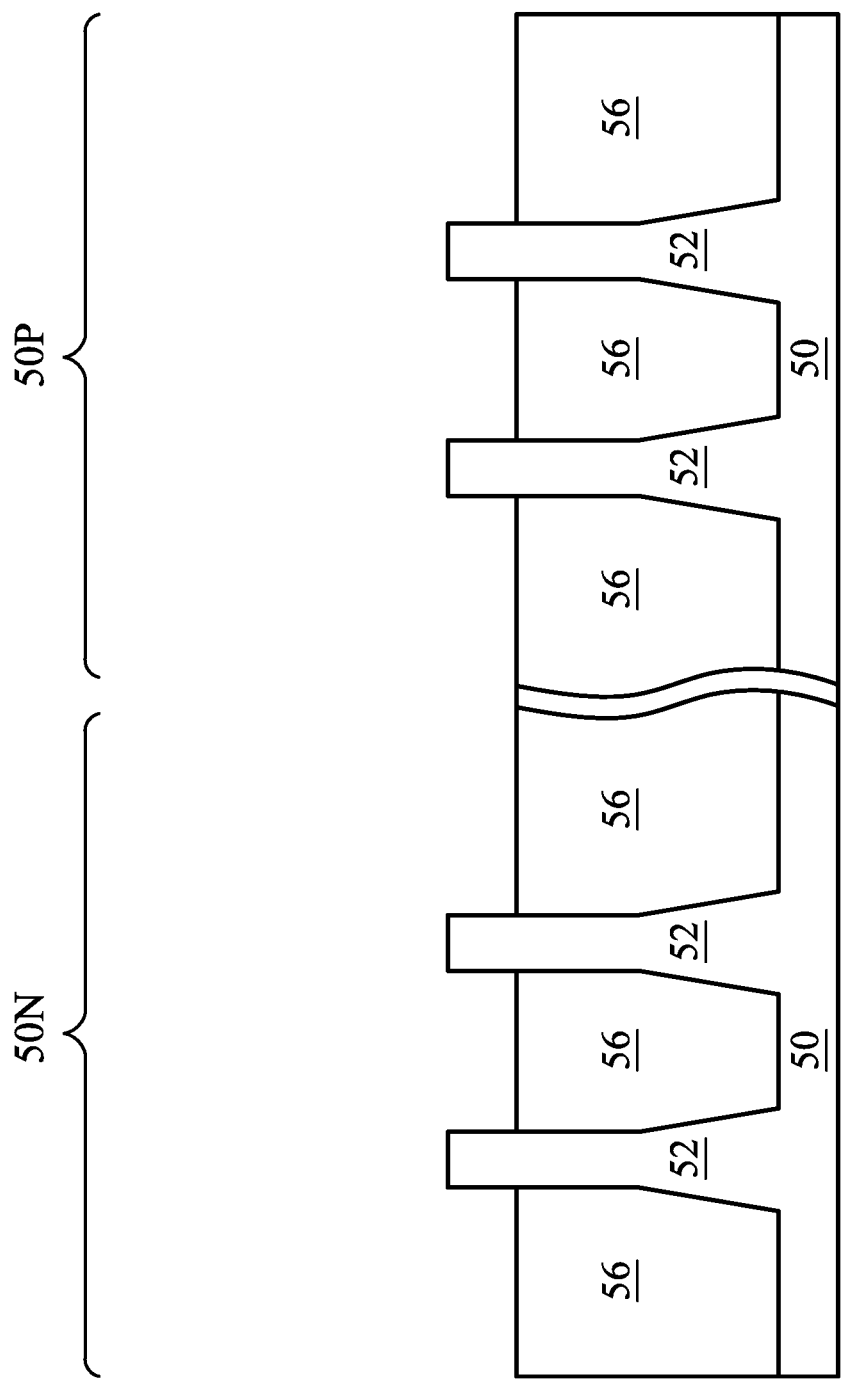

In FIG. 6, the insulation material 54 (see FIG. 5) is recessed to form Shallow Trench Isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50. The photoresist can be formed by using a spin-on technique and can be patterned using acceptable photolithography techniques. Once the photoresist is patterned, an n-type impurity implantation is performed in the region 50P, and the photoresist may act as a mask to substantially prevent n-type impurities from being implanted into the region 50N. The n-type impurities may be phosphorus, arsenic, antimony, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the n-type impurities may be implanted at an implantation energy of about 1 keV to about 10 keV. After the implantation, the photoresist is removed, such as by an acceptable ashing process followed by a wet clean process.

Following the implantation of the region 50P, a photoresist is formed over the fins 52 and the STI regions 56 in the region 50P. The photoresist is patterned to expose the region 50N of the substrate 50. The photoresist can be formed by using a spin-on technique and can be patterned using acceptable photolithography techniques. Once the photoresist is patterned, a p-type impurity implantation may be performed in the region 50N, and the photoresist may act as a mask to substantially prevent p-type impurities from being implanted into the region 50P. The p-type impurities may be boron, $BF_2$, indium, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the p-type impurities may be implanted at an implantation energy of about 1 keV to about 10 keV. After the implantation, the photoresist may be removed, such as by an acceptable ashing process followed by a wet clean process.

After performing the implantations of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
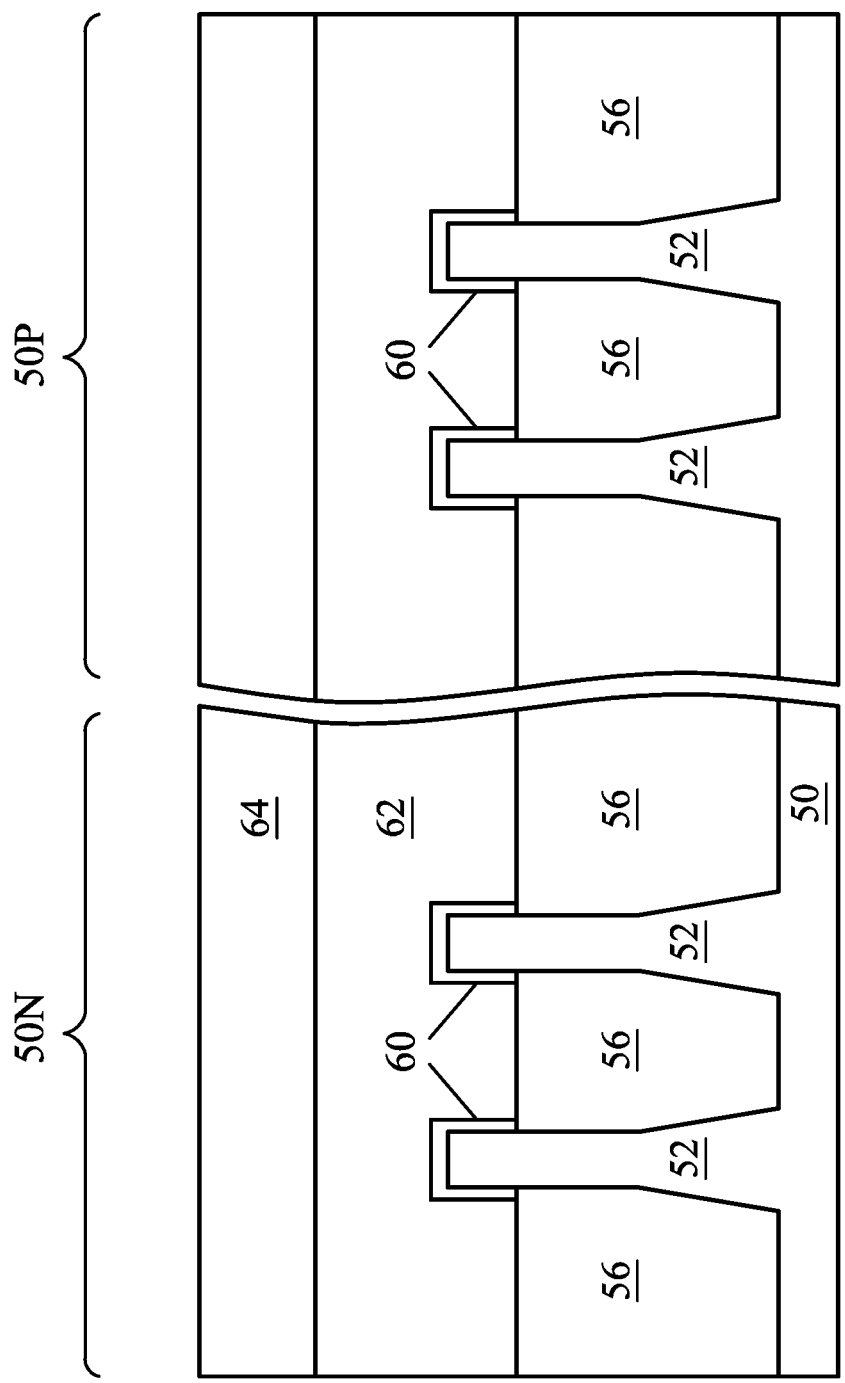

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, SiN, SiON, a combination thereof, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A, 8B, 9A, 9B, 10A, 10B, 10C, 10D, 11A, 11B, 12A, 12B, 13A, 13B, 14A, 14B, 15A, 15B, 15C, 15D, 16A, 16B, 16C, 16D, 17A, 17B, 17C, 17D, 18A, 18B, 19A, and 19B illustrate various additional steps in the manufacturing of a FinFET device. FIGS. 8A, 8B, 9A, 9B, 10A, 10B, 10C, 10D, 11A, 11B, 12A, 12B, 13A, 13B, 14A, 14B, 15A, 15B, 15C, 15D, 16A, 16B, 16C, 16D, 17A, 17B, 17C, 17D, 18A, 18B, 19A, and 19B illustrate features in either of the region 50N and the region 50P. For example, the structures illustrated in FIGS. 8A, 8B, 9A, 9B, 10A, 10B, 10C, 10D, 11A, 11B, 12A, 12B, 13A, 13B, 14A, 14B, 15A, 15B, 15C, 15D, 16A, 16B, 16C, 16D, 17A, 17B, 17C, 17D, 18A, 18B, 19A, and 19B may be applicable to both the region 50N and the region 50P. Differences (if any) in the structures of the region 50N and the region 50P are described in the text accompanying each figure.

Figure 8B:
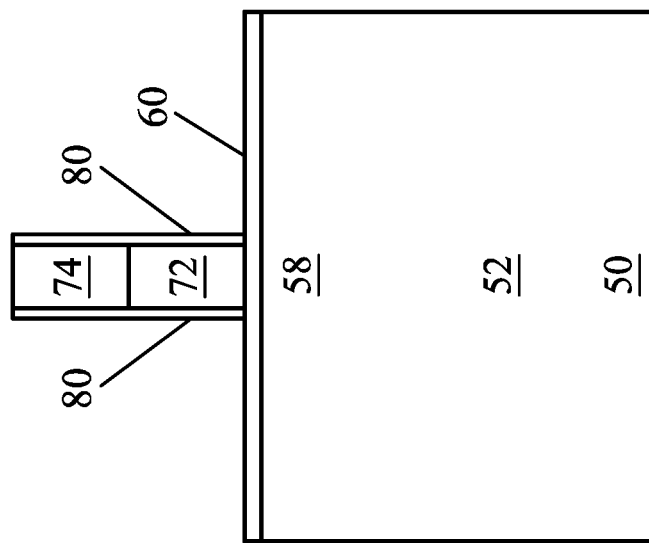
Figure 8A:
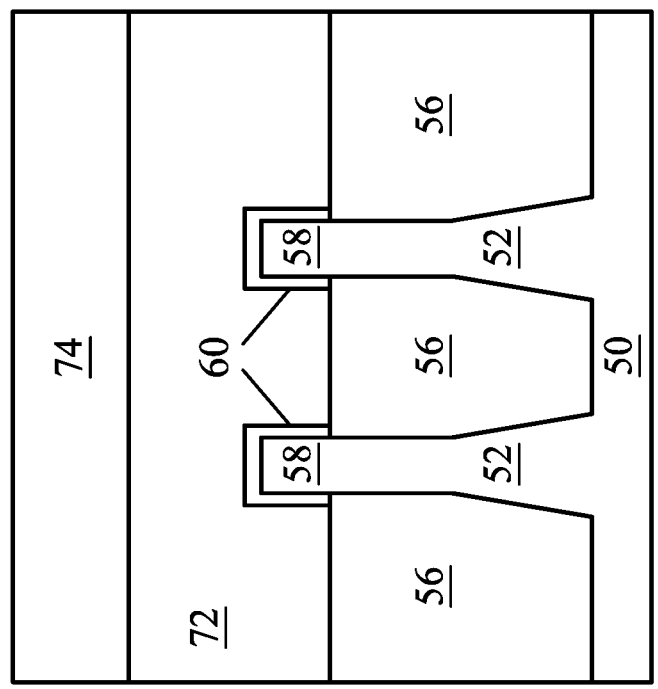

In FIGS. 8A and 8B, the mask layer 64 (see FIG. 7) may be patterned using acceptable photolithography and etching techniques to form masks 74. The pattern of the masks 74 then may be transferred to the dummy gate layer 62 to form dummy gates 72. In some embodiments (not illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52. As described below in greater detail, the dummy gates 72 are sacrificial gates and are subsequently replaced by replacement gates. Accordingly, dummy gates 72 may also be referred to as sacrificial gates. In other embodiments, some of the dummy gates 72 are not replaced and remain in the final structure of the resulting FinFET device.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Figure 9B:
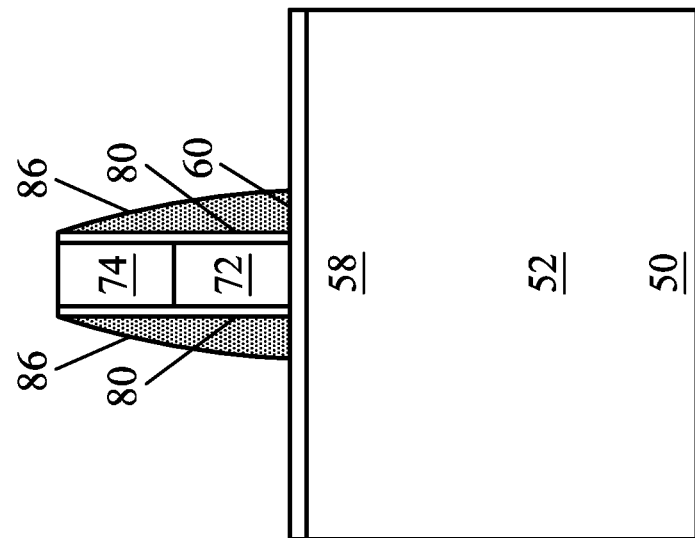
Figure 9A:
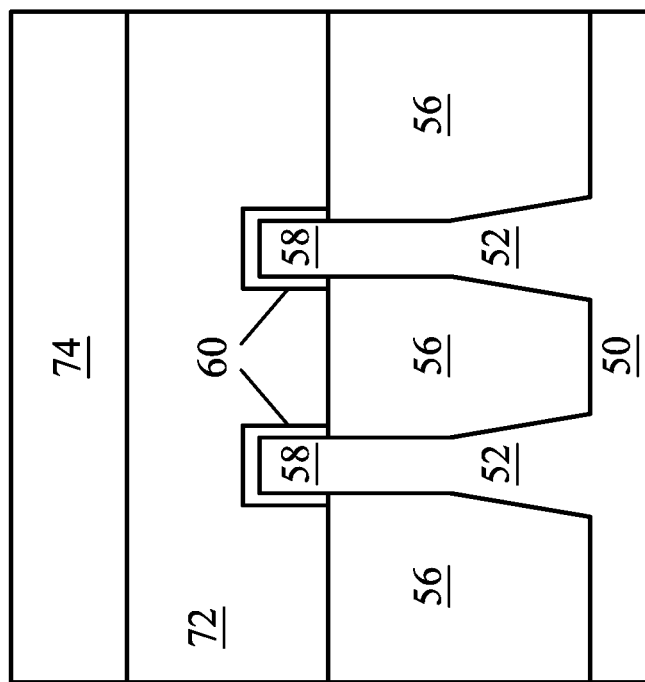

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

Figure 10B:
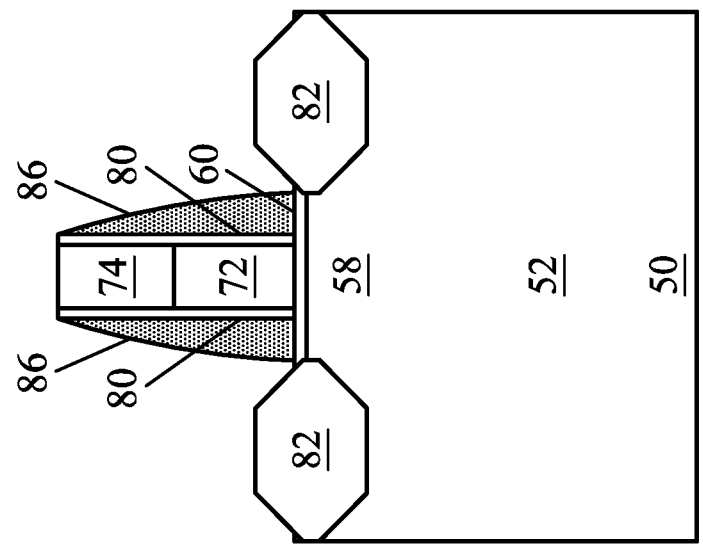
Figure 10A:
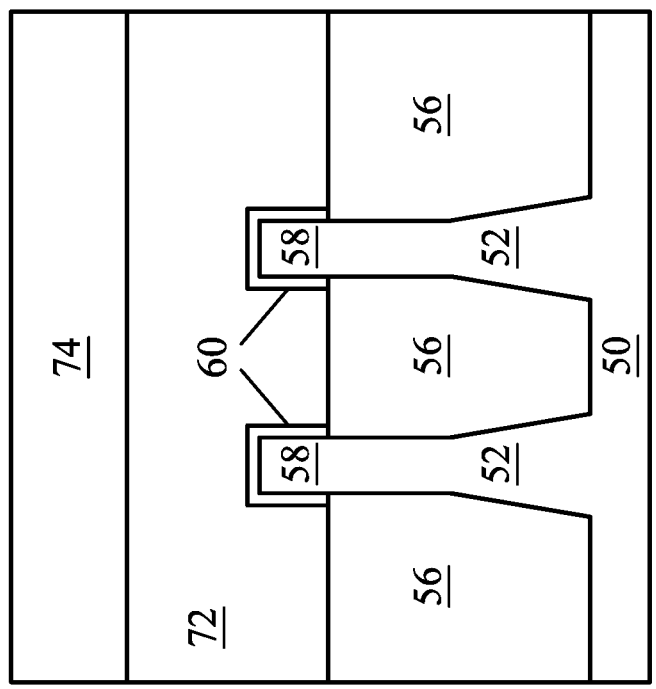
Figure 10C:
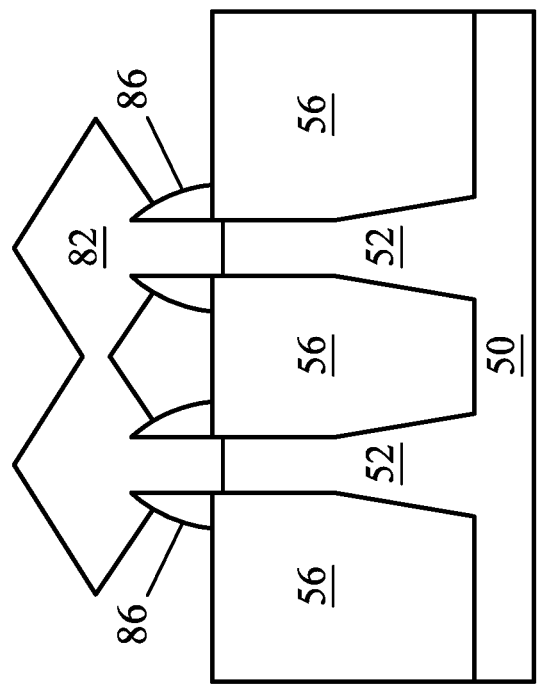
Figure 10D:
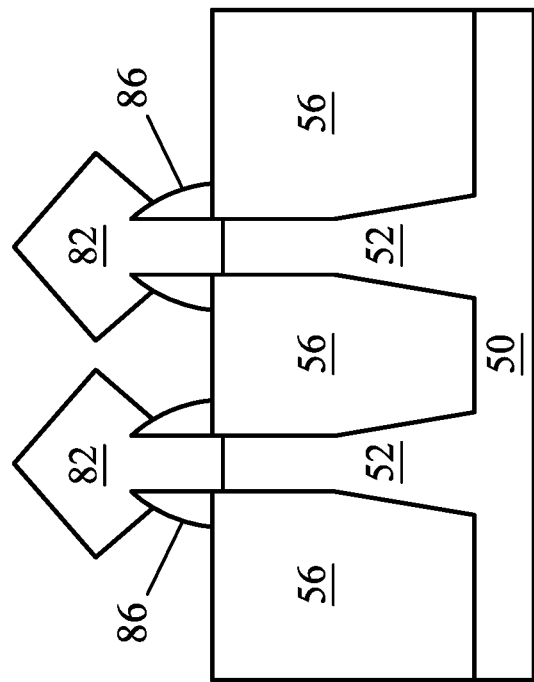

In FIGS. 10A and 10B, epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFET device.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 10C. In other embodiments, adjacent epitaxial source/drain regions 82 remain separated after the epitaxy process is completed as illustrated by FIG. 10D.

Figure 11B:
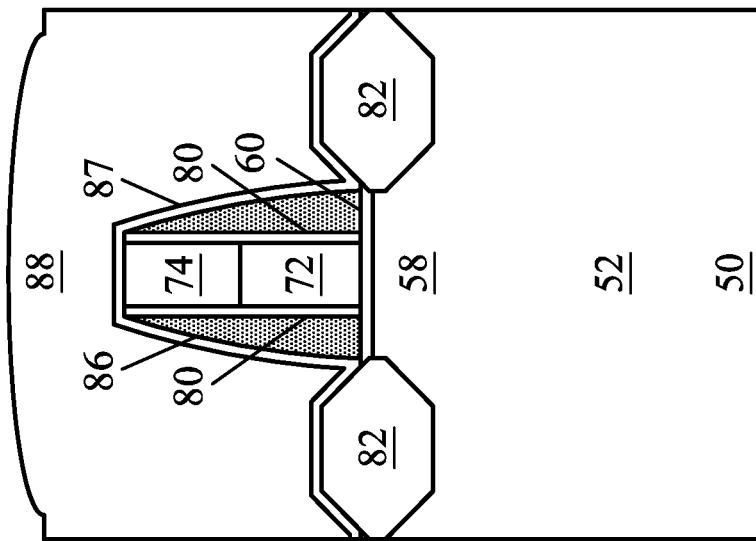
Figure 11A:
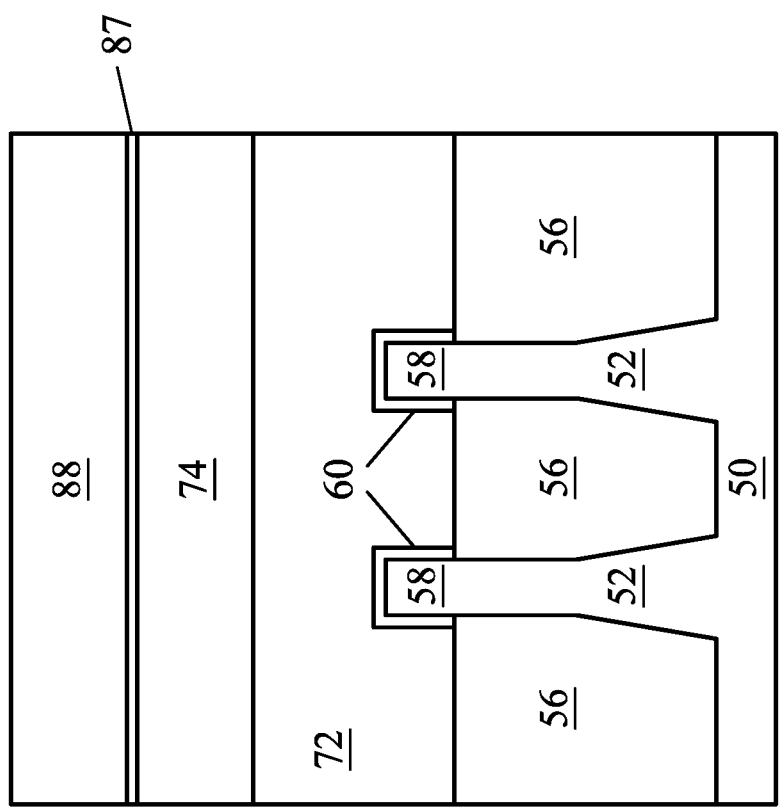

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, a combination thereof, or the like, having a different etch rate than the material of the overlying first ILD 88.

Figure 12B:
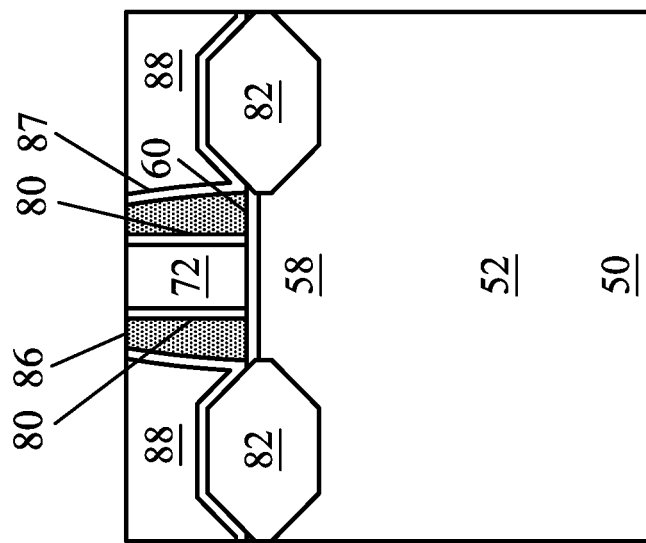
Figure 12A:
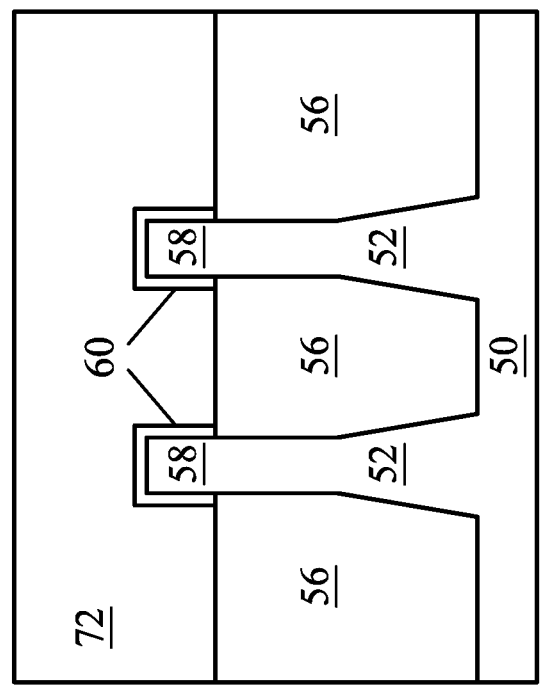

In FIGS. 12A and 12B, a planarization process, such as a CMP process, may be performed to level the top surface of the first ILD 88 with the top surfaces of the dummy gates 72 or the masks 74 (see FIGS. 11A and 11B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level with each other. Accordingly, the top surfaces of the dummy gates 72 are exposed through the first ILD 88. In some embodiments, the masks 74 may remain, in which case the planarization process levels the top surface of the first ILD 88 with the top surfaces of the masks 74 (see FIGS. 11A and 11B).

Figure 13B:
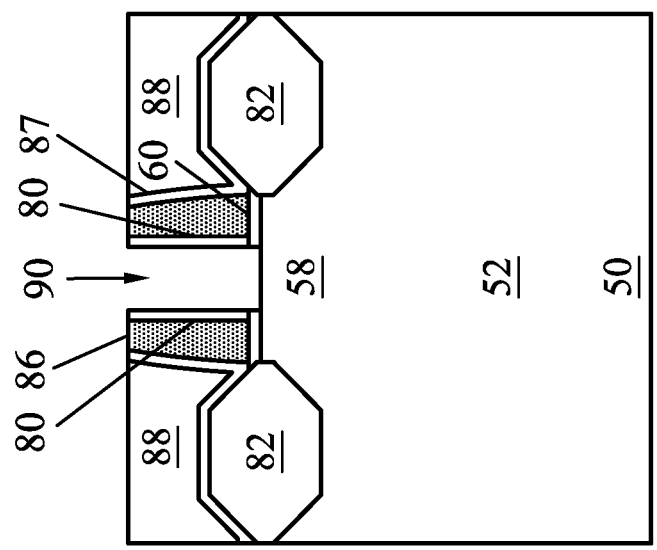
Figure 13A:
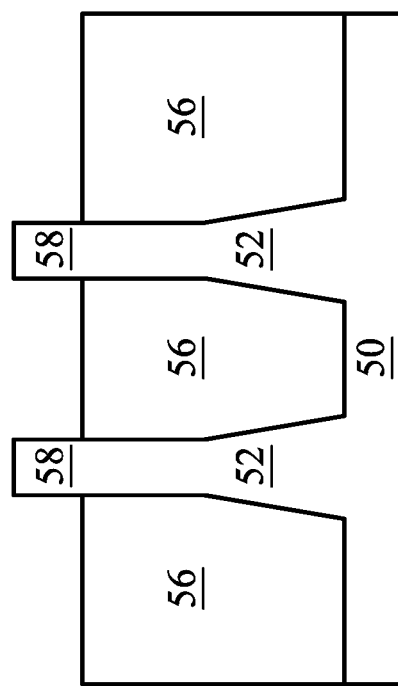

In FIGS. 13A and 13B, the dummy gates 72, and the masks 74, if present, are removed in an etching step(s), so that openings 90 are formed. Portions of the dummy dielectric layer 60 in the openings 90 may also be removed. In some embodiments, only the dummy gates 72 are removed and the dummy dielectric layer 60 remains and is exposed by the openings 90. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
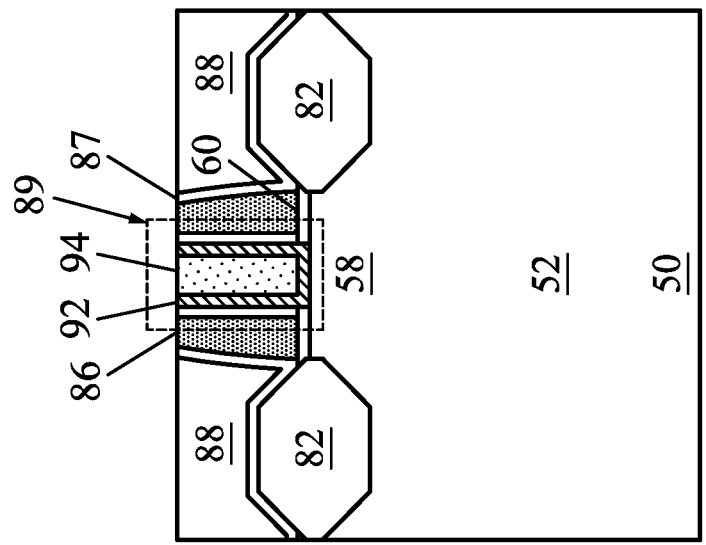
Figure 14A:
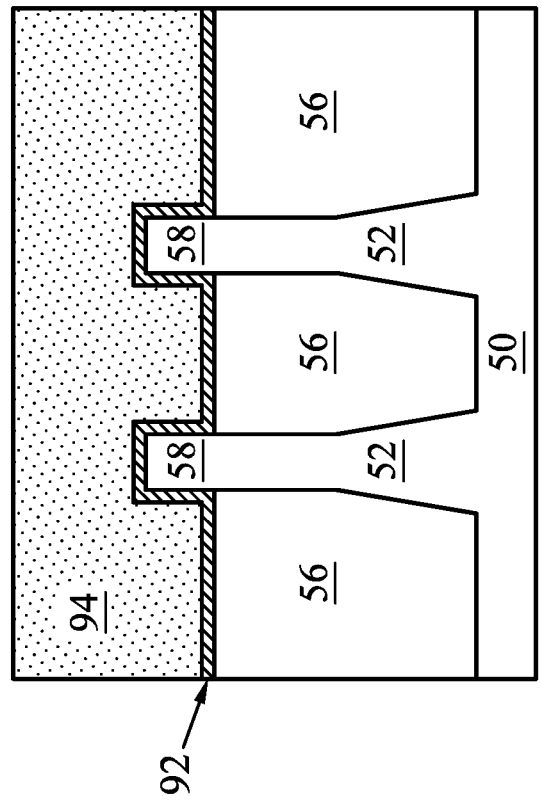
Figure 15A:
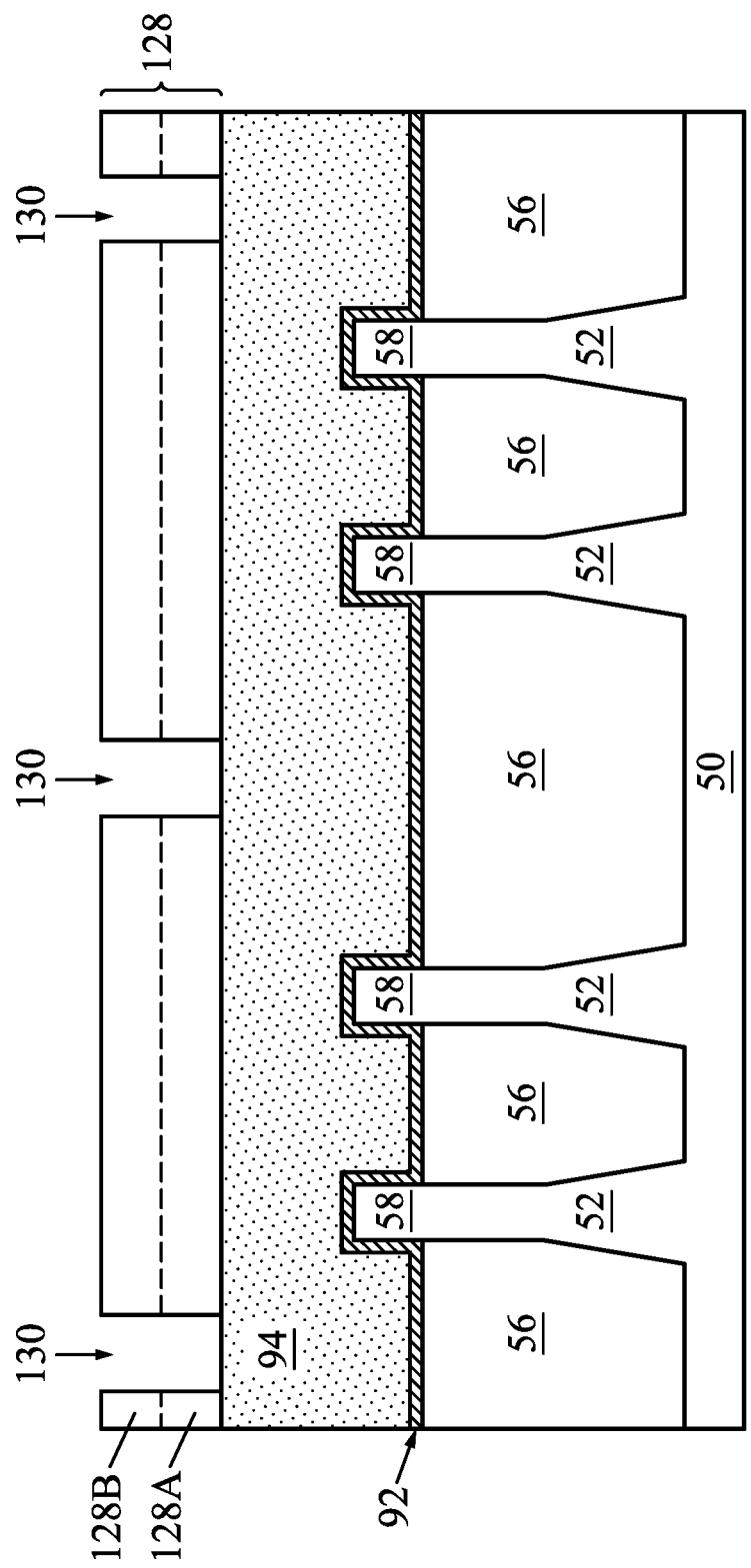
Figure 15B:
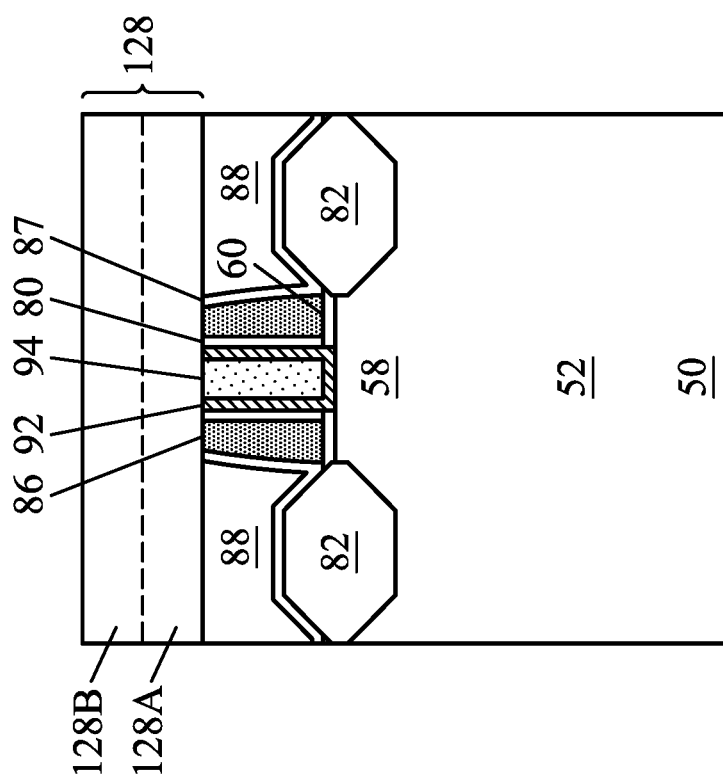
Figure 15C:
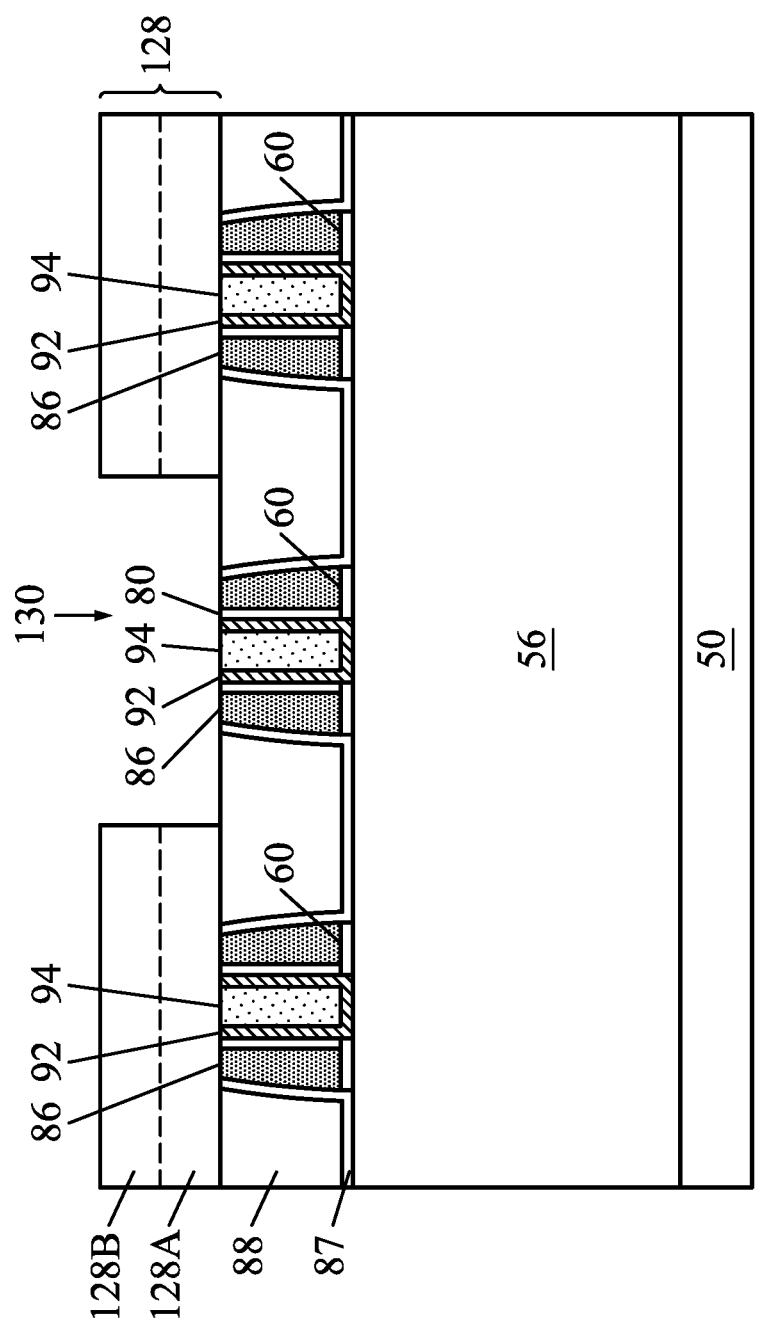
Figure 15D:
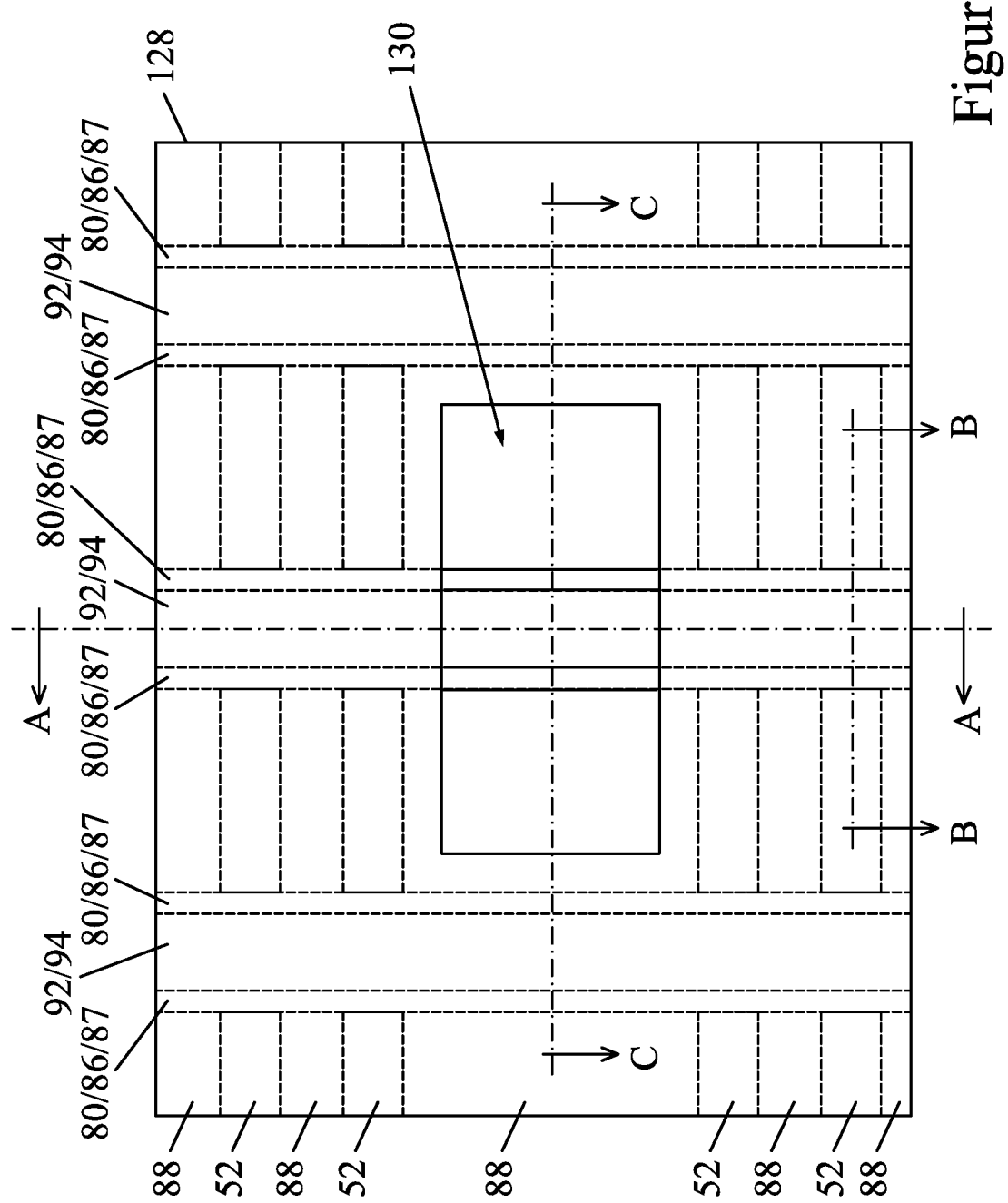
Figure 16A:
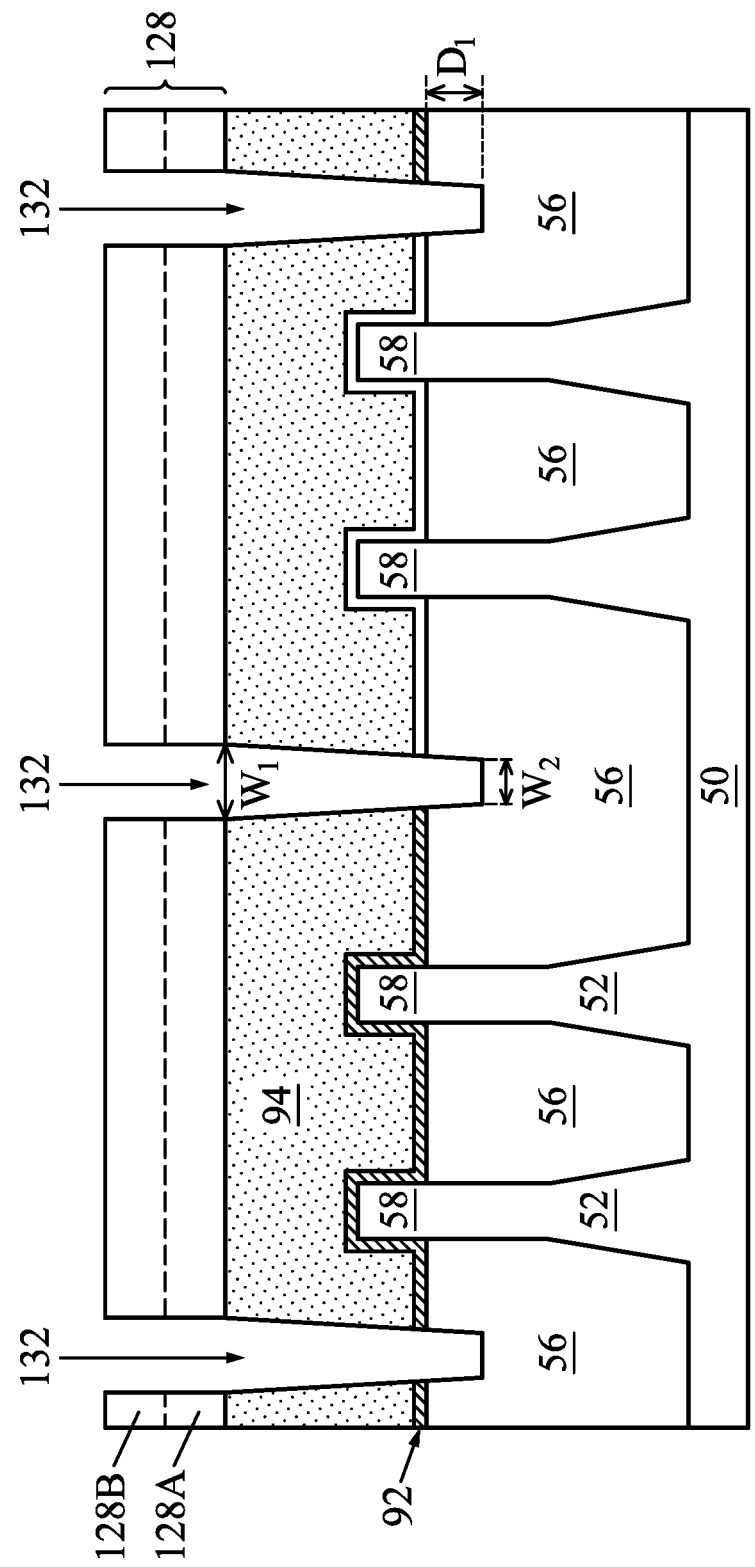
Figure 16B:
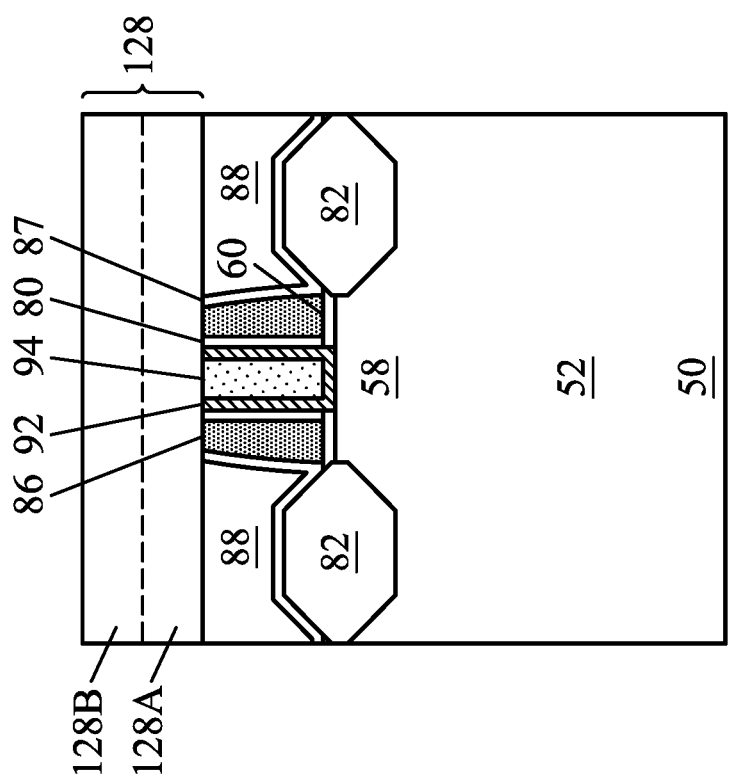
Figure 16C:
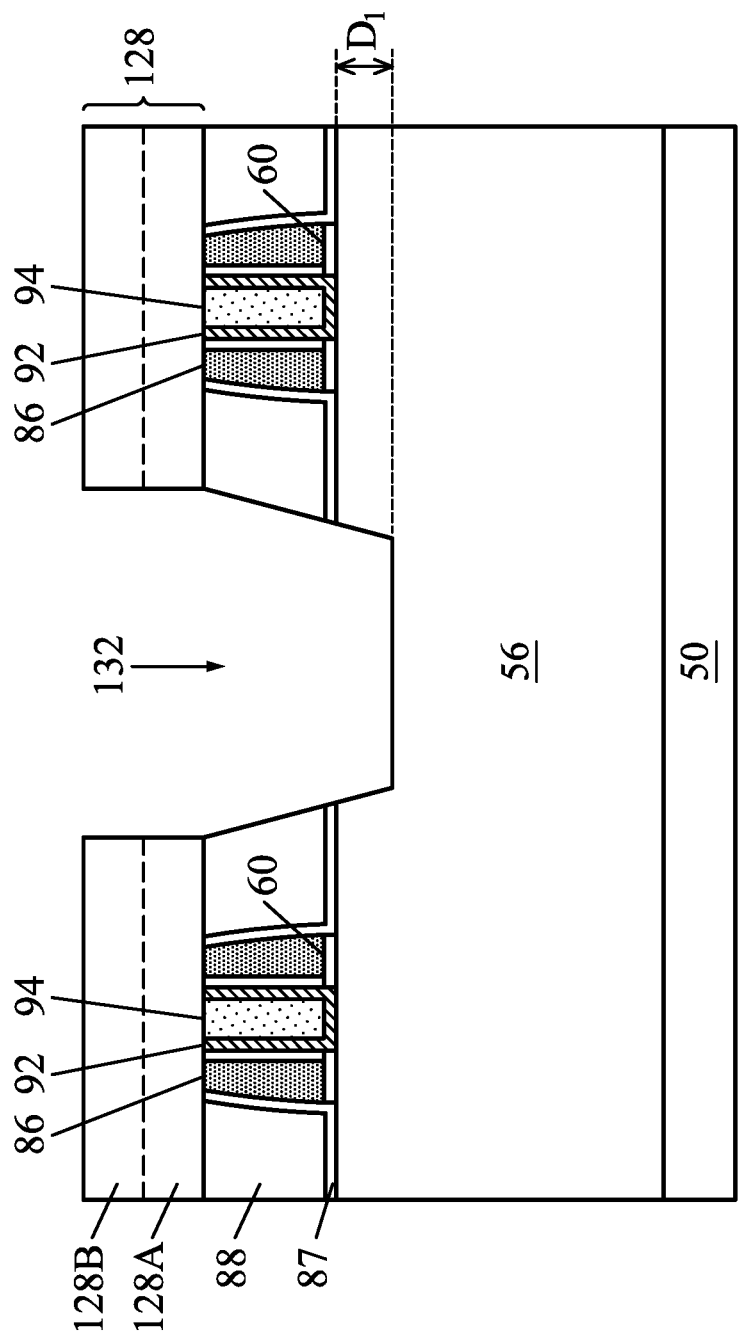
Figure 16D:
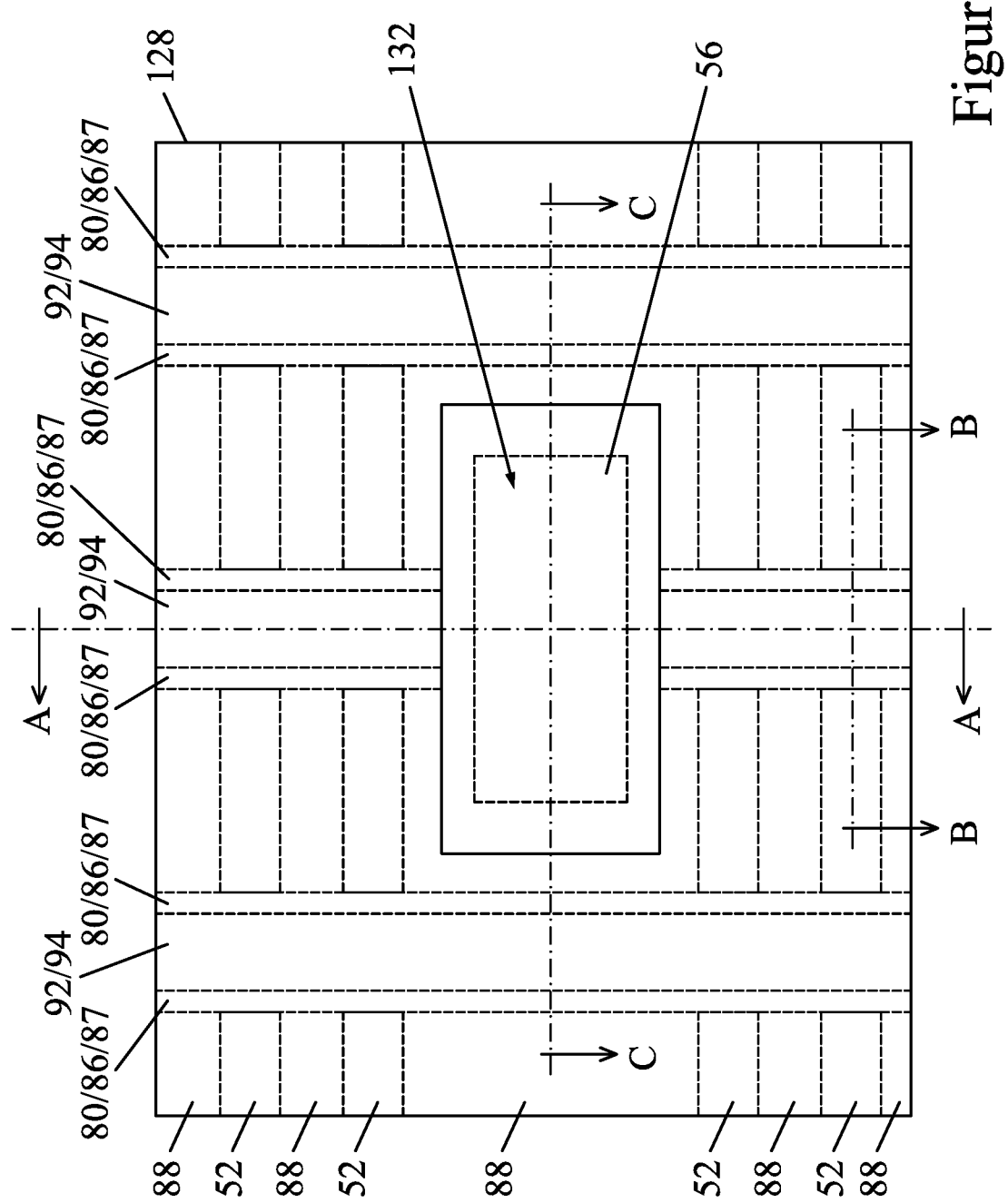
Figure 17A:
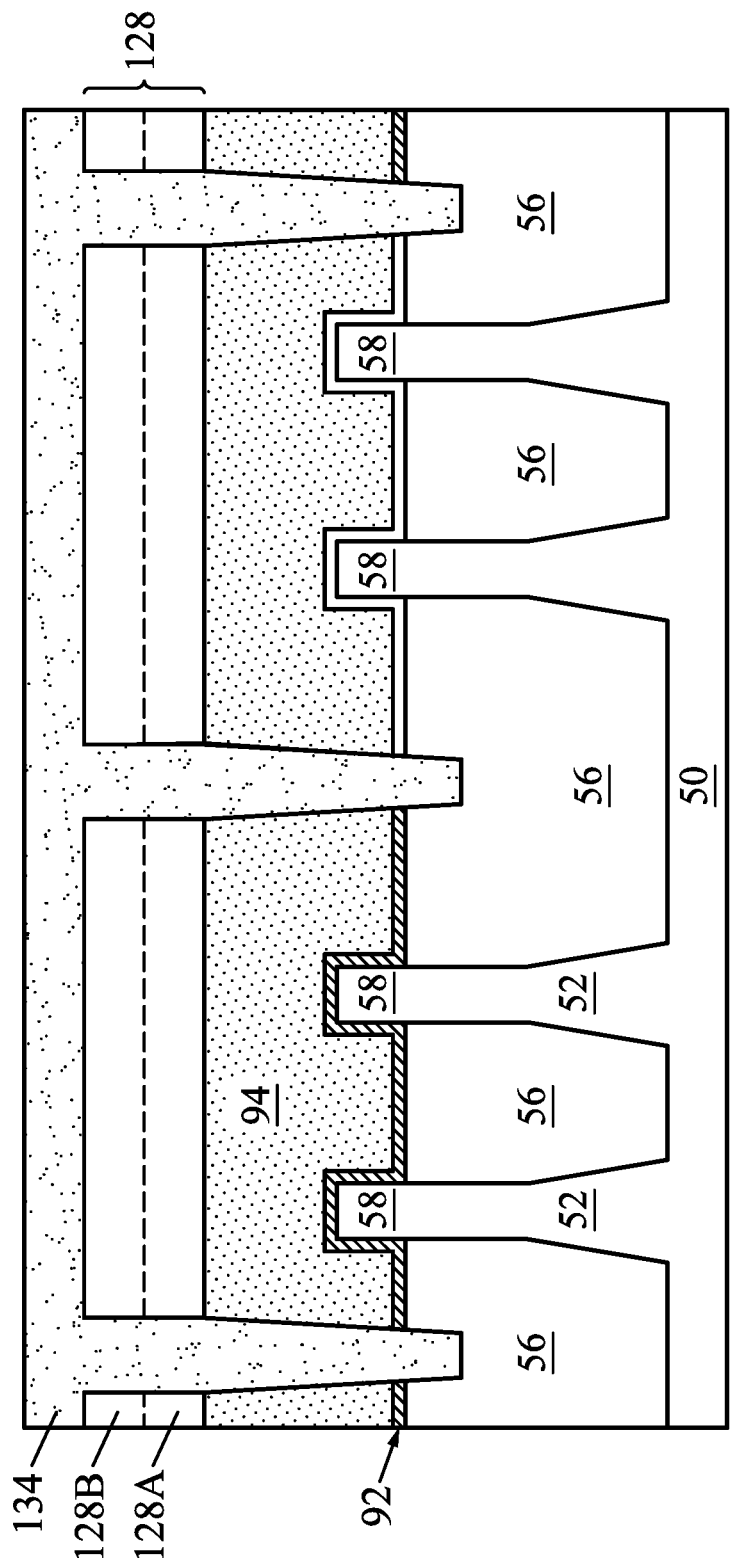
Figure 17B:
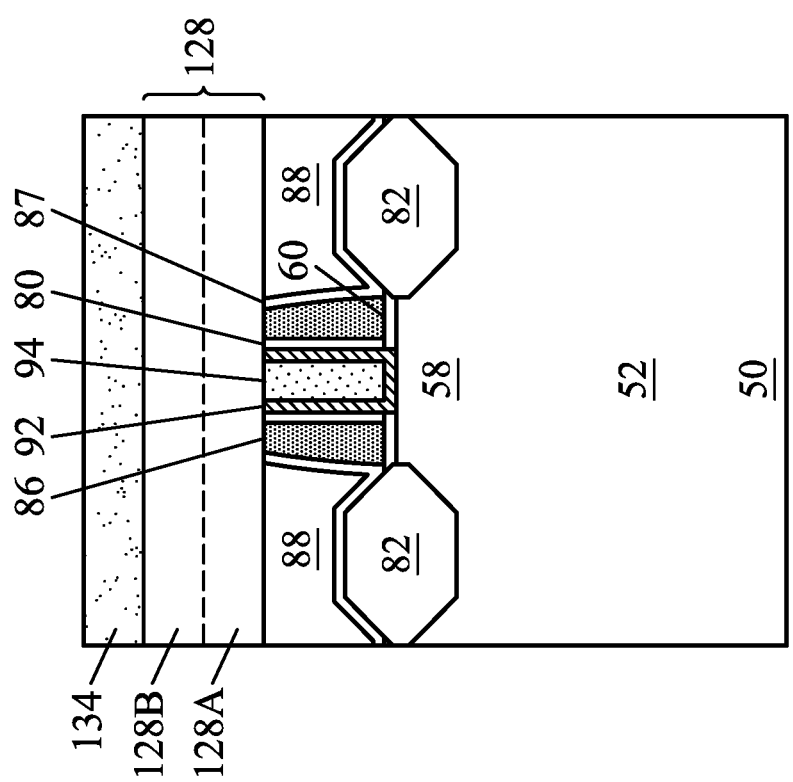
Figure 17C:
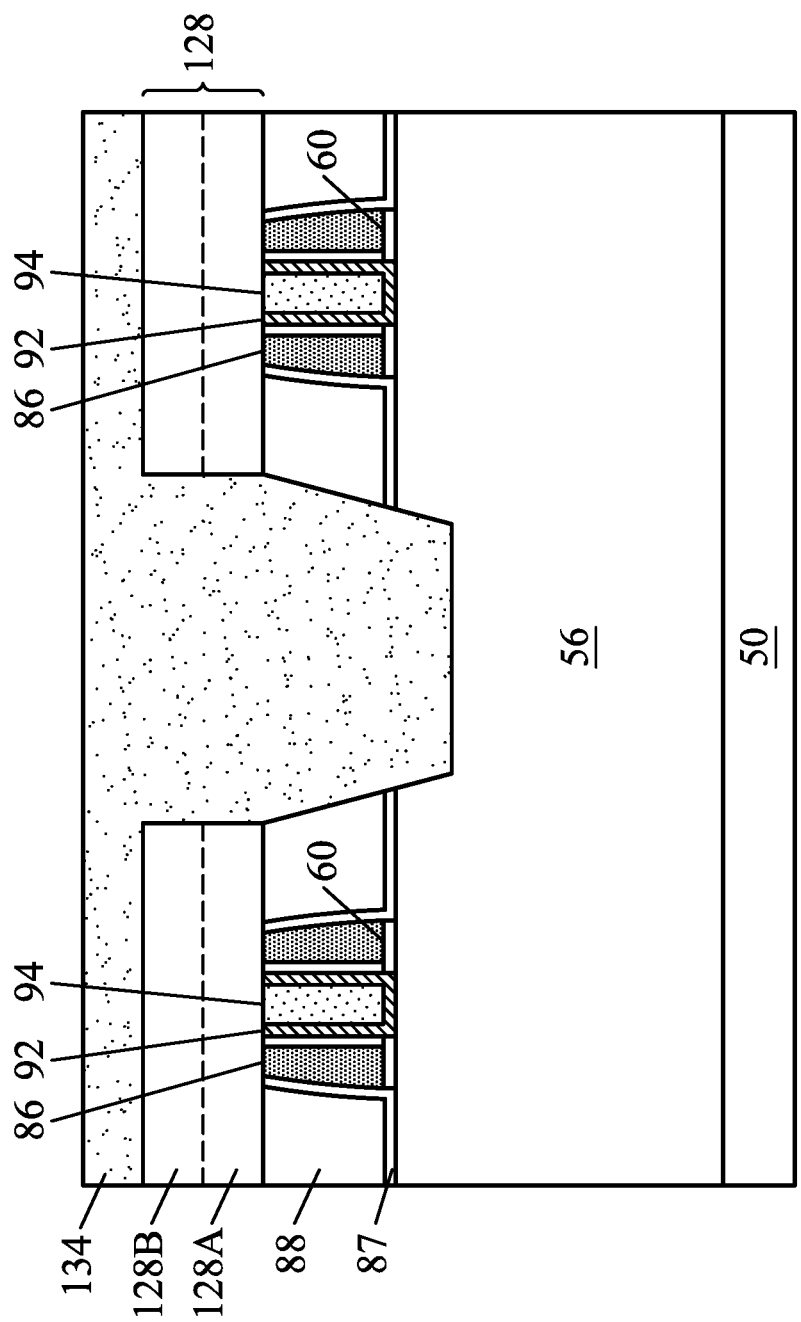
Figure 17D:
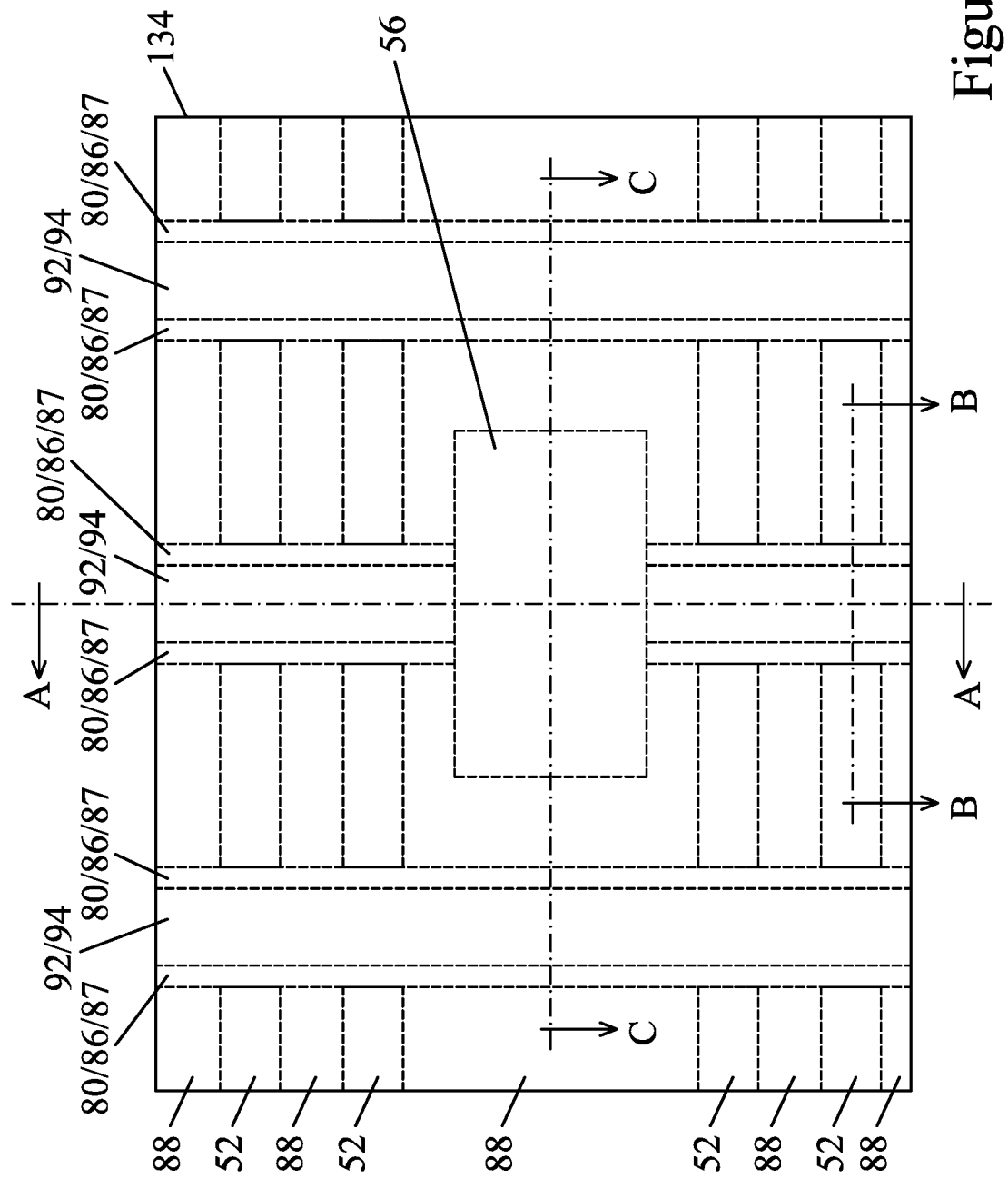

In FIGS. 14A and 14B, gate dielectric layers 92 and gate electrodes 94 are formed for replacement gates. The gate electrodes 94 and the gate dielectric layers 92 may be collectively referred to as a "gate stack." The gate stacks may extend along sidewalls and top surfaces of the channel regions 58 of the fins 52. In some embodiments, the gate stacks may be formed using a method described below with reference to FIGS. 20P, 20N, 21P, 21N, 22P, 22N, 23P, 23N, 24P, 24N, 25P, 25N, 26P, 26N, 27P, and 27N, and the detailed description of the method is provided at that time. In other embodiments, the gate stacks may be formed using a method described below with reference to FIGS. 28P, 28N, 29P, 29N, 30P, 30N, 31P, 31N, 32P, 32N, 33P, 33N, 34P, 34N, 35P, and 35N, and the detailed description of the method is provided at that time. In yet other embodiments, the gate stacks may be formed using a method described below with reference to FIGS. 36P, 36N, 37P, 37N, 38P, 38N, 39P, 39N, 40P, 40N, 41P, and 41N, and the detailed description of the method is provided at that time.

FIGS. 15A, 15B, 15C, 15D, 16A, 16B, 16C, 16D, 17A, 17B, 17C, and 17D, illustrate a gate cut process in accordance with some embodiments. FIGS. 15D-17D illustrate top views. FIGS. 15A-17A are illustrated along the cross-section A-A illustrated in FIGS. 15D-17D, respectively. FIGS. 15B-17B are illustrated along the cross-section B-B illustrated in FIGS. 15D-17D, respectively. FIGS. 15C-17C are illustrated along the cross-section C-C illustrated in FIGS. 15D-17D, respectively. In FIGS. 15A, 15B, 15C and 15D, a hard mask 128 is formed over the gate stack 92/94. In some embodiments, the hard mask 128 may comprise one or more layers of a dielectric material, such as silicon oxide, titanium nitride, silicon nitride, silicon oxynitride, a combination thereof, or the like, and may formed using CVD, ALD, a combination thereof, or the like. In an embodiment, the hard mask 128 includes a first mask layer 128A comprising titanium nitride and a second mask layer 128B comprising silicon nitride, with the second mask layer 128B being formed over the first mask layer 128A. The hard mask 128 is patterned to form openings 130 through the hard mask 128. In some embodiments, the hard mask 128 may be patterned using suitable photolithography and etching processes. The etching processes may be wet or dry etching processes. The etching processes may be anisotropic etching processes. In some embodiments, the openings 130 may have shapes of elongated trenches, such that a lengthwise direction of each of the trenches is substantially parallel to a lengthwise direction of the fins 52 and is substantially perpendicular to a lengthwise direction of the gate stacks 92/94.

In FIGS. 16A, 16B, 16C and 16D, the hard mask 128 is used to pattern the gate stack 92/94. In some embodiments, the gate stack 92/94 is patterned by one or more suitable etching processes using the hard mask 128 as an etch mask. The etching processes may include wet etching processes, dry etching processes, combinations thereof, or the like. The etching processes may be anisotropic etching processes. In some embodiments, the etching processes include only dry etching processes. In other embodiments, the etching processes include a combination of both dry etching and wet etching processes. In some embodiments when the etching processes include only dry etching processes, the etching processes are followed by wet cleaning process to clean off residues of the etching processes. In some embodiments, the dry etching processes may be performed using a mixture of etchants comprising $Cl_2$, $SiCl_4$, $CH_4$, $O_2$, $CF_4$, $BCl_3$, Ar, a combination thereof, or the like. In some embodiments, the wet etching processes may be performed using a mixture of etchants comprising HCl, $H_2O_2$, (de-ionized) DI water, a combination thereof, or the like. In some embodiments, the wet cleaning process is performed using DI water, a mixture of DI water and dilute HCl, or the like. In some embodiments, the gate electrode 94 of the gate stacks 92/94 is removed by a dry etching process using a mixture of etchants comprising $Cl_2$, $SiCl_4$, $O_2$, $BCl_3$, a combination thereof, or the like. In some embodiments, the gate dielectric layer 92 of the gate stacks 92/94 is removed by a dry etching process using a mixture of etchants comprising $BCl_3$, or the like. The patterning process forms openings 132, such that the openings 132 extend through the gate stack 92/94 and into the isolation regions 56. In some embodiments, the openings 132 have sloped sidewalls. In some embodiments, top portions of the openings 132 have a first width $W_1$ and bottom portions of the openings 132 have a second width $W_2$. In some embodiments, the first width $W_1$ is greater than the second width $W_2$. In some embodiments, the first width $W_1$ is between about 14 nm and about 50 nm. In some embodiments, the second width $W_2$ is between about 8 nm and about 30 nm. In some embodiments, a ratio $W_1/W_2$ is between about 1.1 and about 1.4. In some embodiments, the openings 132 extend below topmost surfaces the isolation regions 56 to a depth $D_1$. In some embodiments, the depth $D_1$ is between about 20 nm and about 55 nm.

Further in FIGS. 16A, 16B, 16C and 16D, in some embodiments, patterned gate stacks 92/94 may be damaged by etchants used for forming the openings 132. In some embodiments, the etchants may penetrate into the patterned gate stacks 92/94 from sidewalls of the openings 132 and may damage the patterned gate stacks 92/94. By forming the gate stacks 92/94 as described below with reference to FIGS. 20P-41P and 20N-41N, seam void defects are not formed in the gate stacks 92/94 and the etchants of the gate cut process do not penetrate into the seam void defects to damage the gate stacks 92/94.

In FIGS. 17A, 17B, 17C, and 17D, a dielectric material 134 is formed in the openings 130 (see FIGS. 15A, 15B, 15C, and 15D) and the openings 132 (see FIGS. 16A, 16B, 16C, and 16D). In some embodiments, the dielectric material 134 silicon oxide, titanium nitride, silicon nitride, silicon oxynitride, a combination thereof, or the like, and may formed using CVD, ALD, a combination thereof, or the like. In some embodiments, the dielectric material 134 overfills the openings 130 and 132 such that a portion of the dielectric material 134 is disposed over a topmost surface of the hard mask 128.

Figure 18B:
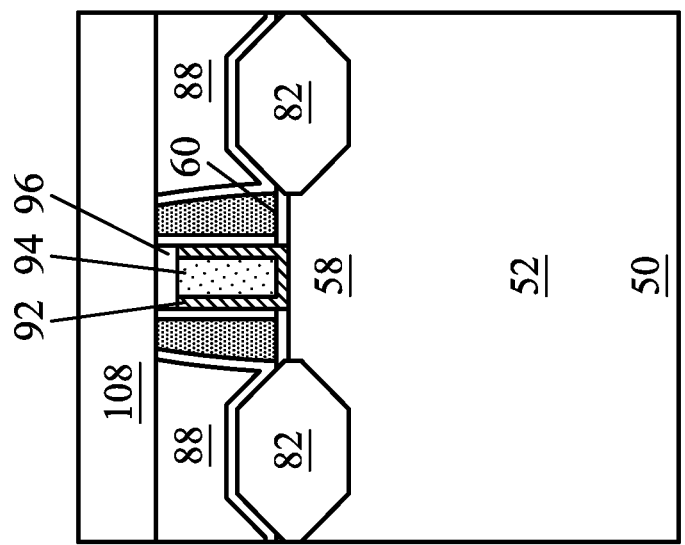
Figure 18A:
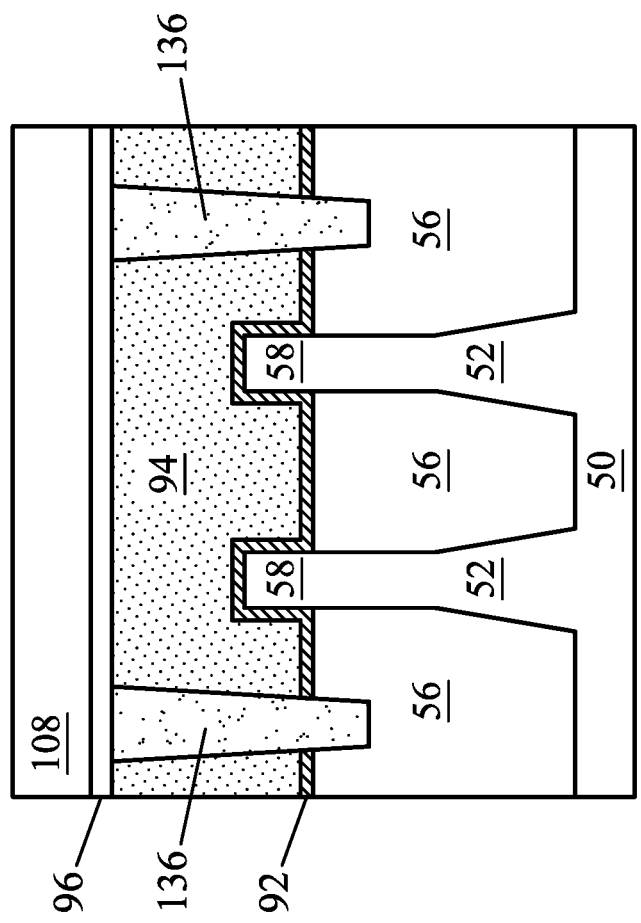

In FIGS. 18A and 18B, a planarization process is performed to remove the hard mask 128 (see FIGS. 17A, 17B, 17C, and 17D) and portions of the dielectric material 134 (see FIGS. 17A, 17B, 17C, and 17D) disposed above the topmost surface of the gate stack. In some embodiments, the planarization process may comprise a CMP process, an etch process, a combination thereof, or the like. Remaining portions of the dielectric material 134 form isolation regions 136 separating and electrically isolating adjacent portions of the patterned gate stack 92/94. In the embodiment illustrated in FIGS. 18A and 18B, a portion of the patterned gate stacks 92/94 overlaps with two fins of the fins 52. In other embodiments, portions of the patterned gate stacks 92/94 may overlap with one fin or more than two fins of the fins 52.

Further in FIGS. 18A and 18B, after performing the planarization process, a second ILD 108 is deposited over the first ILD 88 and the gate stacks 92/94 (including gate dielectric layers 92 and corresponding overlying gate electrodes 94). In some embodiment, the second ILD 108 is a flowable film formed by a flowable CVD method. In some embodiments, the second ILD 108 is formed of a dielectric material such as PSG, BSG, BPSG, USG, a combination thereof, or the like, and may be deposited by any suitable method, such as CVD, PECVD, a combination thereof, or the like. In some embodiments, before the formation of the second ILD 108, the gate stacks 92/94 are recessed, so that recesses are formed directly over the gate stacks 92/94 and between opposing portions of gate spacers 86. Gate masks 96 comprising one or more layers of dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 110 (see FIGS. 19A and 19B) penetrate through the respective gate mask 96 to contact the top surface of the respective recessed gate electrode 94.

Figure 19B:
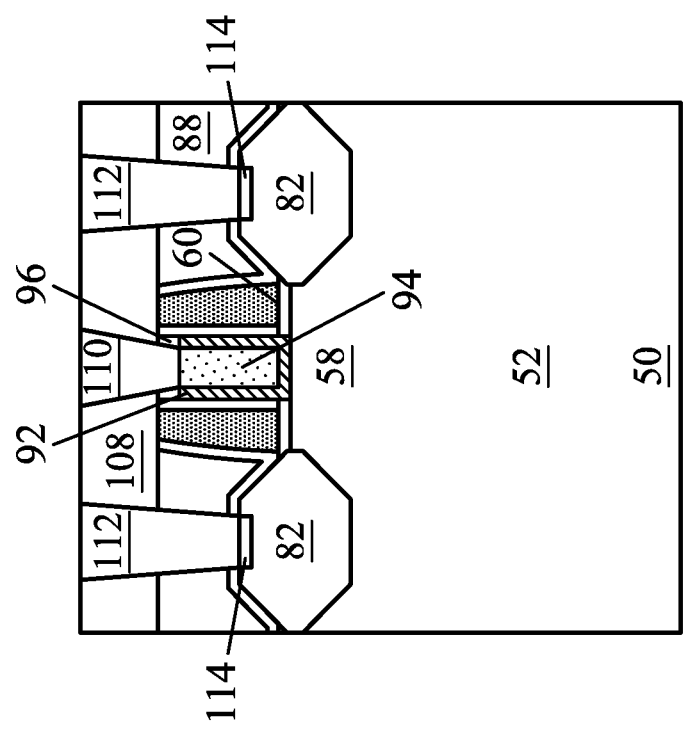
Figure 19A:
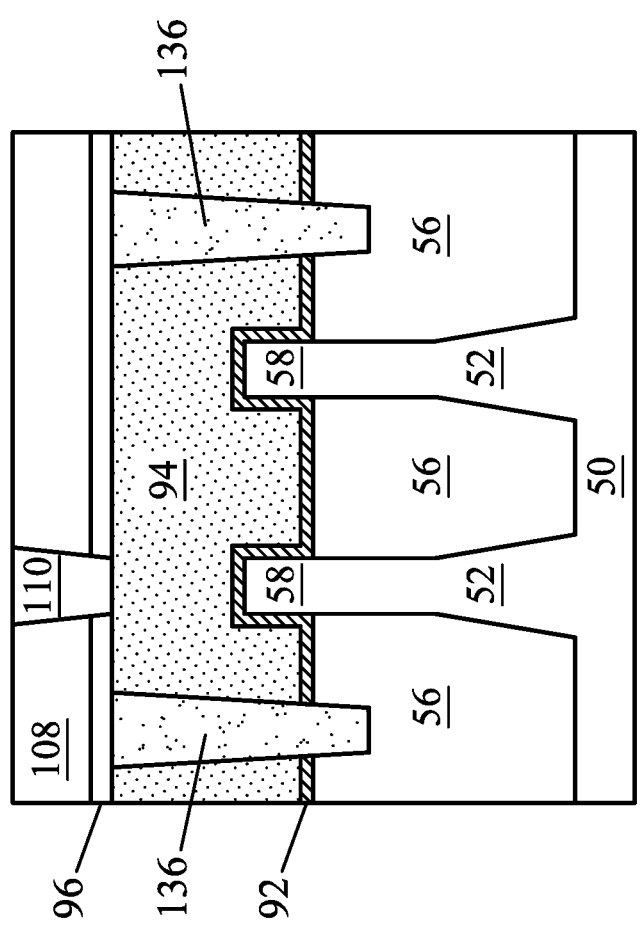

In FIGS. 19A and 19B, gate contacts 110 and source/drain contacts 112 are formed through the second ILD 108 and the first ILD 88 in accordance with some embodiments. Openings for the source/drain contacts 112 are formed through the first ILD 88 and the second ILD 108, and openings for the gate contacts 110 are formed through the second ILD 108 and the gate masks 96. The openings may be formed using acceptable photolithography and etching techniques. After forming the openings for the source/drain contacts 112, silicide layers 114 are formed through the openings for the source/drain contacts 112. In some embodiments, a metallic material is deposited in the openings for the source/drain contacts 112. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 114. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 114, unreacted portions of the metallic material are removed using a suitable removal process. Subsequently, a liner, such as a diffusion barrier layer, an adhesion layer, or the like, and a conductive material are formed in the openings for the source/drain contacts 112 and in the openings for the gate contacts 110. The liner may include titanium, titanium nitride, tantalum, tantalum nitride, a combination thereof, or the like. The conductive material may be copper, a copper alloy, silver, gold, tungsten, cobalt, aluminum, nickel, a combination thereof, or the like. A planarization process, such as a CMP process, may be performed to remove excess material from a surface of the second ILD 108. The remaining portions of the liner and the conductive material form the source/drain contacts 112 and the gate contacts 110 in the openings. The source/drain contacts 112 are physically and electrically coupled to the respective epitaxial source/drain regions 82, and the gate contacts 110 are physically and electrically coupled to the respective gate electrodes 94. The source/drain contacts 112 and gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Figure 20N:
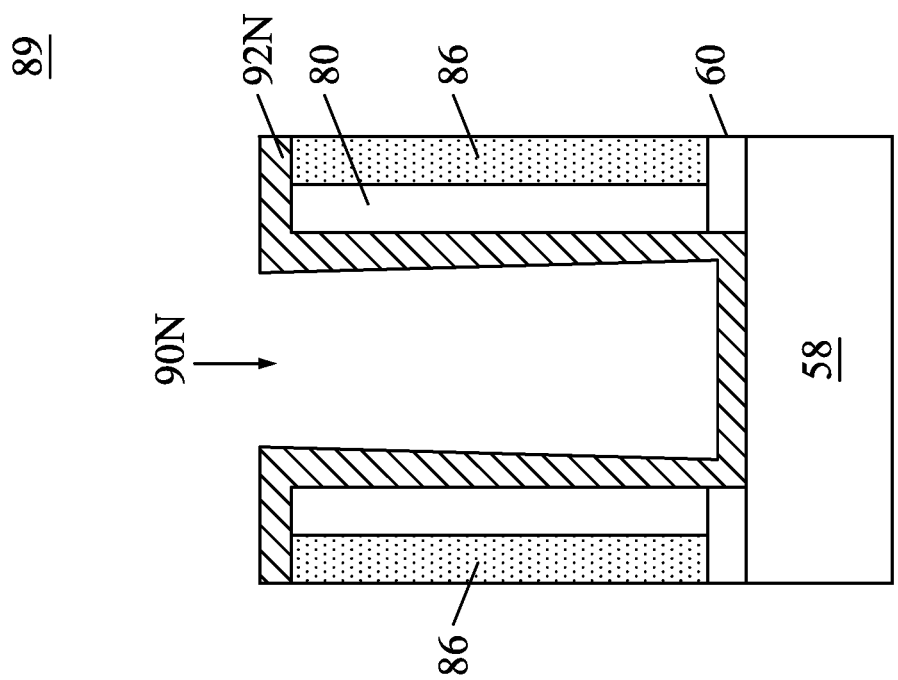
FIGS. 20P, 20N, 21P, 21N, 22P, 22N, 23P, 23N, 24P, 24N, 25P, 25N, 26P, 26N, 27P, and 27N are cross-sectional views of intermediate stages in the manufacturing of gate structures in accordance with some embodiments.
Figure 20P:
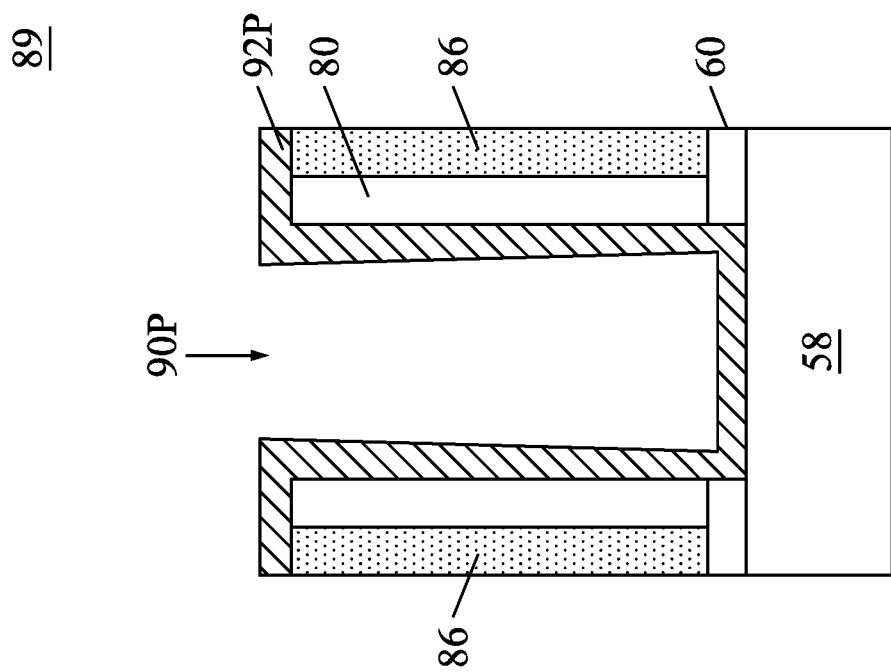

FIGS. 20P, 20N, 21P, 21N, 22P, 22N, 23P, 23N, 24P, 24N, 25P, 25N, 26P, 26N, 27P, and 27N are cross-sectional views of intermediate stages in the manufacturing of gate stacks in accordance with some embodiments. FIGS. 20P-27P illustrate detailed views of a region 89 of FIG. 14B in the region 50P (see FIGS. 2-7). FIGS. 20N-27N illustrate detailed views of a region 89 of FIG. 14B in the region 50N (see FIGS. 2-7). In FIGS. 20P and 20N, an opening 90P of the openings 90 (see FIG. 13B) in the region 50P and an opening 90N of the openings 90 in the region 50N are illustrated, respectively. As described below in greater detail, a gate stack 92P/94P (including a gate dielectric layer 92P and a corresponding overlying gate electrode 94P as illustrated in FIG. 27P) is formed in the opening 90P and a gate stack 92N/94N (including a gate dielectric layer 92N and a corresponding overlying gate electrode 94N as illustrated in FIG. 27N) is formed in the opening 90N.

Further in FIGS. 20P and 20N, a gate dielectric layer 92P is formed in the opening 90P in the region 50P and a gate dielectric layer 92N is formed in the opening 90N in the region 50N, respectively. The gate dielectric layers 92P and 92N are deposited conformally in the openings 90P and 90N, respectively, such as on the top surfaces and the sidewalls of the fins 52 and on sidewalls of the gate seal spacers 80/gate spacers 86. The gate dielectric layers 92P and 92N may also be formed on top surface of the first ILD 88. In some embodiments, each of the gate dielectric layers 92P and 92N may comprise silicon oxide, silicon nitride, or multilayers thereof. In some embodiments, each of the gate dielectric layers 92N and 92P may comprise a high-k dielectric material, and in these embodiments, the gate dielectric layers 92P and 92N may have a k value greater than about 7.0, and may include a metal oxide or a silicate of Hf, Al, Zr, La, Mg, Ba, Ti, Pb, combinations thereof, or the like. The formation methods of the gate dielectric layers 92P and 92N may include Molecular-Beam Deposition (MBD), ALD, PECVD, a combination thereof, or the like. In embodiments where portions of the dummy dielectric layer 60 remain in the openings 90P and 90N, the gate dielectric layers 92P and 92N include a material of the dummy dielectric layer 60 (e.g., SiO$_2$).

In some embodiments, the formation of the gate dielectric layers 92P in the region 50P and the gate dielectric layers 92N in the region 50N may occur by simultaneously conformally depositing a same dielectric material in the openings 90P and 90N, respectively. In such embodiments, the gate dielectric layers 92P and 92N comprise the same dielectric material. In other embodiments, a process for forming the gate dielectric layers 92P in the region 50P may be different from and not simultaneous with a process for forming the gate dielectric layers 92N in the region 50N. In such embodiments, the gate dielectric layers 92P and 92N may comprise different dielectric materials. Various masking steps may be used to mask and expose appropriate ones of regions 50P and 50N when using non-simultaneous processes. In some embodiments, the gate dielectric layers 92P have a thickness between about 8 Å and about 100 Å. In some embodiments, the gate dielectric layers 92N have a thickness between about 8 Å and about 100. In some embodiments when thicknesses of the gate dielectric layers 92N and the gate dielectric layers 92N are less than about 8 Å, such small thicknesses lead to high leakage currents through the gate dielectric layers 92P and 92N. In some embodiments when thicknesses of the gate dielectric layers 92P and the gate dielectric layers 92N are greater than about 100 Å, such large thicknesses lead to poor device speeds.

Figure 21N:
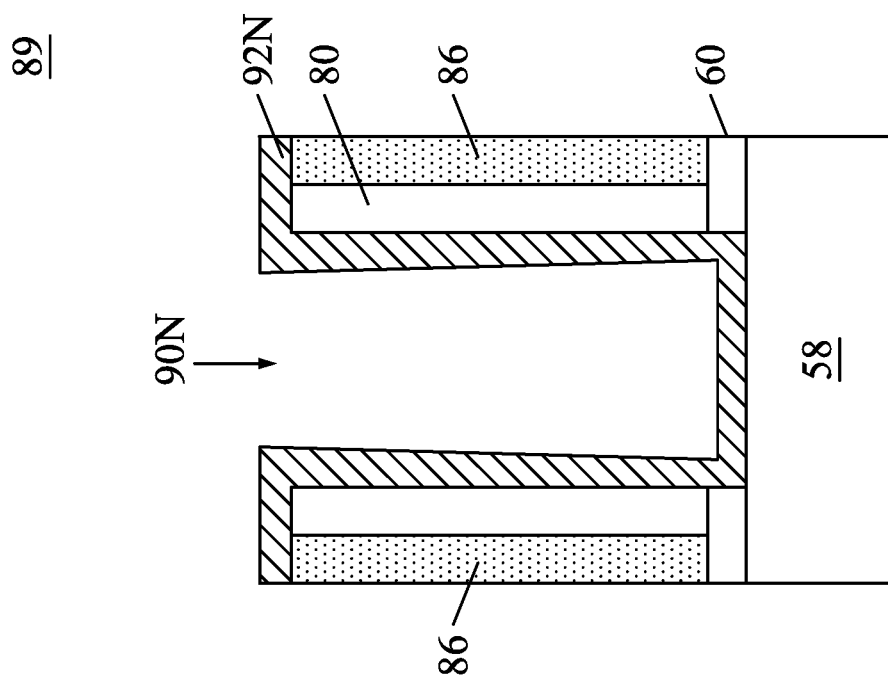
Figure 21P:
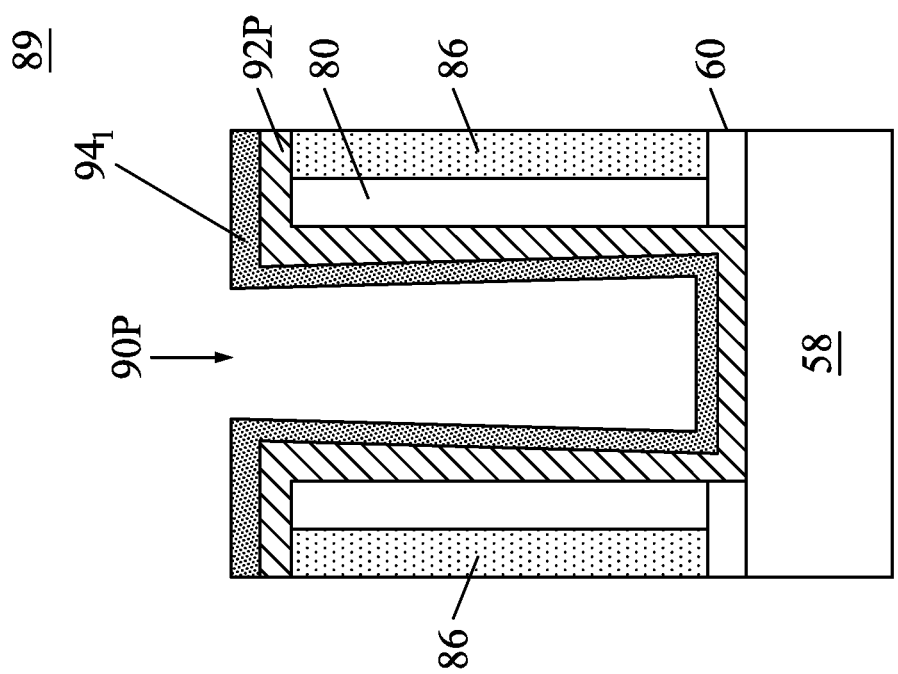

In FIGS. 21P and 21N, a P-type work function layer 94$_1$ is formed in the opening 90P in the region 50P. In some embodiments, a P-type work function material is formed in the opening 90P and 90N in both the region 50P and the region 50N. In such embodiments, the P-type work function material is subsequently removed from the region 50N, such that the P-type work function material remains only in the region 50P and forms P-type work function layer 94$_1$. In other embodiments, a mask layer is formed over the region 50N and a P-type work function material is formed in the opening 90P in the region 50P. In such embodiments, the mask layer is removed after forming the P-type work function material in the opening 90P. In some embodiments, the P-type work function layer 94$_1$ may comprise TiN, WN, TaN, Ru, Co, combinations thereof, multi-layers thereof, or the like, and may be formed using PVD, CVD, ALD, a combination thereof, or the like. In some embodiments, the P-type work function layer 94$_1$ has a thickness between about 5 Å and about 300 Å. In some embodiments when the thickness of the P-type work function layer 94$_1$ is less than about 5 Å, such a small thickness leads to an insufficient work function value for the resulting device and to work function value and work function thickness non-uniformity across the wafer. In some embodiments when the thickness of the P-type work function layer 94$_1$ is greater than about 300 Å, such a large thickness leads to high gate resistance (R$_G$).

Figure 22N:
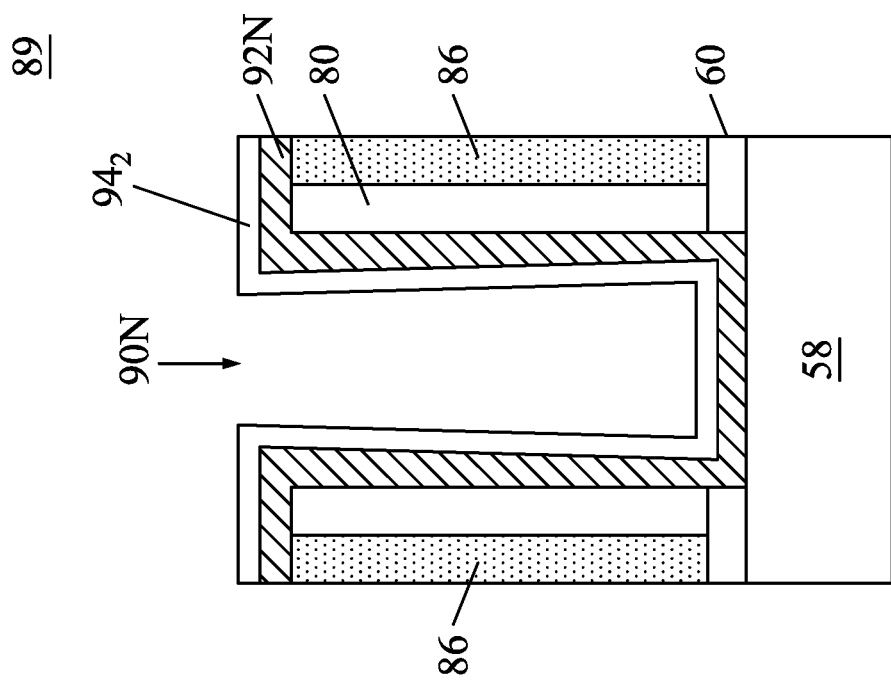
Figure 22P:
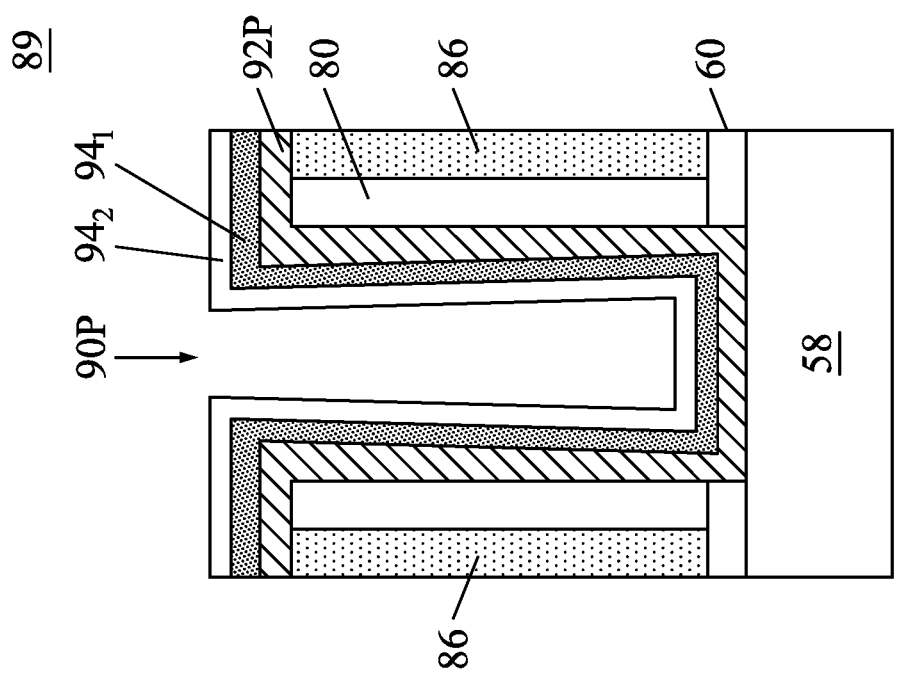

In FIGS. 22P and 22N, an N-type work function layer 94$_2$ is formed in the opening 90P in the region 50P and the opening 90N in the region 50N. In some embodiments, the N-type work function layer 94$_2$ may comprise Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In some embodiments, the N-type work function layer 94$_2$ has a thickness between about 8 Å and about 400 Å. In some embodiments when the thickness of the N-type work function layer 94$_2$ is less than about 8 Å, such a small thickness leads to an insufficient work function value for the resulting device and to work function value and work function thickness non-uniformity across the wafer. In some embodiments when the thickness of the N-type work function layer 94$_2$ is greater than about 400 Å, such a large thickness leads to high gate resistance (R$_G$).

Figure 23N:
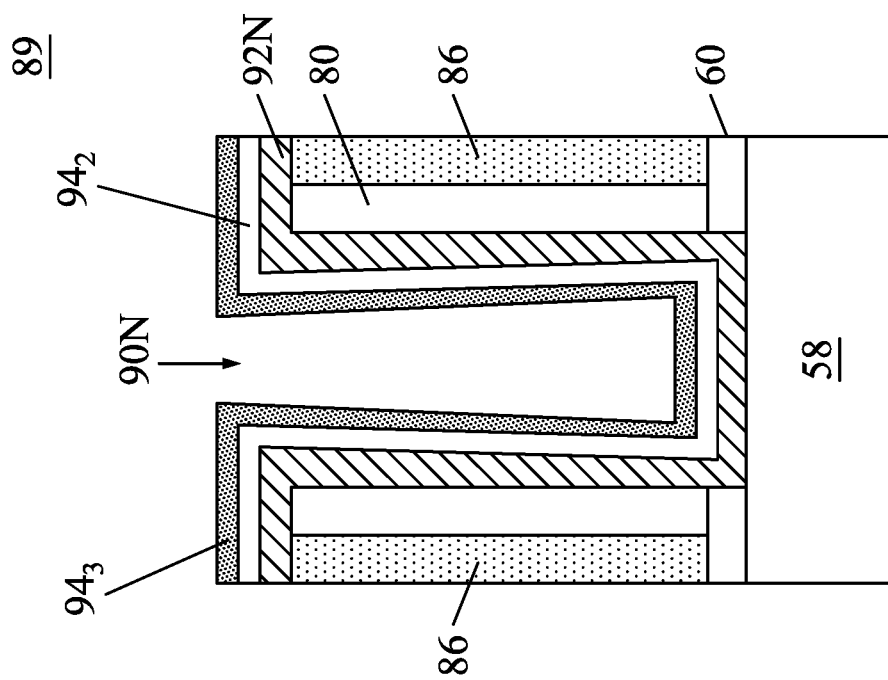
Figure 23P:
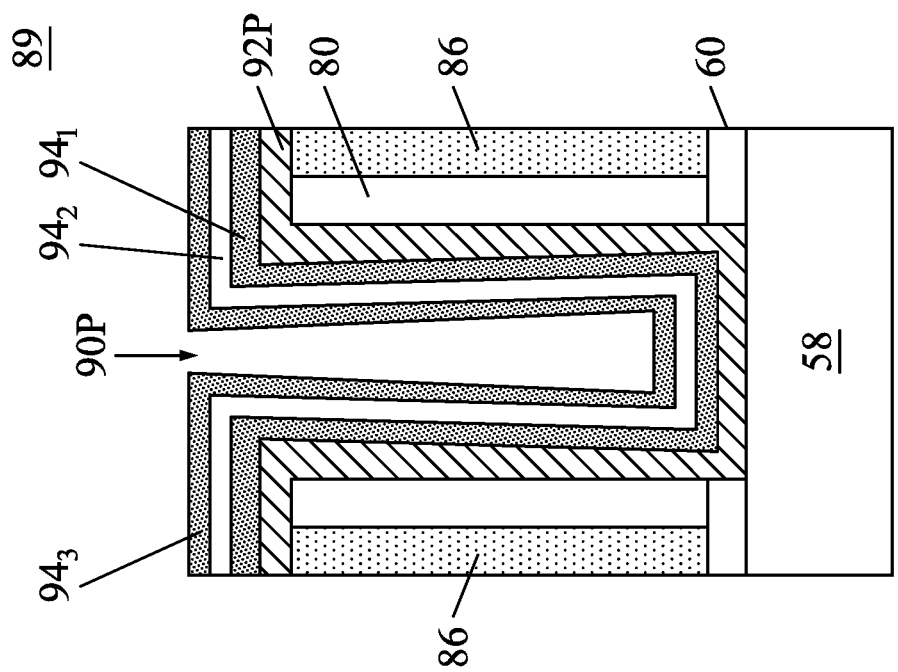

In FIGS. 23P and 23N, a protective layer 94$_3$ is formed in the opening 90P in the region 50P and the opening 90N in the region 50N. In some embodiments, the protective layer 94$_3$ may comprise Ti, Si, TiN, TiSi, TiAl, SiC, TaN, combinations thereof, multi-layers thereof, or the like, and may be formed using PVD, CVD, ALD, a combination thereof, or the like. In some embodiments, the protective layer 94$_3$ protects the N-type work function layer 94$_2$ from oxidizing during subsequent process steps. In some embodiments, the protective layer 94$_3$ has a thickness between about 5 Å and about 100 Å. In some embodiments when the thickness of the protective layer 94$_3$ is less than about 5 Å, such a small thickness is not able to provide sufficient protection to the P-type work function layer 94$_1$ and to the N-type work function layer 94$_2$ and also has poor thickness uniformity across the wafer. In some embodiments when the thickness of the protective layer 94$_3$ is greater than about 100 Å, such a large thickness leads to high gate resistance (R$_G$) and to effective work function degradation.

In some embodiments where the openings 90P and 90N have widths of about 23 nm to about 300 nm, the layers, such as the gate dielectric layers 92P and 92N, the P-type work function layer 94$_1$, the N-type work function layer 94$_2$, and the protective layer 94$_3$, may not be deposited conformally in the openings 90P and 90N. In some embodiments, thicknesses of the layers disposed on upper portions of sidewall of the openings 90P and 90N may be greater than thicknesses of the layers disposed on lower portions of the sidewall of the openings 90P and 90N. Such a non-conformal deposition of the layers results in narrowing or pinching off of the upper portions of the openings 90P and 90N. The narrowing of the upper portions of the openings 90P and 90N may prevent additional layers that are subsequently deposited in the openings 90P and 90N from fully filling up the openings 90P and 90N. In some embodiments, due to the partial filling of the openings 90P and 90N, the resulting gate stacks may comprise seam void defects that adversely affect the functionally of the gate stacks. As described below in greater detail, an etching process is performed to widen the upper portions of the openings 90P and 90N that improves the filling properties of the openings 90P and 90N and reduce/avoid any seam void defects.

Figure 24N:
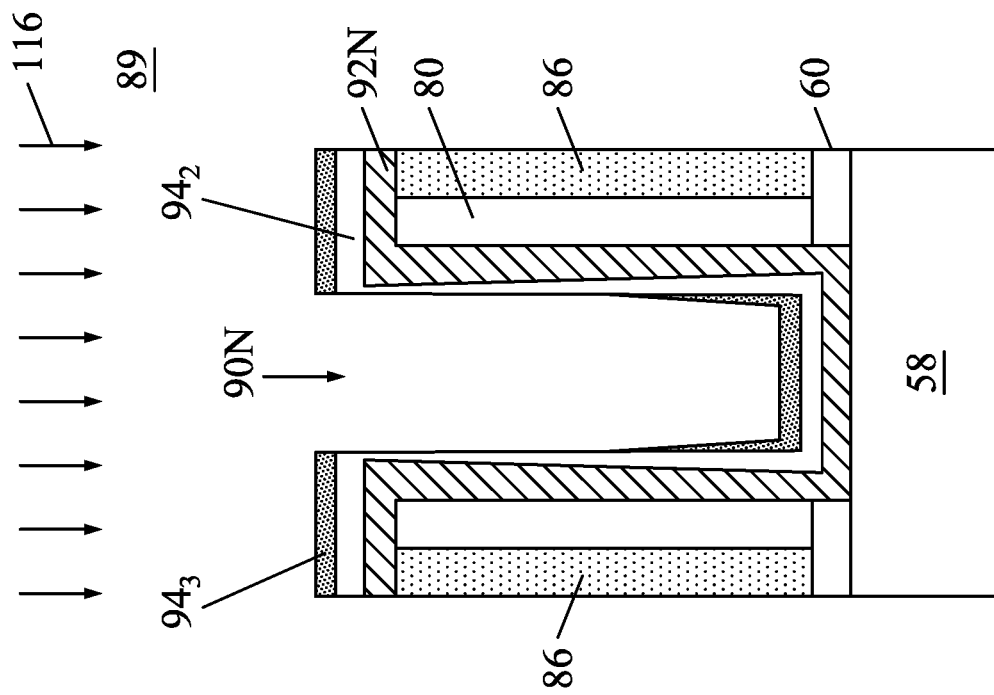
Figure 24P:
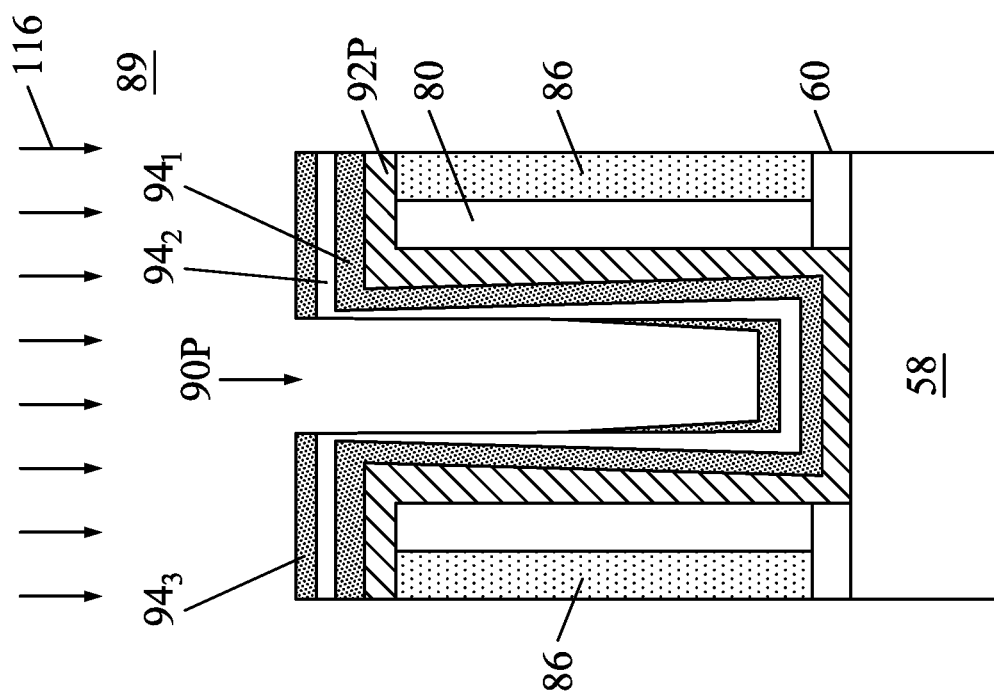

In FIGS. 24P and 24N, an etch process (indicated by arrows 116) is performed to widen the upper portions of the openings 90P and 90N. In some embodiments, the etch process 116 is a plasma process performed by a plasma generated from a gas mixture comprising Ar, He, H$_2$, N$_2$, CF$_4$, Cl$_2$, BCl$_3$, a combination thereof, or the like. In some embodiments, the etch process 116 may be performed with a plasma power of between about 200 W and about 1400 W. In some embodiments, the etch process 116 may be performed with a substrate voltage bias of between about 30 V and about 250 V. In some embodiments, the etch process 116 may be performed at a pressure between about 4 mTorr and about 200 mTorr. In some embodiments, the etch process 116 may be performed at a temperature between about 20° C. and about 250° C. In some embodiments, the etch process 116 may be performed during an etch time of between about 5 s and about 350 s.

In some embodiments, the etch process 116 removes portions of the protective layer 94$_3$, the N-type work function layer 94$_2$, and/or the P-type work function layer 94$_1$ from sidewalls of the upper portions of the openings 90P and 90N to widen the upper portions of the openings 90P and 90N. In some embodiments, the amount of the removed material depends on parameters of the etch process 116 and may be tuned by tuning the plasma power, the substrate bias voltage, the pressure, the temperature, the etch time, and/or the plasma composition of the etch process 116. In some embodiments, the etch process 116 completely removes the protective layer $94_3$ from the sidewalls of the upper portions of the openings 90P and 90N. In other embodiments, in addition to completely removing the protective layer $94_3$ from the sidewalls of the upper portions of the openings 90P and 90N, the etch process 116 removes portions of the P-type work function layer $94_1$ form the sidewalls of the upper portion of the opening 90N and portions of the P-type work function layer $94_1$ or portions of the N-type work function layer $94_2$ from the sidewalls of the upper portion of the opening 90P.

In some embodiments, after performing the etch process 116, the N-type work function layer $94_2$ and the protective layer $94_3$ have non-uniform thicknesses along the sidewalls of the openings 90P and 90N. In some embodiments, the thickness of the protective layer $94_3$ decreases as the protective layer $94_3$ extends along the sidewalls of the openings 90P and 90N away from the respective channel regions 58. In some embodiments, the thickness of the N-type work function layer $94_2$ decreases as the N-type work function layer $94_2$ extends along the sidewalls of the openings 90P and 90N away from the respective channel regions 58. In some embodiments, the N-type work function layer $94_2$ may extend along the sidewalls of the openings 90P and 90N all the way to the top of the openings 90P and 90N. In other embodiments, the N-type work function layer $94_2$ may not reach the top of the openings 90P and 90N and may partially line the sidewalls of the openings 90P and 90N.

Figure 25N:
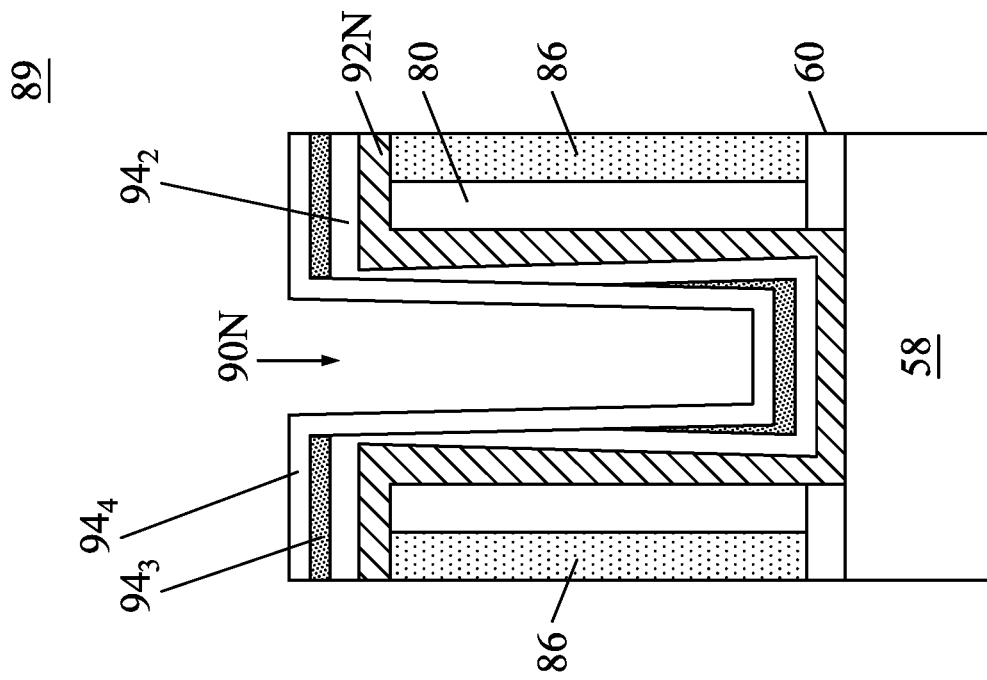
Figure 25P:
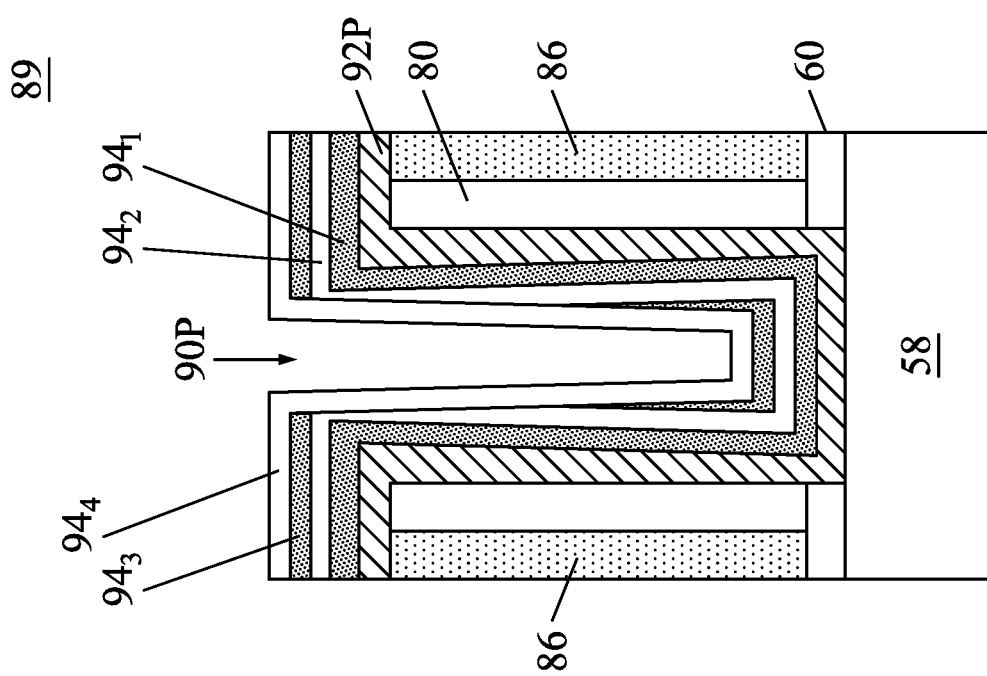

In FIGS. 25P and 25N, after performing the etch process 116 (see FIGS. 24P and 24N), a protective layer $94_4$ is formed in the opening 90P in the region 50P and in the opening 90N in the region 50N. In some embodiments, the protective layer $94_4$ may be formed using similar materials and methods as the protective layer $94_3$ described above with reference to FIGS. 23P and 23N, and the description is not repeated herein. In some embodiments, the protective layer $94_4$ and the protective layer $94_3$ comprise a same material. In other embodiments, the protective layer $94_4$ and the protective layer $94_3$ comprise different materials. In some embodiments, the protective layer $94_4$ protects exposed portion of the N-type work function layer $94_2$ and/or exposed portions of the P-type work function layer $94_1$ from oxygen (O), carbon (C), and fluorine (F) pickup during subsequent processes steps. In some embodiments, the protective layer $94_4$ has a thickness between about 5 Å and about 100 Å. In some embodiments when the thickness of the protective layer $94_4$ is less than about 5 Å, such a small thickness is not able to provide sufficient protection to the P-type work function layer $94_1$ and the N-type work function layer $94_2$ and causes thickness non-uniformity across the wafer. In some embodiments when the thickness of the protective layer $94_4$ is greater than about 100 Å, such a large thickness leads to high gate resistance ($R_G$) and to effective work function degradation.

Figure 26N:
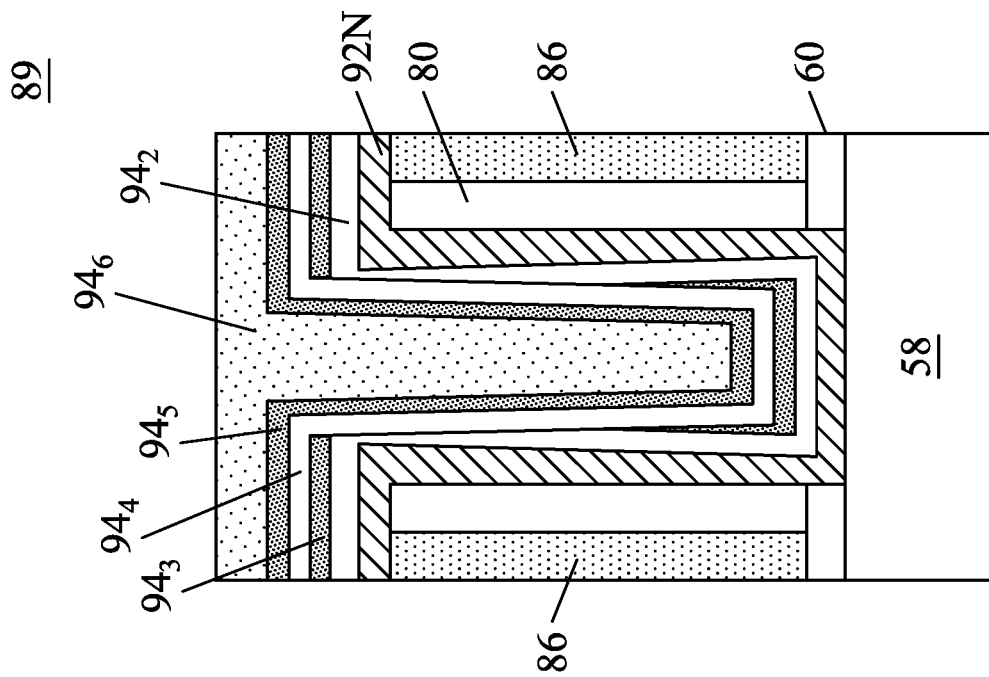
Figure 26P:
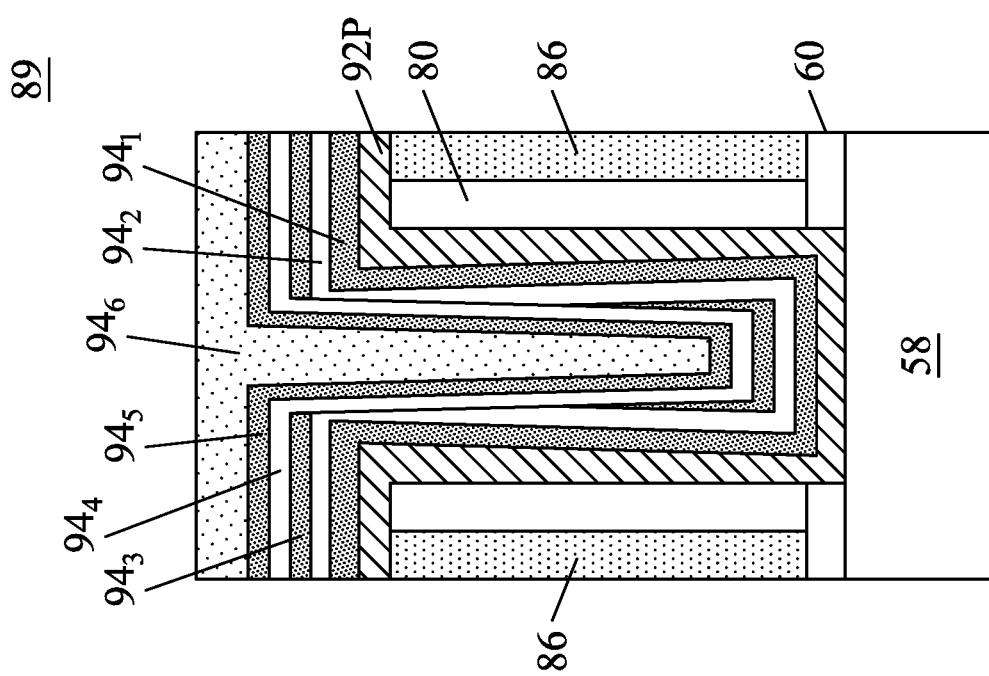
Figure 27N:
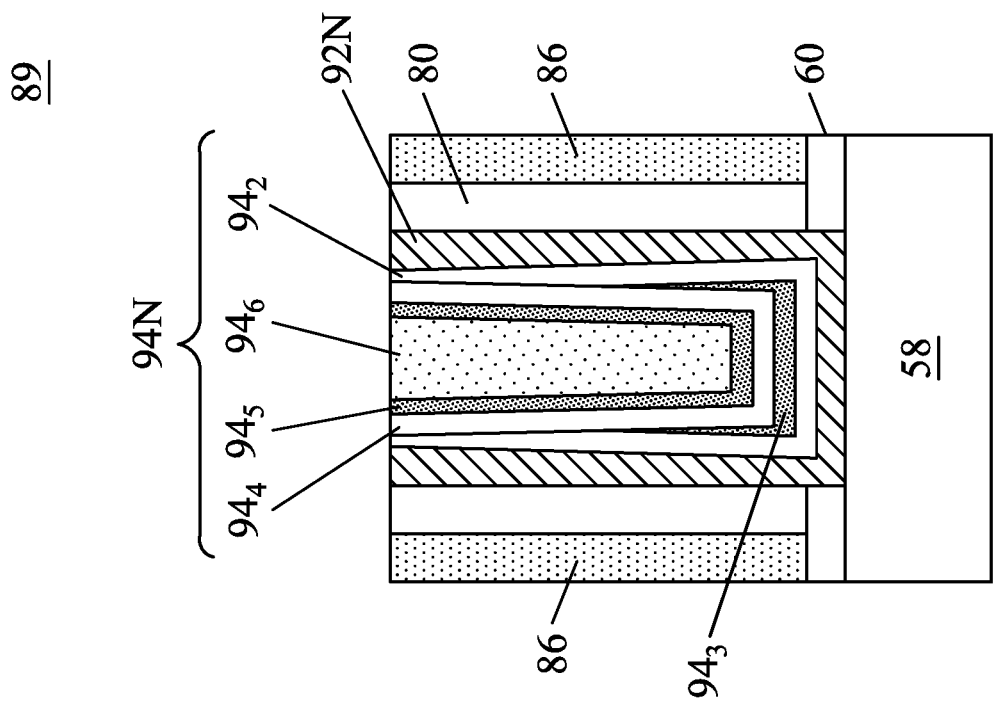
Figure 27P:
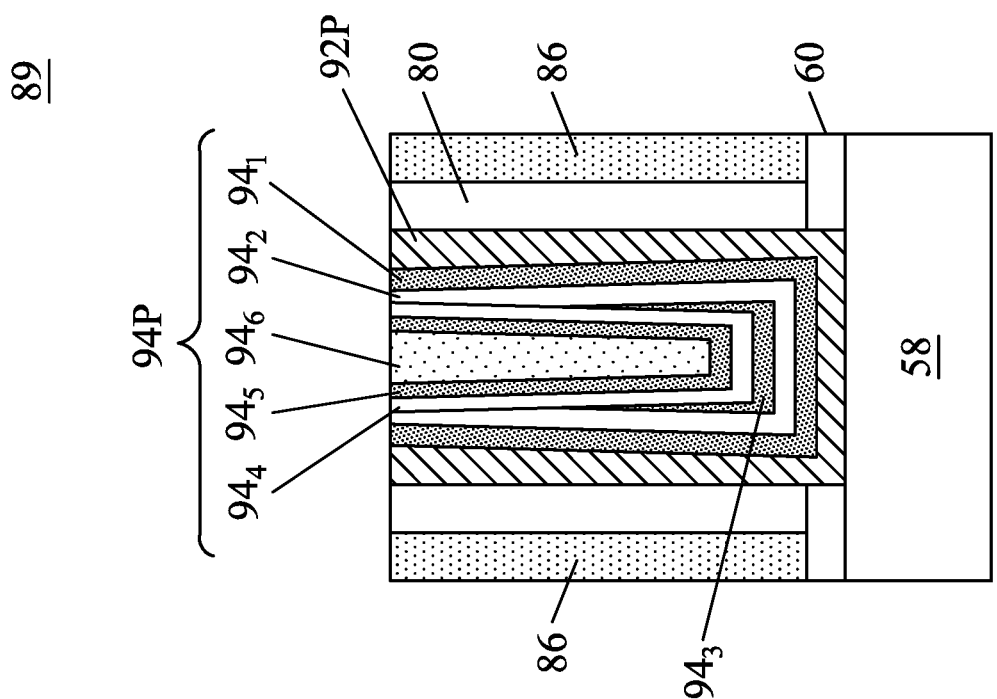

In FIGS. 26P and 26N, a glue layer $94_5$ is formed in the opening 90P in the region 50P and in the opening 90N in the region 50N. In some embodiments, the glue layer $94_5$ may comprise Ti, TiN, Co, W, combinations thereof, multilayers thereof, or the like and may be formed using PVD, CVD, ALD, a combination thereof, or the like. In some embodiments, the glue layer $94_5$ has a thickness between about 8 Å and about 90 Å. In some embodiments when the thickness of the glue layer $94_5$ is less than about 8 Å, the glue layer of such a small thickness may not fully cover the wafer and may adversely affect nucleation of a subsequently formed fill material $94_6$. In some embodiments when the thickness of the glue layer $94_5$ is greater than about 90 Å, such a large thickness may lead to high gate resistance ($R_G$). Subsequently, a fill material $94_6$ is formed in the opening 90P in the region 50P and in the opening 90N in the region 50N. In some embodiments, the fill material $94_6$ overfills the openings 90P and 90N, such that portions of the fill material $94_6$ extend along the top surface of the first ILD 88. The fill material $94_6$ may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like. By widening the openings 90P and 90N as described above with reference to FIGS. 21P and 21N, the fill material $94_6$ fully fills up the openings 90P and 90N without forming seam void defects within the fill material $94_6$.

By forming the fill material $94_6$ without seam void defects, various issues caused by the seam void defects may be avoided. For example, various issues caused by the seam void defects include high gate resistance ($R_G$) due to air gaps within the fill material $94_6$, device speed degradation due to poor contact between the fill material $94_6$ and other layers of the gate stack, increase in gate resistance ($R_G$) and degradation of work function and threshold voltage ($V_t$) due to oxidation of gate stack layers caused by penetration of chemicals/gases into the seam void defects during a subsequently performed gate cut process.

In FIGS. 27P and 27N, after forming the fill material $94_6$, a planarization process, such as a CMP process, may be performed to remove excess portions of the layers 92P, 92N, $94_1$-$94_6$, which excess portions are over the top surface of the first ILD 88. The remaining portion of the gate dielectric layer 92P within the opening 90P forms the gate dielectric 92P of a replacement gates stack of the resulting FinFET device in the region 50P. The remaining portions of the layers $94_1$-$94_6$ within the opening 90P form the gate electrode 94P of the replacement gates stack of the resulting FinFET device in the region 50P. The gate electrode 94P and the respective gate dielectric 92P form the gate stack 92P/94P in the region 50P. The remaining portion of the gate dielectric layer 92N within the opening 90N forms the gate dielectric 92N of a replacement gates stack of the resulting FinFET device in the region 50N. The remaining portions of the layers $94_2$-$94_6$ within the opening 90N form the gate electrode 94N of the replacement gates stack of the resulting FinFET device in the region 50N. The gate electrode 94N and the respective gate dielectric 92N form the gate stack 92N/94N in the region 50N. In some embodiments, the remaining portion of the fill material $94_6$ has a non-uniform width, such that the width of the remaining portion of the fill material $94_6$ decreases as the remaining portion of the fill material $94_6$ extends from the topmost surface of the ILD 88 (see FIG. 14B) toward the respective channel region 58.

In some embodiments, after forming the gate stacks 92P/94P and 92N/94N, the gate stacks 92P/94P and 92N/94N may be patterned in a gate cut process. In some embodiments, the gate cut process may be performed as described above with reference to FIGS. 15A, 15B, 15C, 15D, 16A, 16B, 16C, 16D, 17A, 17B, 17C, and 17D, and the description is not repeated herein. By forming the gate stacks 92P/94P and 92N/94N as described above with reference to FIGS. 20P, 20N, 21P, 21N, 22P, 22N, 23P, 23N, 24P, 24N, 25P, 25N, 26P, 26N, 27P, and 27N, seam void defects are not formed in the gate stacks 92P/94P and 92N/94N and etchants of the gate cut process do not penetrate into the seam void defects to damage the gate stacks 92P/94P and 92N/94N.

FIGS. 28P, 28N, 29P, 29N, 30P, 30N, 31P, 31N, 32P, 32N, 33P, 33N, 34P, 34N, 35P, and 35N are cross-sectional views of intermediate stages in the manufacturing of gate stacks in accordance with some embodiments. FIGS. 28P-35P illustrate detailed views of a region 89 of FIG. 14B in the region 50P (see FIGS. 2-7). FIGS. 28N-35N illustrate detailed views of a region 89 of FIG. 14B in the region 50N (see FIGS. 2-7). As described below in greater detail, a gate stack 92P/94P (including a gate dielectric 92P and a corresponding overlying gate electrode 94P illustrated in FIG. 35P) is formed in the opening 90P in the region 50P and a gate stack 92N/94N (including a gate dielectric 92N and a corresponding overlying gate electrode 94N illustrated in FIG. 35N) is formed in the opening 90N in the region 50N. In some embodiments, some process steps described below with reference to FIGS. 28P, 28N, 29P, 29N, 30P, 30N, 31P, 31N, 32P, 32N, 33P, 33N, 34P, 34N, 35P, and 35N are similar to some of the process steps described above with reference to FIGS. 20P, 20N, 21P, 21N, 22P, 22N, 23P, 23N, 24P, 24N, 25P, 25N, 26P, 26N, 27P, and 27N, with like features being labeled by like numerical references, and the description of the like features is not repeated herein.

Figure 28N:
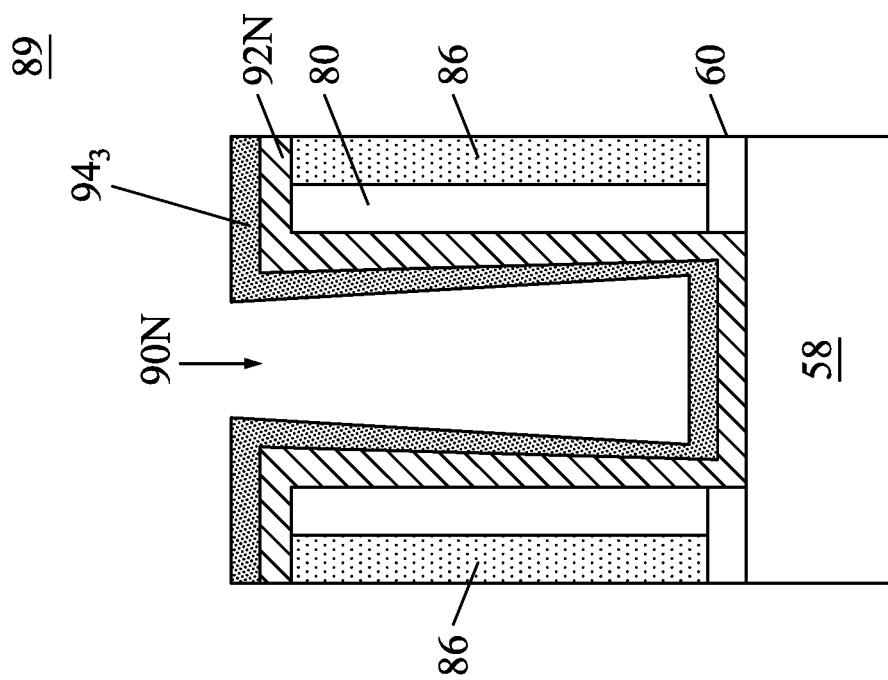
FIGS. 28P, 28N, 29P, 29N, 30P, 30N, 31P, 31N, 32P, 32N, 33P, 33N, 34P, 34N, 35P, and 35N are cross-sectional views of intermediate stages in the manufacturing of gate structures in accordance with some embodiments.
Figure 28P:
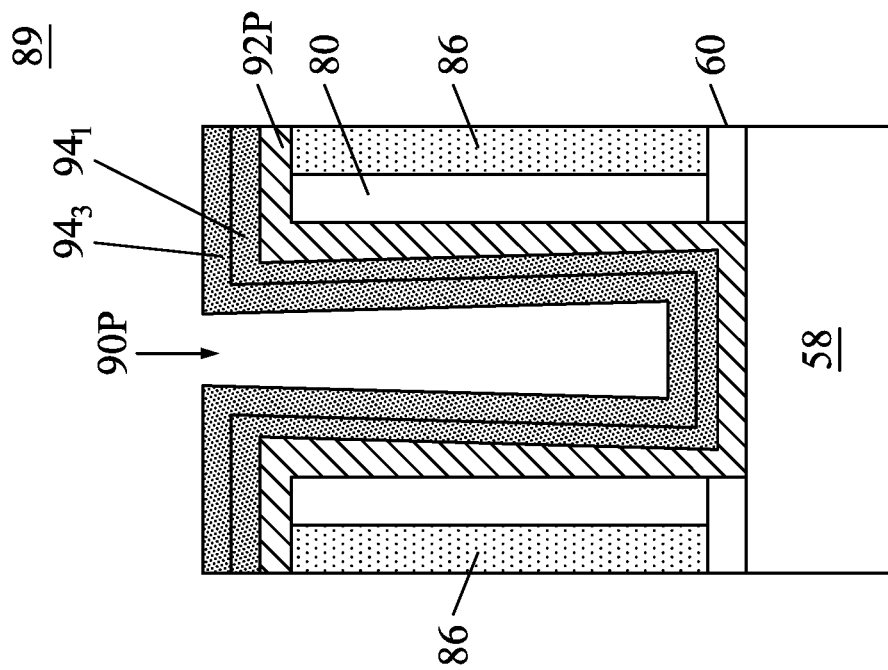

In FIGS. 28P and 28N, after forming a P-type work function layer $94_1$ in the opening 90P in the region 50P as described above with reference to FIGS. 21P and 21N, a protective layer $94_3$ is formed in the opening 90P in the region 50P and the opening 90N in the region 50N as described above with reference to FIGS. 23P and 23N, and the description is not repeated herein.

Figure 29N:
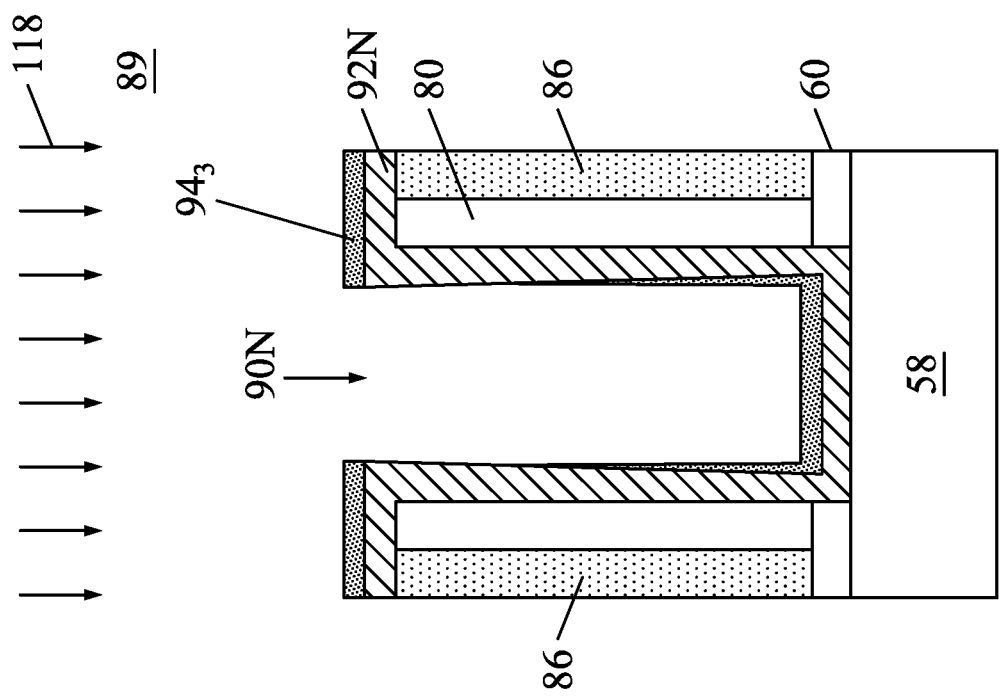
Figure 29P:
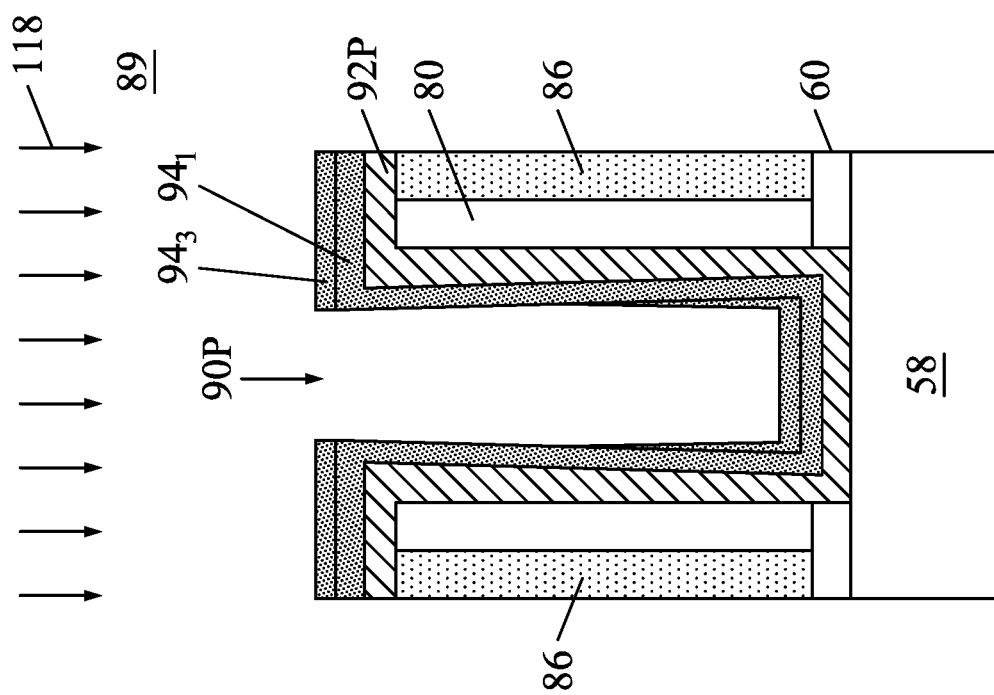

In FIGS. 29P and 29N, an etch process (indicated by arrows 118) is performed to widen upper portions of the openings 90P and 90N. In some embodiments, the etch process 118 is similar to the etch process 116 described above with reference to FIGS. 24P and 24N, and the description is not repeated herein. In some embodiments, the etch process 118 removes portions of the gate dielectric layer 92N, the P-type work function layer $94_1$, or the protective layer $94_3$ from sidewalls of the upper portions of the openings 90P and 90N to widen the upper portions of the openings 90P and 90N. In some embodiments, the amount of the removed material depends on parameters of the etch process 118 and may be tuned by tuning the plasma power, the substrate bias voltage, the pressure, the temperature, the etch time, and/or the plasma composition of the etch process 118. In some embodiments, the etch process 118 completely removes the protective layer $94_3$ from sidewalls of the upper portions of the openings 90P and 90N. In other embodiments, in addition to completely removing the protective layer $94_3$ from the sidewalls of the upper portions of the openings 90P and 90N, the etch process 118 further removes portions of the P-type work function layer $94_1$ from the sidewalls of the upper portions of the openings 90P and portions of the gate dielectric layer 92N from the sidewalls of the upper portions of the openings 90N.

In some embodiments, after performing the etch process 118, the P-type work function layer $94_1$ and the protective layer $94_3$ have non-uniform thicknesses along the sidewalls of the openings 90P and 90N. In some embodiments, the thickness of the protective layer $94_3$ decreases as the protective layer $94_3$ extends along the sidewalls of the openings 90P and 90N away from the respective channel regions 58. In some embodiments, the thickness of the P-type work function layer $94_1$ decreases as the P-type work function layer $94_1$ extends along the sidewalls of the opening 90P away from the respective channel region 58. In some embodiments, the P-type work function layer $94_1$ may extend along the sidewalls of the opening 90P all the way to the top of the opening 90P. In other embodiments, the P-type work function layer $94_1$ may not reach the top of the opening 90P and may partially line the sidewalls of the opening 90P.

Figure 30N:
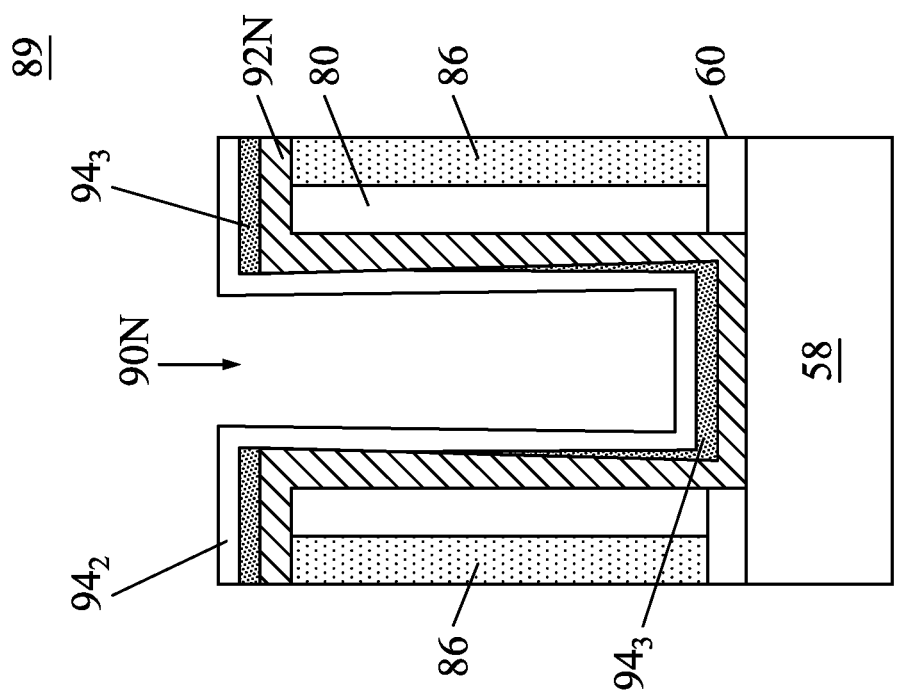
Figure 30P:
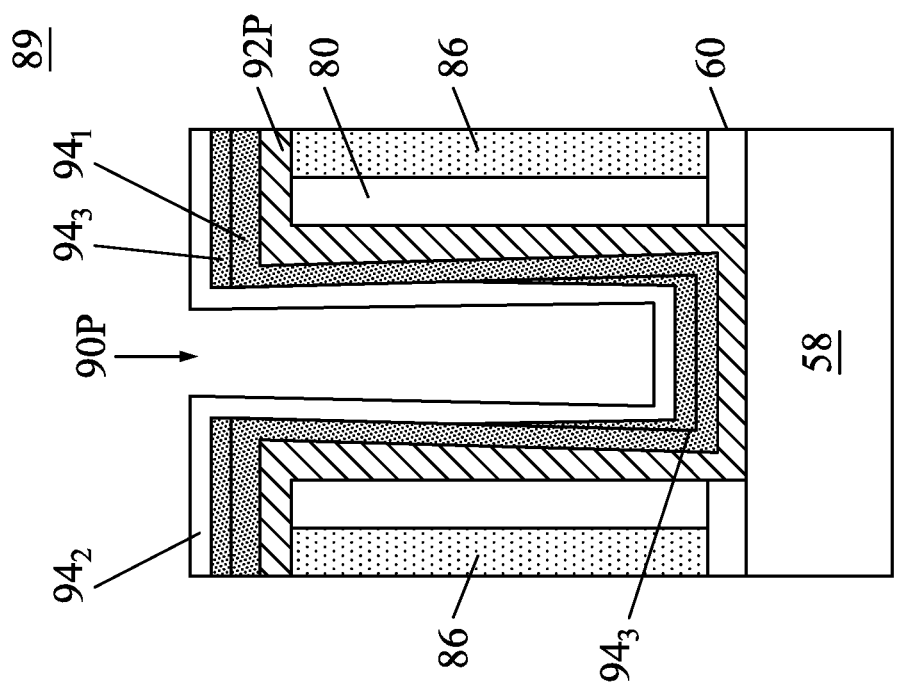

In FIGS. 30P and 30N, an N-type work function layer $94_2$ is formed in the opening 90P in the region 50P and the opening 90N in the region 50N as described above with reference to FIGS. 22P and 22N, and the description is not repeated herein.

Figure 31N:
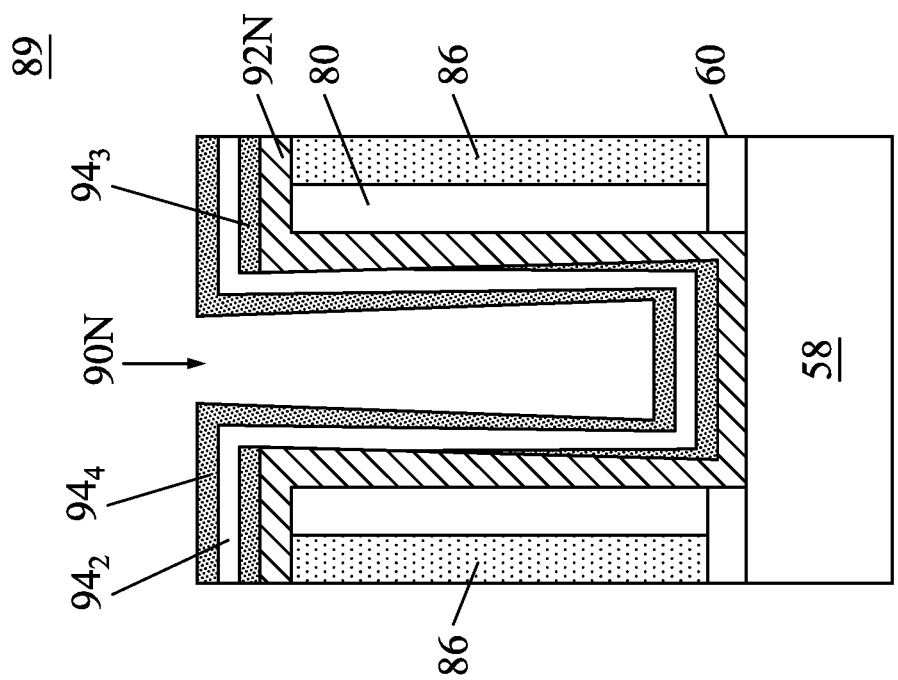
Figure 31P:
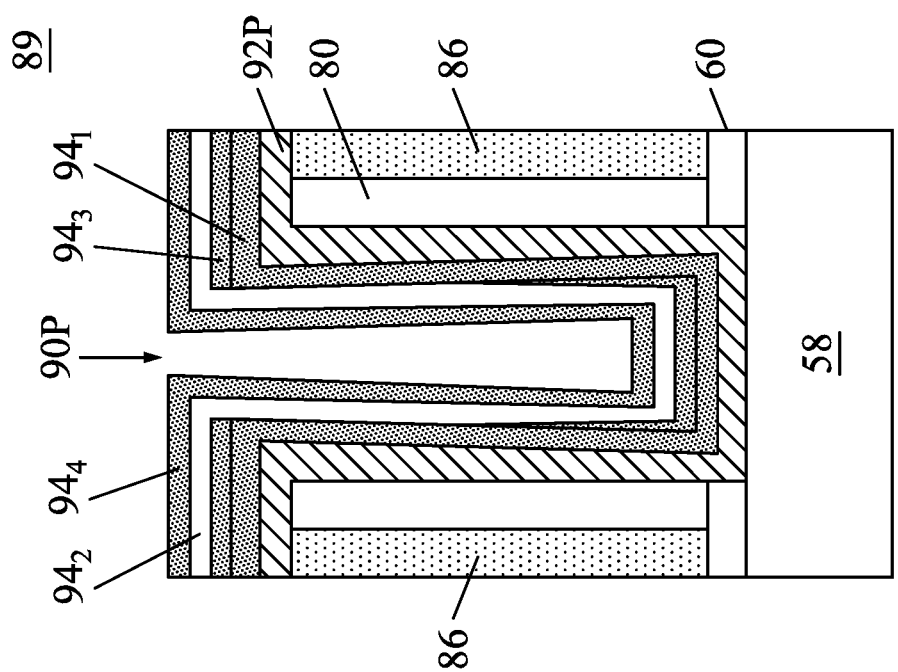

In FIGS. 31P and 31N, a protective layer $94_4$ is formed in the opening 90P in the region 50P and the opening 90N in the region 50N as described above with reference to FIGS. 25P and 25N, and the description is not repeated herein.

Figure 32N:
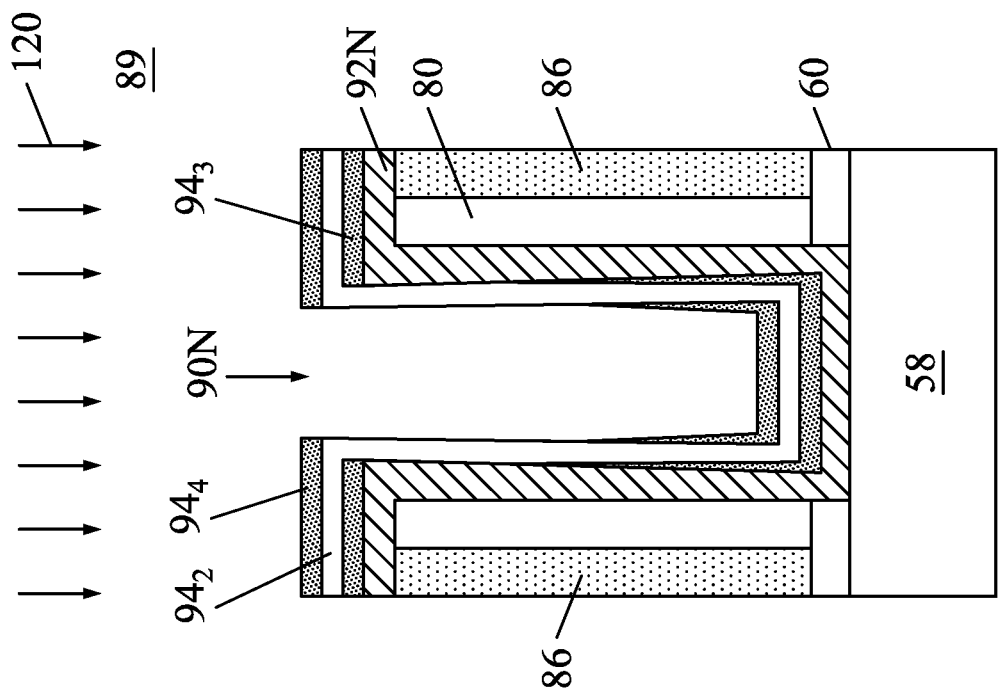
Figure 32P:
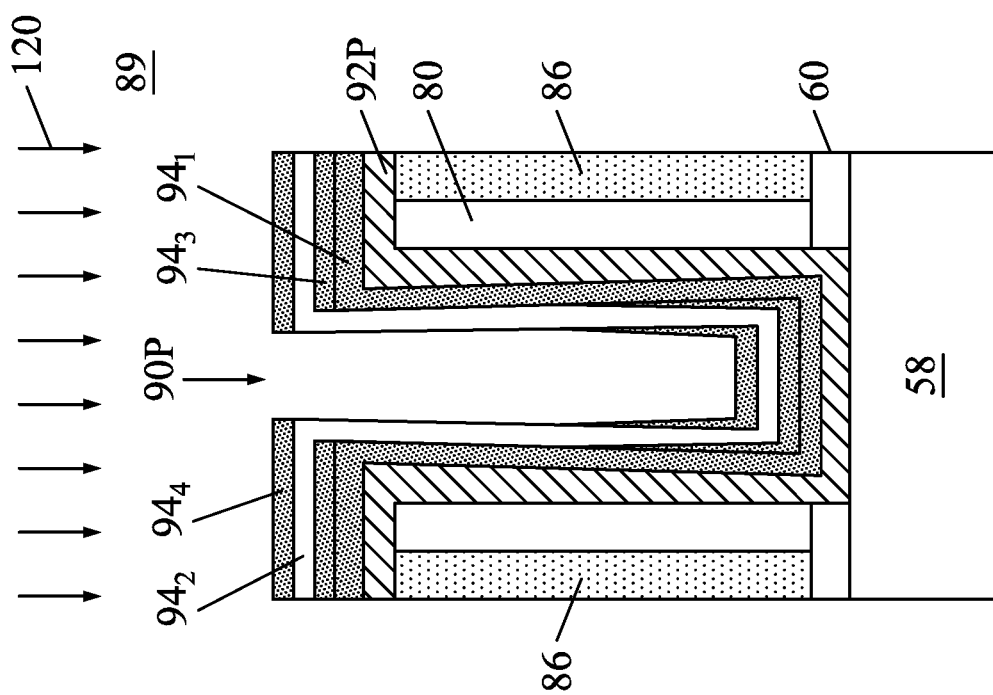

In FIGS. 32P and 32N, another etch process (indicated by arrows 120) is performed to widen the upper portions of the openings 90P and 90N. In some embodiments, the etch process 120 is similar to the etch process 116 described above with reference to FIGS. 24P and 24N, and the description is not repeated herein. In some embodiments, the etch process 120 removes portions of the N-type work function layer $94_2$ or portions of the protective layer $94_4$ from sidewalls of the upper portions of the openings 90P and 90N to widen the upper portions of the openings 90P and 90N. In some embodiments, the amount of the removed material depends on parameters of the etch process 120 and may be tuned by tuning the plasma power, the substrate bias voltage, the pressure, the temperature, the etch time, and/or the plasma composition of the etch process 120. In some embodiments, the etch process 120 completely removes the protective layer $94_4$ from sidewalls of the upper portions of the openings 90P and 90N. In other embodiments, in addition to completely removing the protective layer $94_4$ from sidewalls of the upper portions of the openings 90P and 90N, the etch process 120 further removes portions of the N-type work function layer $94_2$ from the sidewalls of the upper portions of the openings 90P and 90N.

In some embodiments, after performing the etch process 120, the N-type work function layer $94_2$ and the protective layer $94_4$ have non-uniform thicknesses along the sidewalls of the openings 90P and 90N. In some embodiments, the thickness of the protective layer $94_4$ decreases as the protective layer $94_4$ extends along the sidewalls of the openings 90P and 90N away from the respective channel regions 58. In some embodiments, the thickness of the N-type work function layer $94_2$ decreases as the N-type work function layer $94_2$ extends along the sidewalls of the openings 90P and 90N away from the respective channel regions 58. In some embodiments, the N-type work function layer $94_2$ may extend along the sidewalls of the openings 90P and 90N all the way to the top of the openings 90P and 90N. In other embodiments, the N-type work function layer $94_2$ may not reach the top of the openings 90P and 90N and may partially line the sidewalls of the openings 90P and 90N.

Figure 33N:
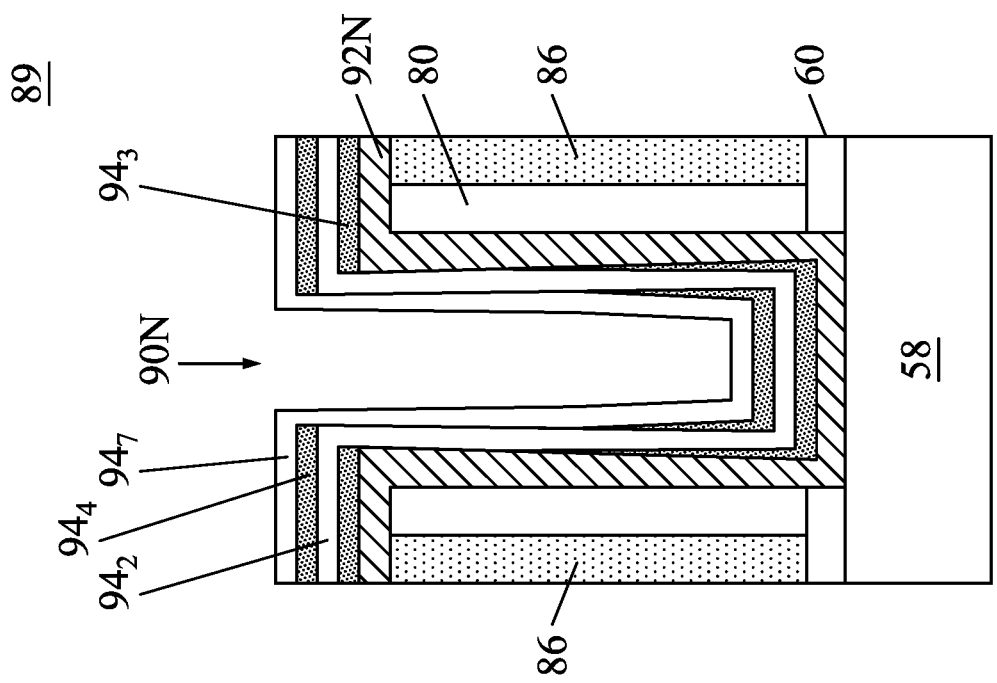
Figure 33P:
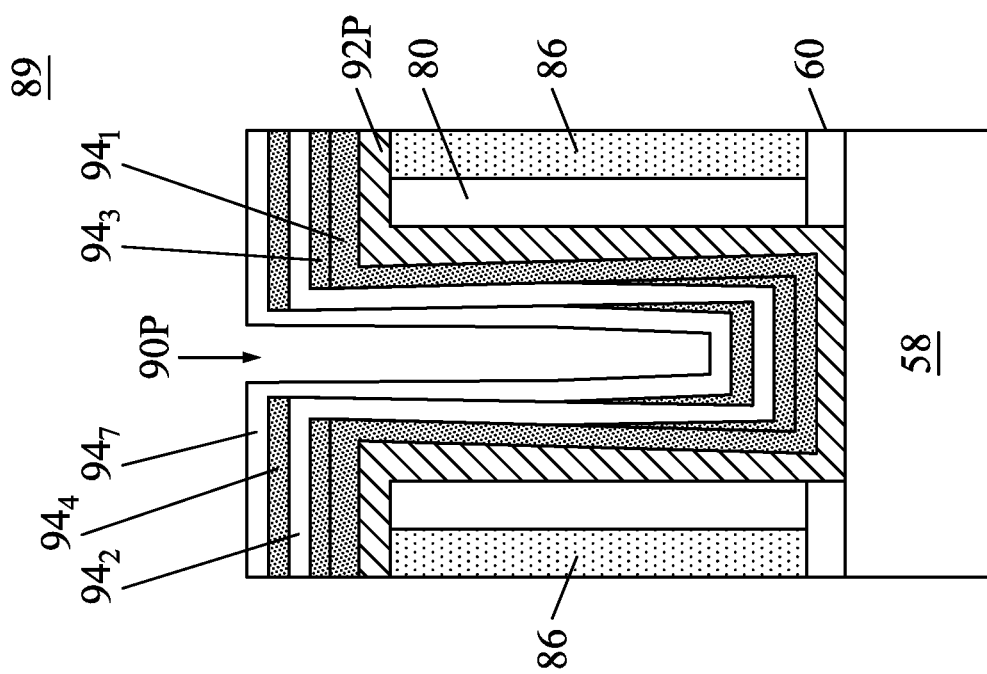

In FIGS. 33P and 33N, a protective layer $94_7$ is formed in the opening 90P in the region 50P and the opening 90N in the region 50N. In some embodiments, the protective layer $94_7$ may be formed using similar materials and methods as the protective layer $94_3$ described above with reference to FIGS. 23P and 23N, and the description is not repeated herein.

Figure 34N:
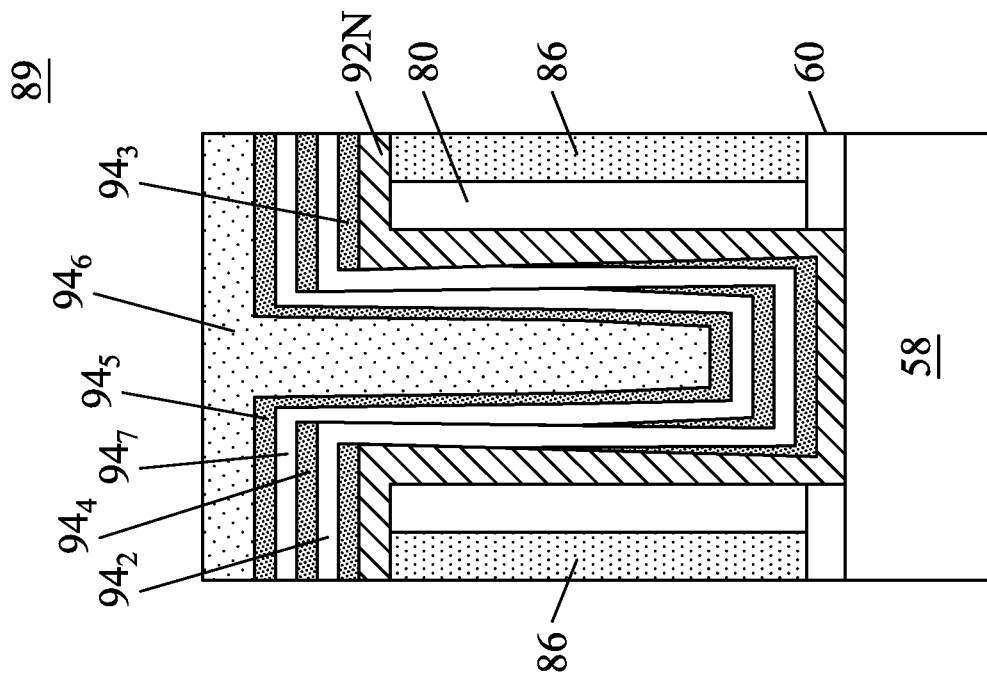
Figure 34P:
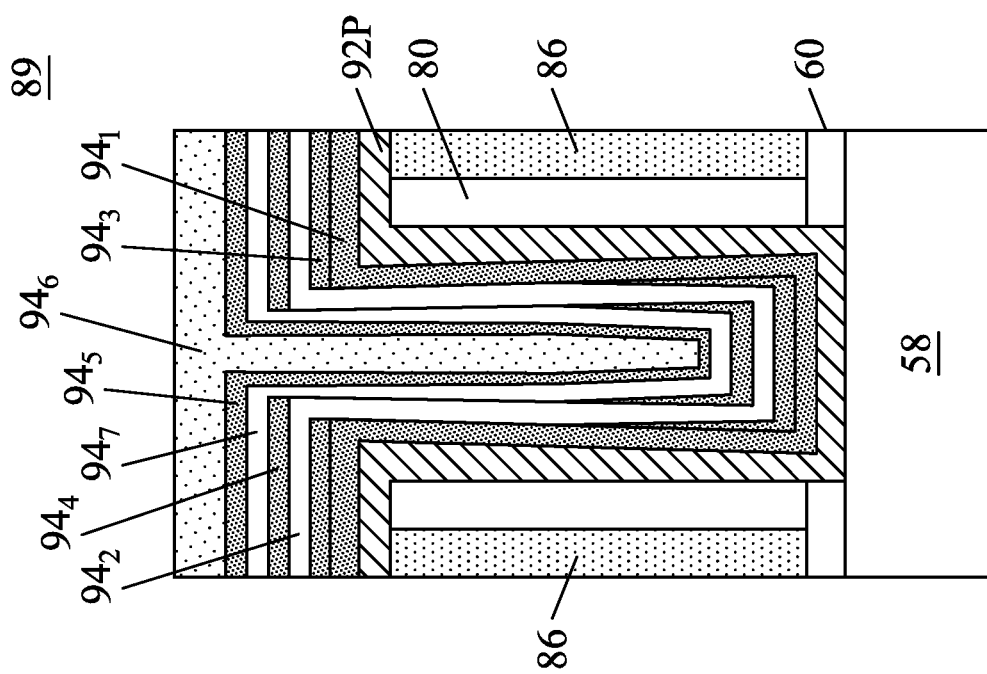

In FIGS. 34P and 34N, a glue layer $94_5$ is formed in the opening 90P in the region 50P and in the opening 90N in the region 50N as described above with reference to FIGS. 26P and 26N, and the description is not repeated herein. Subsequently, a fill material $94_6$ is formed in in the opening 90P in the region 50P and in the opening 90N in the region 50N as described above with reference to FIGS. 26P and 26N, and the description is not repeated herein. By widening the openings 90P and 90N as described above with reference to FIGS. 29P, 29N, 32P, and 32N, the fill material $94_6$ fully fills up the openings 90P and 90N without forming seam void defects within the fill material $94_6$ in the openings 90P and 90N.

Figure 35N:
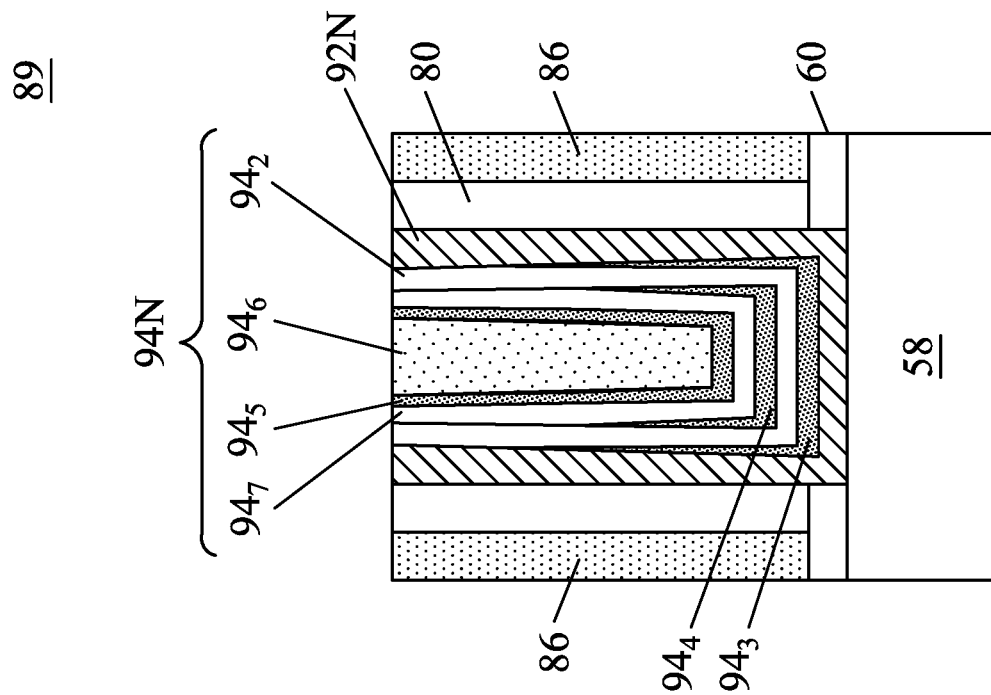
Figure 35P:
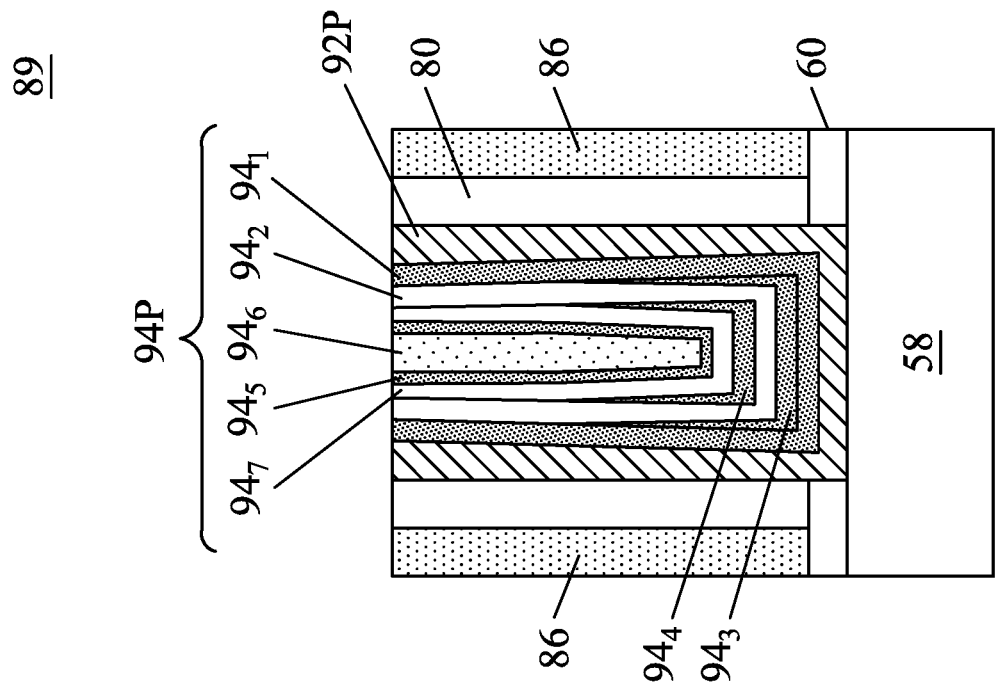

In FIGS. 35P and 35N, after forming the fill material $94_6$, a planarization process, such as a CMP process, may be performed to remove excess portions of the layers 92P, 92N, $94_1$-$94_7$, which excess portions are over the top surface of the first ILD 88. The remaining portion of the gate dielectric layer 92P within the opening 90P forms a gate dielectric 92P of a replacement gates stack of the resulting FinFET device in the region 50P. The remaining portions of the layers $94_1$-$94_7$ within the opening 90P form the gate electrode 94P of the replacement gates stack of the resulting FinFET device in the region 50P. The gate electrode 94P and the respective gate dielectric 92P form the gate stack 92P/94P in the region 50P. The remaining portion of the gate dielectric layer 92N within the opening 90N forms a gate dielectric 92N of a replacement gates stack of the resulting FinFET device in the region 50N. The remaining portions of the layers $94_2$-$94_7$ within the opening 90N form the gate electrode 94N of the replacement gates stack of the resulting FinFET device in the region 50N. The gate electrode 94N and the respective gate dielectric 92N form the gate stack 92N/94N in the region 50N. In some embodiments, the remaining portion of the fill material $94_6$ has a non-uniform width, such that the width of the remaining portion of the fill material $94_6$ decreases as the remaining portion of the fill material $94_6$ extends from the topmost surface of the ILD 88 (see FIG. 14B) toward the respective channel region 58.

In some embodiments, after forming the gate stacks 92P/94P and 92N/94N, the gate stacks 92P/94P and 92N/94N may be patterned in a gate cut process. In some embodiments, the gate cut process may be performed as described above with reference to FIGS. 15A, 15B, 15C, 15D, 16A, 16B, 16C, 16D, 17A, 17B, 17C, and 17D, and the description is not repeated herein. By forming the gate stacks 92P/94P and 92N/94N as described above with reference to FIGS. 28P, 28N, 29P, 29N, 30P, 30N, 31P, 31N, 32P, 32N, 33P, 33N, 34P, 34N, 35P, and 35N, seam void defects are not formed in the gate stacks 92P/94P and 92N/94N and etchants of the gate cut process do not penetrate into the seam void defects to damage the gate stacks 92P/94P and 92N/94N.

FIGS. 36P, 36N, 37P, 37N, 38P, 38N, 39P, 39N, 40P, 40N, 41P, and 41N are cross-sectional views of intermediate stages in the manufacturing of gate stacks in accordance with some embodiments. FIGS. 36P-41P illustrate detailed views of a region 89 of FIG. 14B in the region 50P (see FIGS. 2-7). FIGS. 36N-41N illustrate detailed views of a region 89 of FIG. 14B in the region 50N (see FIGS. 2-7). As described below in greater detail, a gate stack 92P/94P (including a gate dielectric layer 92P and a corresponding overlying gate electrode 94P illustrated in FIG. 41P) is formed in the opening 90P in the region 50P and a gate stack 92N/94N (including a gate dielectric layer 92N and a corresponding overlying gate electrode 94N illustrated in FIG. 41N) is formed in the opening 90N in the region 50N. In some embodiments, some process steps described below with reference to FIGS. 36P, 36N, 37P, 37N, 38P, 38N, 39P, 39N, 40P, 40N, 41P, and 41N are similar to some of the process steps described above with reference to FIGS. 20P, 20N, 21P, 21N, 22P, 22N, 23P, 23N, 24P, 24N, 25P, 25N, 26P, 26N, 27P, and 27N, with like features being labeled by like numerical references, and the description of the like features is not repeated herein.

Figure 36N:
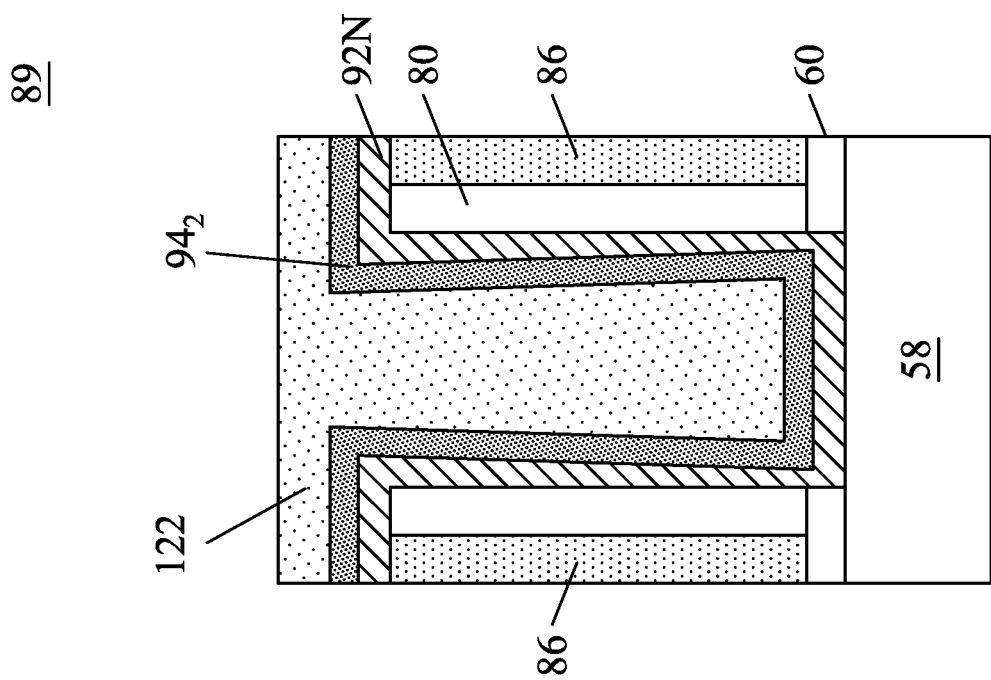
FIGS. 36P, 36N, 37P, 37N, 38P, 38N, 39P, 39N, 40P, 40N, 41P, and 41N are cross-sectional views of intermediate stages in the manufacturing of gate structures in accordance with some embodiments.
Figure 36P:
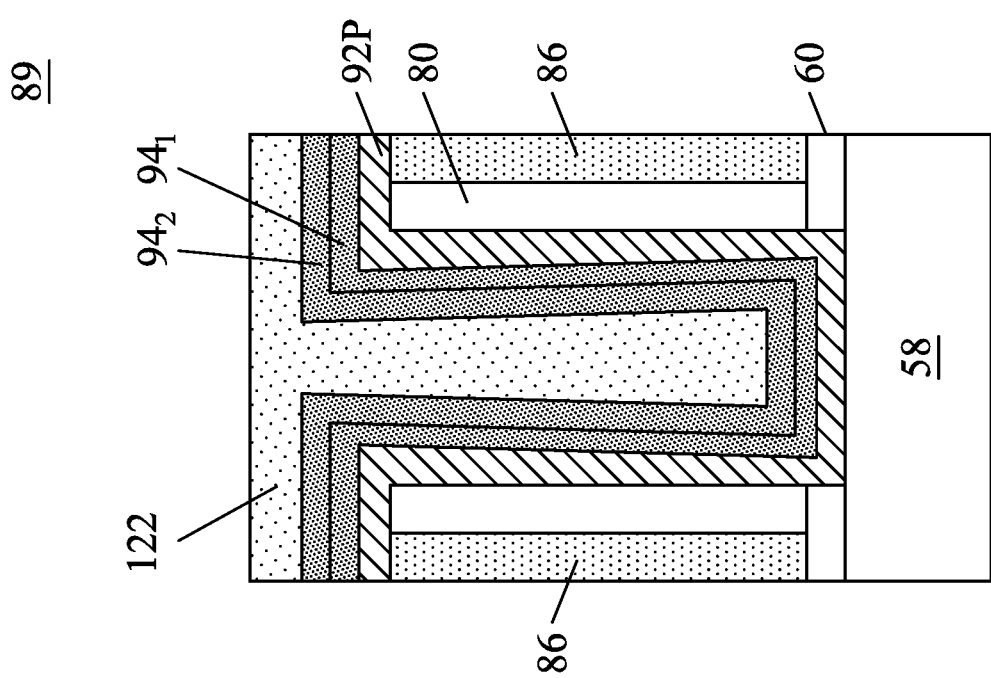

In FIGS. 36P and 36N, after forming an N-type work function layer $94_2$ in the opening 90P in the region 50P and the opening 90N in the region 50N as descried above with reference to FIGS. 22P and 22N, a sacrificial layer 122 is formed in the opening 90P in the region 50P and the opening 90N in the region 50N. In some embodiments, the sacrificial layer 122 overfills the openings 90P and 90N such that a portion of the sacrificial layer 122 extends along the top surface of the first ILD 88. In some embodiments, the sacrificial layer 122 may comprise an organic photo sensitive cross linking polymer material, such as an organic backside anti-reflective coating (BARC), photoresist, or the like, and may be formed using a spin coating process, or the like. In some embodiments, adhesion promoters (such as, for example, Hexamethyl disilazane (HMDS)) and a hard mask layer (for example, comprising TiN) are formed before forming the sacrificial layer 122. In some embodiments when the sacrificial layer 122 comprises organic BARC, the sacrificial layer 122 is formed by spin coating process followed by a baking process to remove solvent. In some embodiments, the sacrificial layer 122 has a thickness between about 300 nm to about 2000 nm.

Figure 37N:
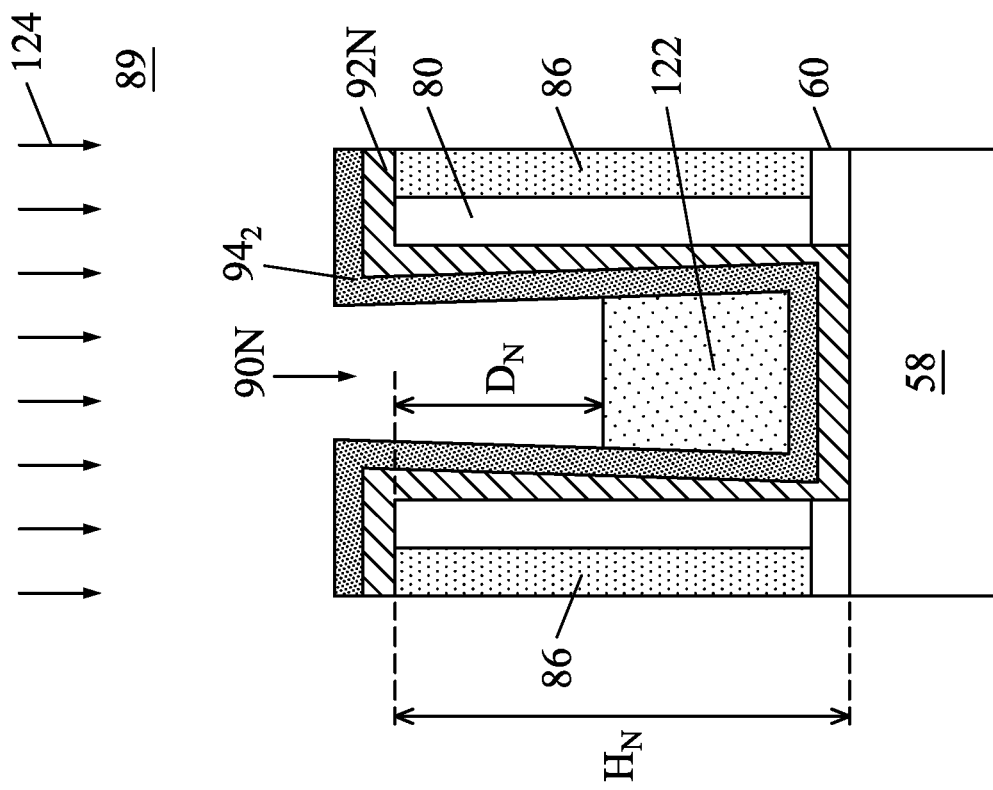
Figure 37P:
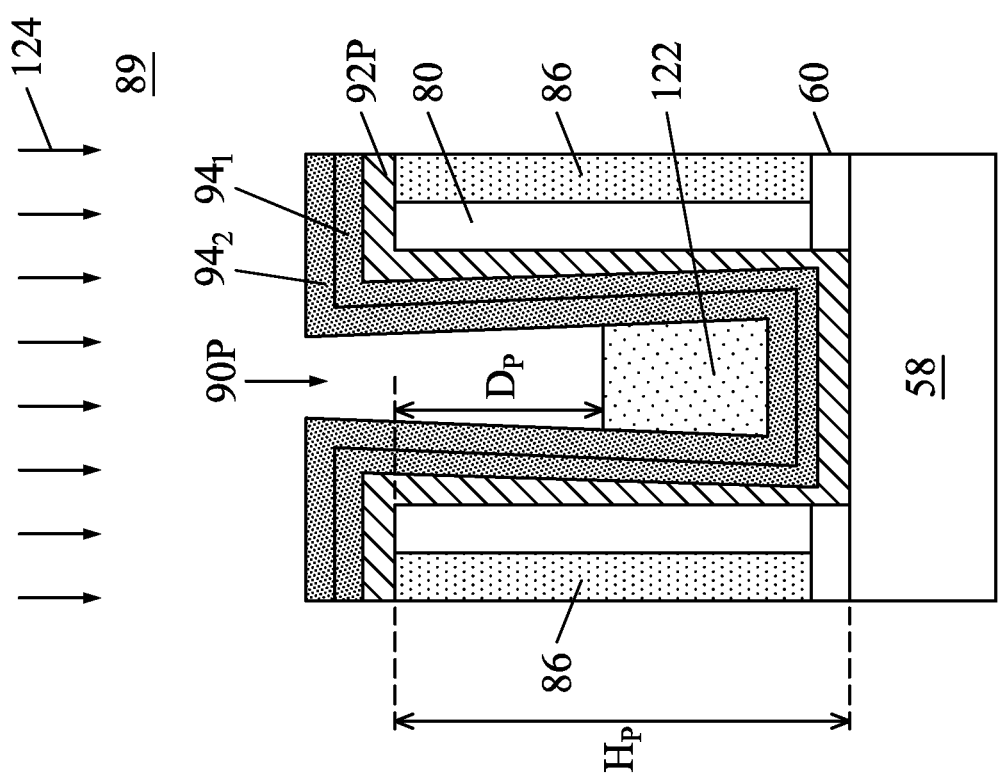

In FIGS. 37P and 37N, an etch process (indicated by arrows 124) is performed to etch back the sacrificial layer 122 below the top surface of the first ILD 88. In some embodiments, the etch process 124 is a plasma process performed by a plasma generated from a gas mixture comprising $H_2$, $N_2$, a combination thereof, or the like. In some embodiments, the etch process 124 may be performed with a plasma power of between about 20 W and about 300 W. In some embodiments, the etch process 124 may be performed with a substrate voltage bias of between about 25 V and about 150 V. In some embodiments, the etch process 124 may be performed at a pressure between about 8 mTorr and about 100 mTorr. In some embodiments, the etch process 124 may be performed at a temperature between about 20° C. and about 200° C. In some embodiments, the etch process 124 may be performed during an etch time between about 10 s and about 400 s.

In some embodiments, the parameters of the etch process 124 may be tuned such that the sacrificial layer 122 is selectively etched without significantly etching the N-type work function layer $94_2$. In some embodiments, in the region 50P, a top surface of the sacrificial layer 122 is recessed below the top surface of the first ILD 88 by a distance $D_P$. In some embodiments, the distance $D_P$ is between about 32 nm and about 80 nm. In some embodiments, the distance $D_P$ is between about 20% and about 75% of a height $H_P$ of the opening 90P. In some embodiments, in the region 50N, a top surface of the sacrificial layer 122 is recessed below the top surface of the first ILD 88 by a distance $D_N$. In some embodiments, the distance $D_N$ is between about 32 nm and about 80 nm. In some embodiments, the distance $D_N$ is between about 20% and about 75% of a height $H_N$ of the opening 90N.

Figure 38N:
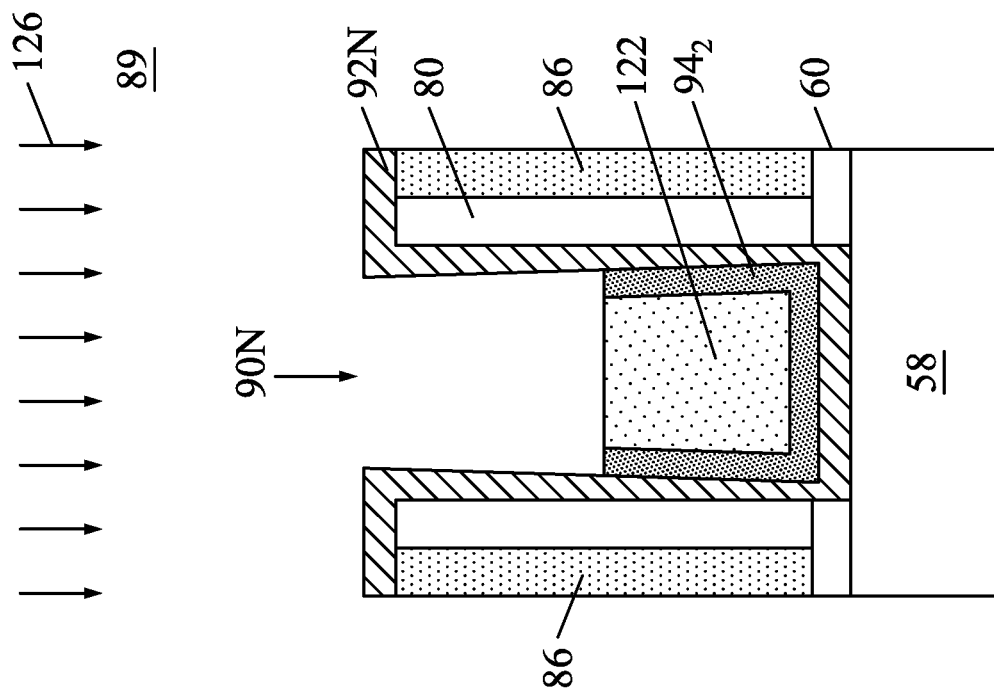
Figure 38P:
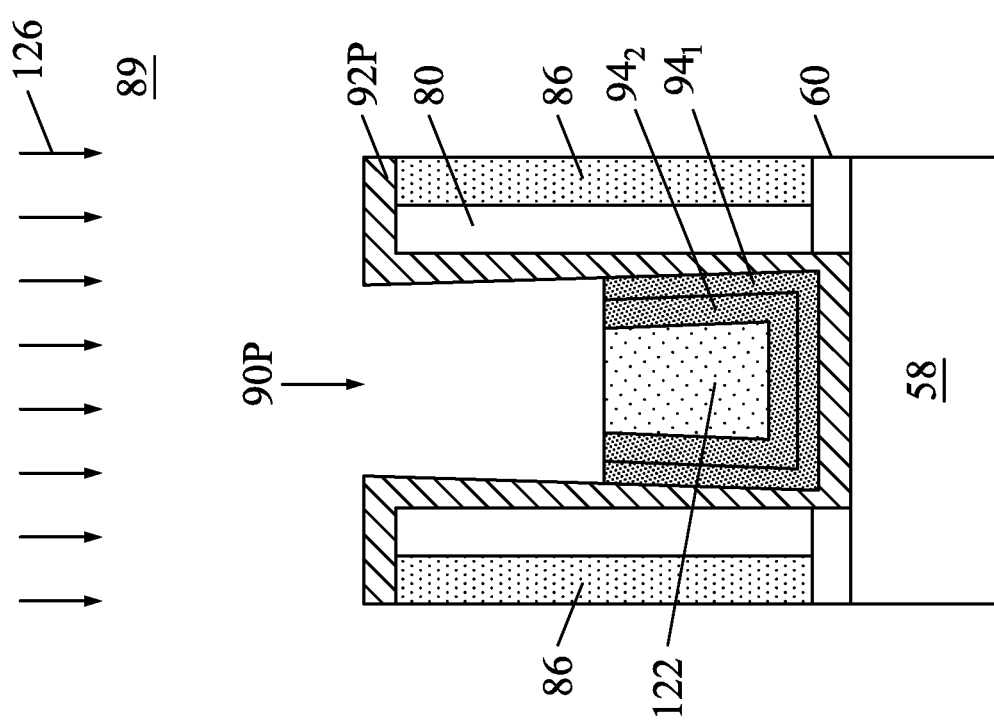

In FIGS. 38P and 38N, an etch process (indicated by arrows 126) is performed to selectively remove portions of the P-type work function layer $94_1$ and the N-type work function layer $94_2$, widen the upper portions of the openings 90P and 90N and improve the filling properties of the openings 90P and 90N. In some embodiments, the etch process 126 is stopped at the gate dielectric layer 92P, when portions of the P-type work function layer 94$_1$ and the N-type work function layer 94$_2$ above a top surface of the recessed sacrificial layer 122 are completely removed. In some embodiments, after completing the etch process 126, a top surface of the P-type work function layer 94$_1$ and a top surface of the N-type work function layer 94$_2$ are substantially level with the top surface of the recessed sacrificial layer 122. In some embodiments, the etch process 126 is a wet etch process, which may be performed using a mixture comprising HCl, H$_2$O$_2$, HF, NH$_4$OH, H$_3$PO$_4$, (de-ionized) DI water, or the like. In the embodiment illustrated in FIGS. 38P and 38N, the etch process 126 may also remove a portion of the gate dielectric layer 92P, such that slopes of exposed surfaces of the gate dielectric layer 92P in the openings 90P and 90N are altered compared to respective surfaces shown in FIGS. 37P and 37N. In other embodiments, the etch process 126 has a high selectivity for removing the P-type work function layer 94$_1$ and the N-type work function layer 94$_2$, without substantially etching of gate dielectric layer 92P. In such embodiments, the slopes of the exposed surfaces of the gate dielectric layer 92P in the openings 90P and 90N are not substantially altered and are substantially same as shown in FIGS. 37P and 37N.

In some embodiments when distance D$_N$ (D$_P$) is less than about 20% of the height H$_N$ (H$_P$) of the opening 90N (90P), such a small distance does not allow for sufficient widening of the top portion of the opening 90N (90P) to avoid issues associated with seam void defects. In some embodiments when distance D$_N$ (D$_P$) is greater than about 75% of the height H$_N$ (H$_P$) of the opening 90N (90P), such a large distance causes degradation of effective work function, increase in threshold voltage (V$_t$), decrease in saturation current (I$_{sat}$), and poor device turn-on performance due to loss of gate stack layers (such as removed portions of the P-type work function layer 94$_1$ and the N-type work function layer 94$_2$).

Figure 39N:
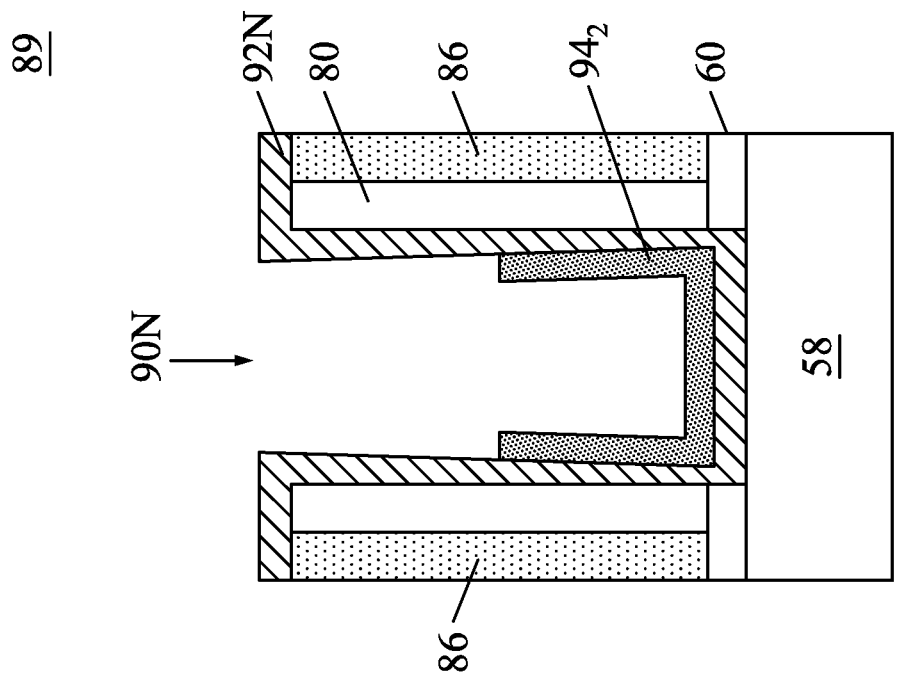
Figure 39P:
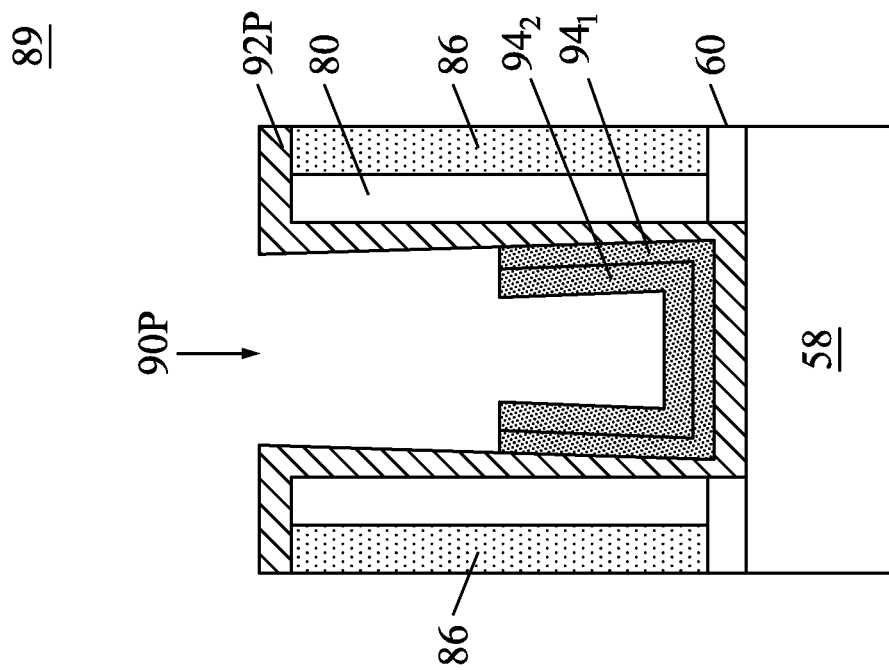

In FIGS. 39P and 39N, the recessed sacrificial layer 122 (see FIGS. 38P and 38N) is removed. In some embodiments, the recessed sacrificial layer 122 may be removed using an ashing process followed by a wet clean process. In some embodiments, the ashing process is a plasma process performed by plasma generated from a gas mixture comprising N$_2$, H$_2$, a combination thereof, or the like. In some embodiments when the ashing process is a plasma process, the plasma process is performed without any substrate bias. In some embodiments when the ashing process is a plasma process, the plasma process is performed at a temperature between about 50° C. and about 300° C. In some embodiments, the wet clean process may be performed using a mixture comprising DI water, dilute hydrofluoric (dHF) acid, a combination thereof, or the like.

Figure 40P:
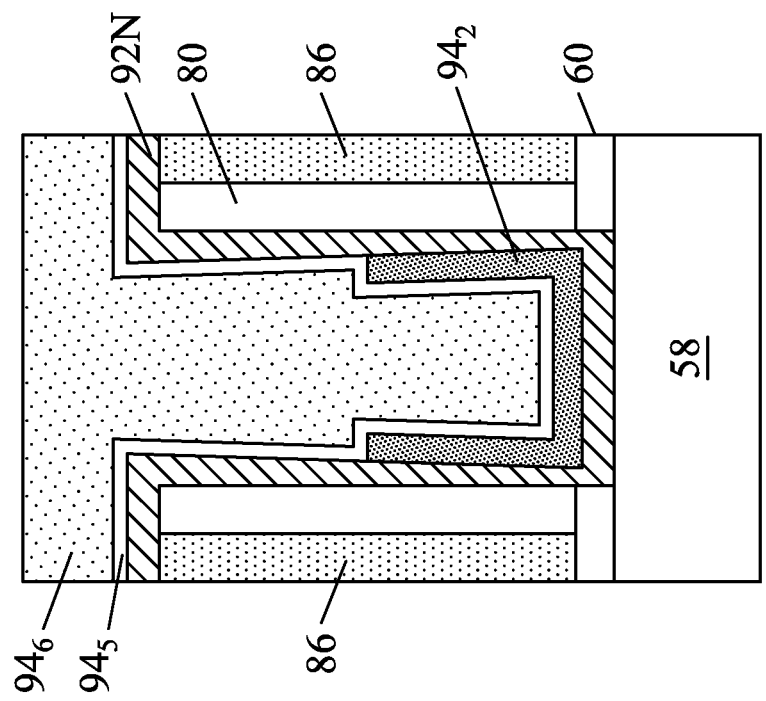
Figure 40N:
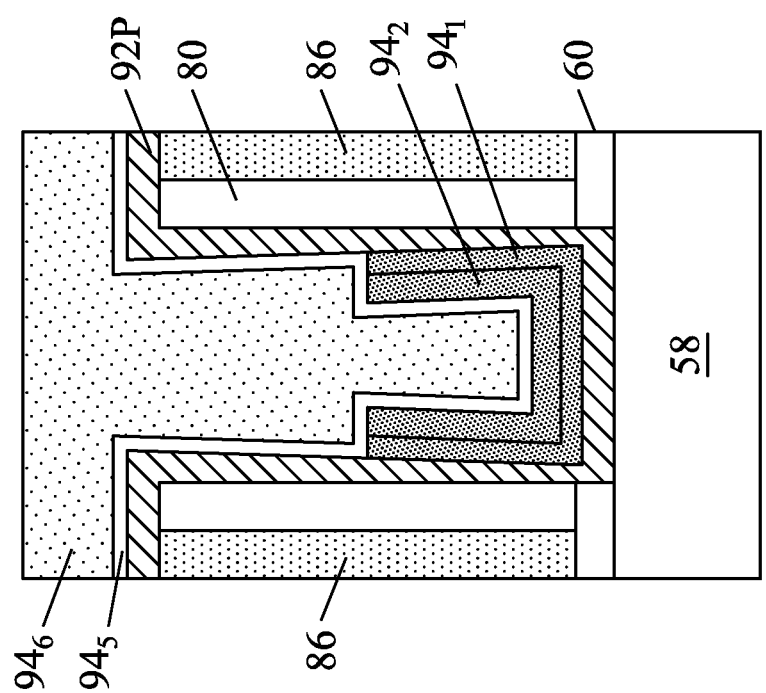

In FIGS. 40P and 40N, a glue layer 94$_5$ is formed in the opening 90P in the region 50P and in the opening 90N in the region 50N as described above with reference to FIGS. 26P and 26N, and the description is not repeated herein. Subsequently, a fill material 94$_6$ is formed in in the opening 90P in the region 50P and in the opening 90N in the region 50N as described above with reference to FIGS. 26P and 26N, and the description is not repeated herein. By widening the openings 90P and 90N as described above with reference to FIGS. 38P and 38N, the fill material 94$_6$ fully fills the openings 90P and 90N without forming seam void defects within the fill material 94$_6$ in the openings 90P and 90N.

Figure 41N:
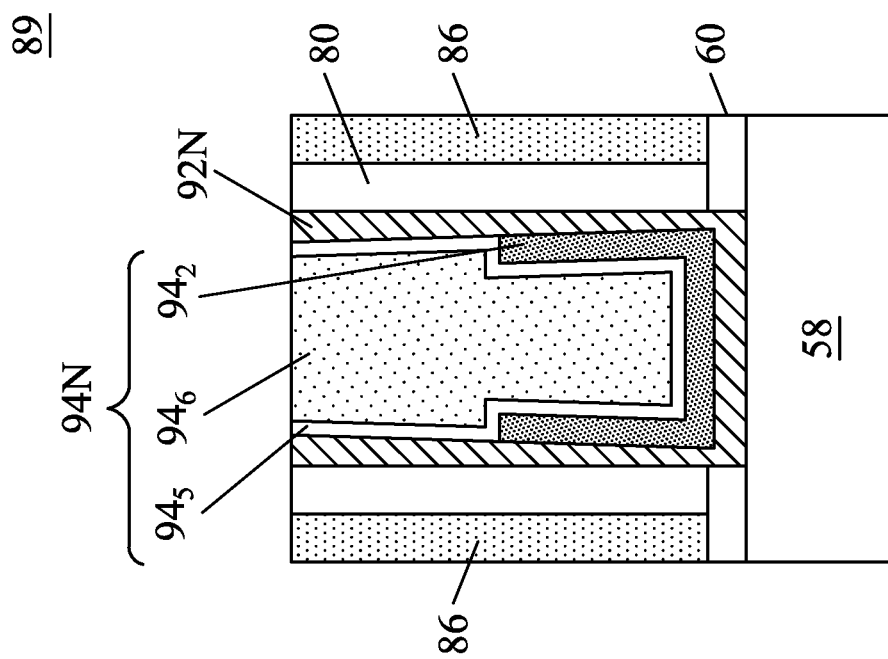
Figure 41P:
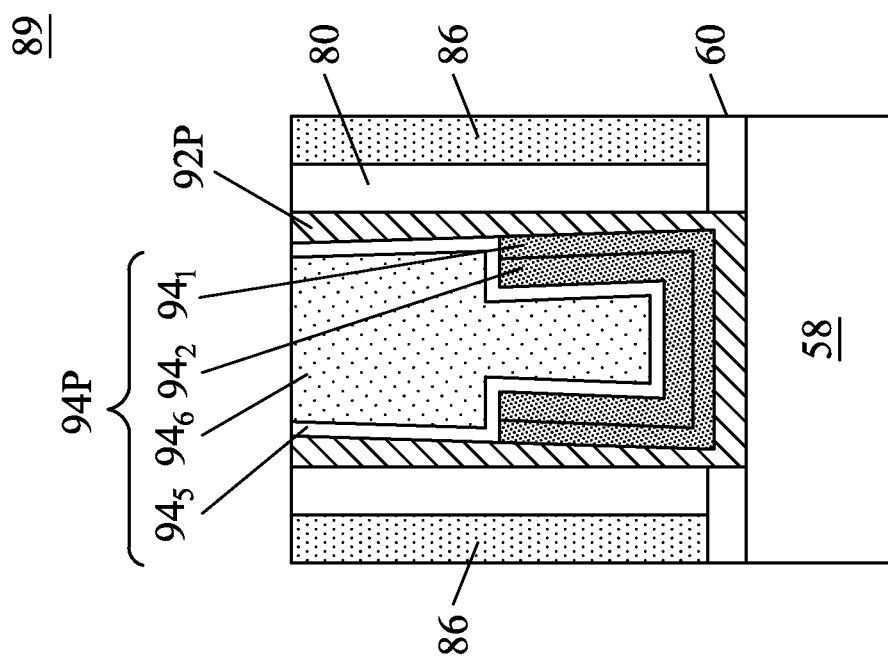

In FIGS. 41P and 41N, after forming the fill material 94$_6$, a planarization process, such as a CMP process, may be performed to remove excess portions of the layers 92P, 92N, 94$_5$, and 94$_6$, which excess portions are over the top surface of the first ILD 88. The remaining portion of the gate dielectric layer 92P within the opening 90P forms the gate dielectric layer 92P of a replacement gates stack of the resulting FinFET device in the region 50P. The remaining portions of the layers 94$_1$, 94$_2$, 94$_5$, and 94$_6$ within the opening 90P form the gate electrode 94P of the replacement gates stack of the resulting FinFET device in the region 50P. The gate electrode 94P and the respective gate dielectric 92P form the gate stack 92P/94P in the region 50P. The remaining portion of the gate dielectric layer 92N within the opening 90N form the gate dielectrics 92N of a replacement gates stack of the resulting FinFET device in the region 50N. The remaining portions of the layers 94$_2$, 94$_5$, and 94$_6$ within the opening 90N form the gate electrode 94N of the replacement gates stack of the resulting FinFET device in the region 50N. The gate electrode 94N and the respective gate dielectric 92N form the gate stack 92N/94N in the region 50N.

In some embodiments, after forming the gate stacks 92P/94P and 92N/94N, the gate stacks 92P/94P and 92N/94N may be patterned in a gate cut process. In some embodiments, the gate cut process may be performed as described above with reference to FIGS. 15A, 15B, 15C, 15D, 16A, 16B, 16C, 16D, 17A, 17B, 17C, and 17D, and the description is not repeated herein. By forming the gate stacks 92P/94P and 92N/94N as described above with reference to FIGS. 36P, 36N, 37P, 37N, 38P, 38N, 39P, 39N, 40P, 40N, 41P, and 41N, seam void defects are not formed in the gate stacks 92P/94P and 92N/94N and etchants of the gate cut process do not penetrate into the seam void defects to damage the gate stacks 92P/94P and 92N/94N.

Figure 42:
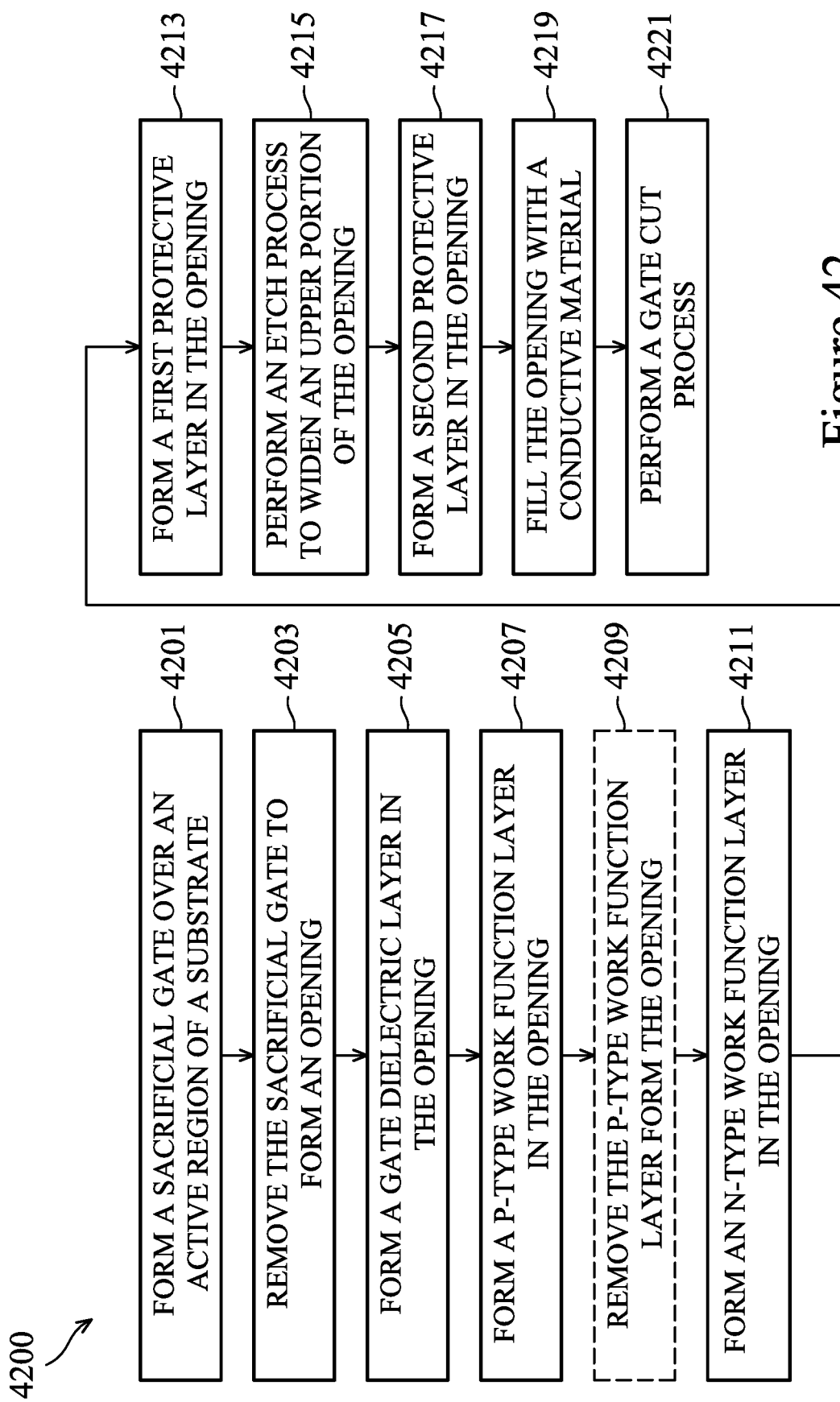
FIG. 42 is a flow diagram illustrating a method of forming a gate structure in accordance with some embodiments.

FIG. 42 is a flow diagram illustrating a method 4200 of forming a semiconductor device in accordance with some embodiments. The method 4200 may be used to form a gate stack in both a p-type device region and an n-type device region of a semiconductor device. In some embodiments when the method 4200 forms a gate stack in an n-type device region of a semiconductor device, all process steps of the method 4200 are performed. In some embodiments when the method 4200 forms a gate stack in a p-type device region of a semiconductor device, all process steps of the method 4200 are performed except for the step 4209. The method 4200 starts with step 4201, where a sacrificial gate (such as the gate 72 illustrated in FIGS. 8A and 8B) is formed over an active region of a substrate (such as the substrate 50 illustrated in FIGS. 8A and 8B) as described above with reference to 8A and 8B. In step 4203, the sacrificial gate is removed to form an opening (such as the opening 90 illustrated in FIGS. 13A and 13B) as described above with reference to 13A and 13B. In step 4205, a gate dielectric layer (such as the gate dielectric layer 92P illustrated in FIG. 20P) is formed in the opening as described above with reference to FIG. 20P. In step 4207, a P-type work function layer (such as the P-type work function layer 94$_1$ illustrated in FIG. 21P) is formed in the opening as described above with reference to FIG. 21P. In some embodiments when the method 4200 forms a gate stack in a p-type device region of a semiconductor device, step 4209 is omitted. In some embodiments when the method 4200 forms a gate stack in an n-type device region of a semiconductor device, step 4209 is performed where the P-type work function layer is removed from the opening as described above with reference to FIG. 21N. In step 4211, an N-type work function layer (such as the N-type work function layer 94$_2$ illustrated in FIG. 22P) is formed in the opening as described above with reference to FIG. 22P. In step 4213, a first protective layer (such as the protective layer 94$_3$ illustrated in FIG.

23P) is formed in the opening as described above with reference to FIG. 23P. In step 4215, an etch process (such as the etch process 116 illustrated in FIG. 24P) is performed to widen an upper portion of the opening as described above with reference to FIG. 24P. In step 4217, a second protective layer (such as the protective layer $94_4$ illustrated in FIG. 25P) is formed in the opening as described above with reference to FIG. 25P. In step 4219, the opening is filled with a conductive material (such as the glue layer $94_5$ and the fill material $94_6$ illustrated in FIG. 26P) as described above with reference to FIG. 26P. In step 4221, a gate cut process is performed as described above with reference to FIGS. 15A, 15B, 15C, 15D, 16A, 16B, 16C, 16D, 17A, 17B, 17C, and 17D.

Figure 43:
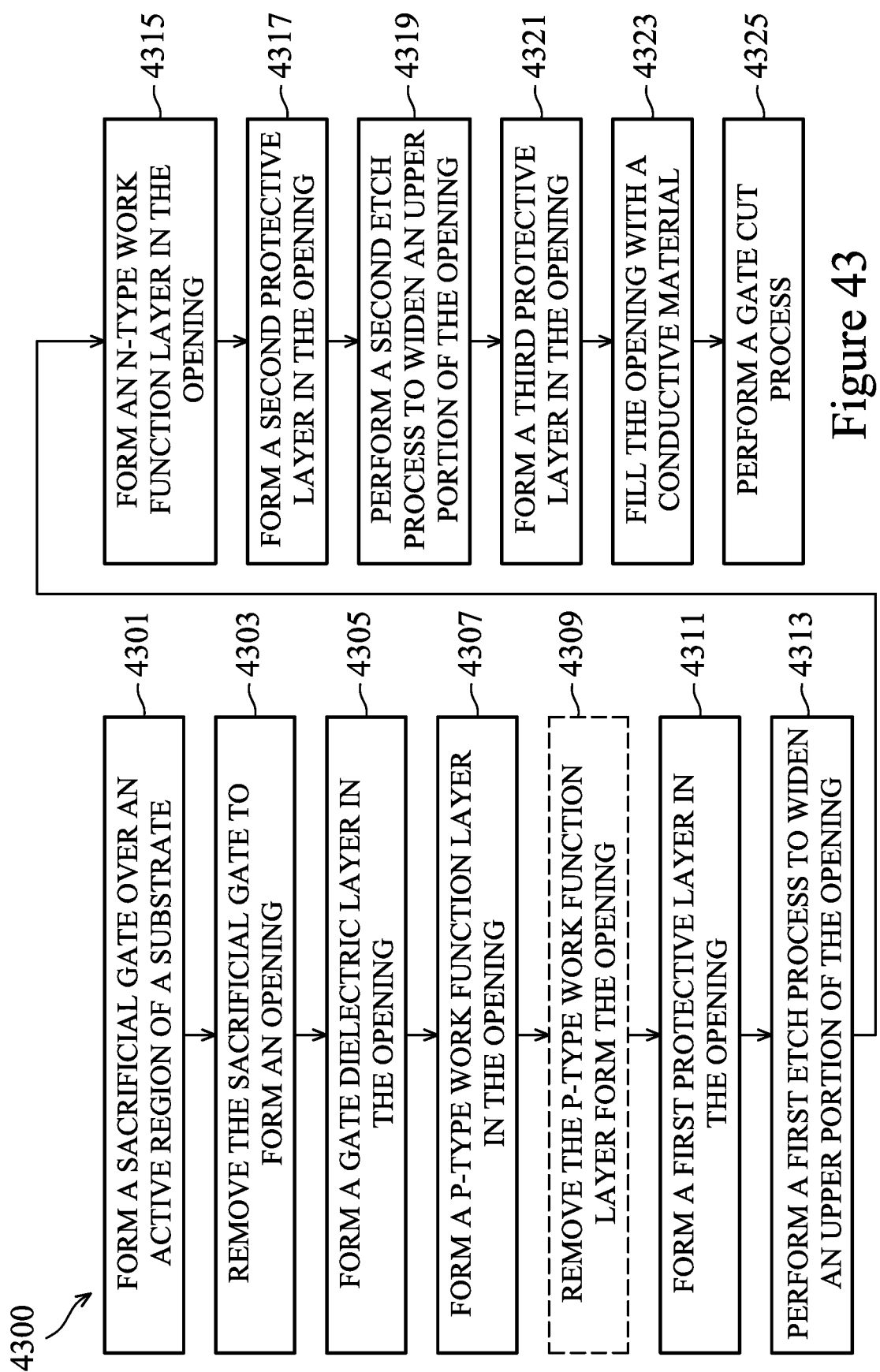
FIG. 43 is a flow diagram illustrating a method of forming a gate structure in accordance with some embodiments.

FIG. 43 is a flow diagram illustrating a method 4300 of forming a semiconductor device in accordance with some embodiments. The method 4300 may be used to form a gate stack in both a p-type device region and an n-type device region of a semiconductor device. In some embodiments when the method 4300 forms a gate stack in an n-type device region of a semiconductor device, all process steps of the method 4300 are performed. In some embodiments when the method 4300 forms a gate stack in a p-type device region of a semiconductor device, all process steps of the method 4300 are performed except for the step 4309. The method 4300 starts with step 4301, where a sacrificial gate (such as the gate 72 illustrated in FIGS. 8A and 8B) is formed over an active region of a substrate (such as the substrate 50 illustrated in FIGS. 8A and 8B) as described above with reference to 8A and 8B. In step 4303, the sacrificial gate is removed to form an opening (such as the opening 90 illustrated in FIGS. 13A and 13B) as described above with reference to 13A and 13B. In step 4305, a gate dielectric layer (such as the gate dielectric layer 92P illustrated in FIG. 20P) is formed in the opening as described above with reference to FIG. 20P. In step 4307, a P-type work function layer (such as the P-type work function layer $94_1$ illustrated in FIG. 21P) is formed in the opening as described above with reference to FIG. 21P. In some embodiments when the method 4300 forms a gate stack in a p-type device region of a semiconductor device, step 4309 is omitted. In some embodiments when the method 4300 forms a gate stack in an n-type device region of a semiconductor device, step 4309 is performed where the P-type work function layer is removed from the opening as described above with reference to FIG. 21N. In step 4311, a first protective layer (such as the protective layer $94_3$ illustrated in FIG. 28P) is formed in the opening as described above with reference to FIG. 28P. In step 4313, a first etch process (such as the etch process 118 illustrated in FIG. 29P) is performed to widen an upper portion of the opening as described above with reference to FIG. 29P. In step 4315, an N-type work function layer (such as the N-type work function layer $94_2$ illustrated in FIG. 30P) is formed in the opening as described above with reference to FIG. 30P. In step 4317, a second protective layer (such as the protective layer $94_4$ illustrated in FIG. 31P) is formed in the opening as described above with reference to FIG. 31P. In step 4319, a second etch process (such as the etch process 120 illustrated in FIG. 32P) is performed to widen an upper portion of the opening as described above with reference to FIG. 32P. In step 4321, a third protective layer (such as the protective layer $94_7$ illustrated in FIG. 33P) is formed in the opening as described above with reference to FIG. 33P. In step 4323, the opening is filled with a conductive material (such as the glue layer $94_5$ and the fill material $94_6$ illustrated in FIG. 34P) as described above with reference to FIG. 34P. In step 4325, a gate cut process is performed as described above with reference to FIGS. 15A, 15B, 15C, 15D, 16A, 16B, 16C, 16D, 17A, 17B, 17C, and 17D.

Figure 44:
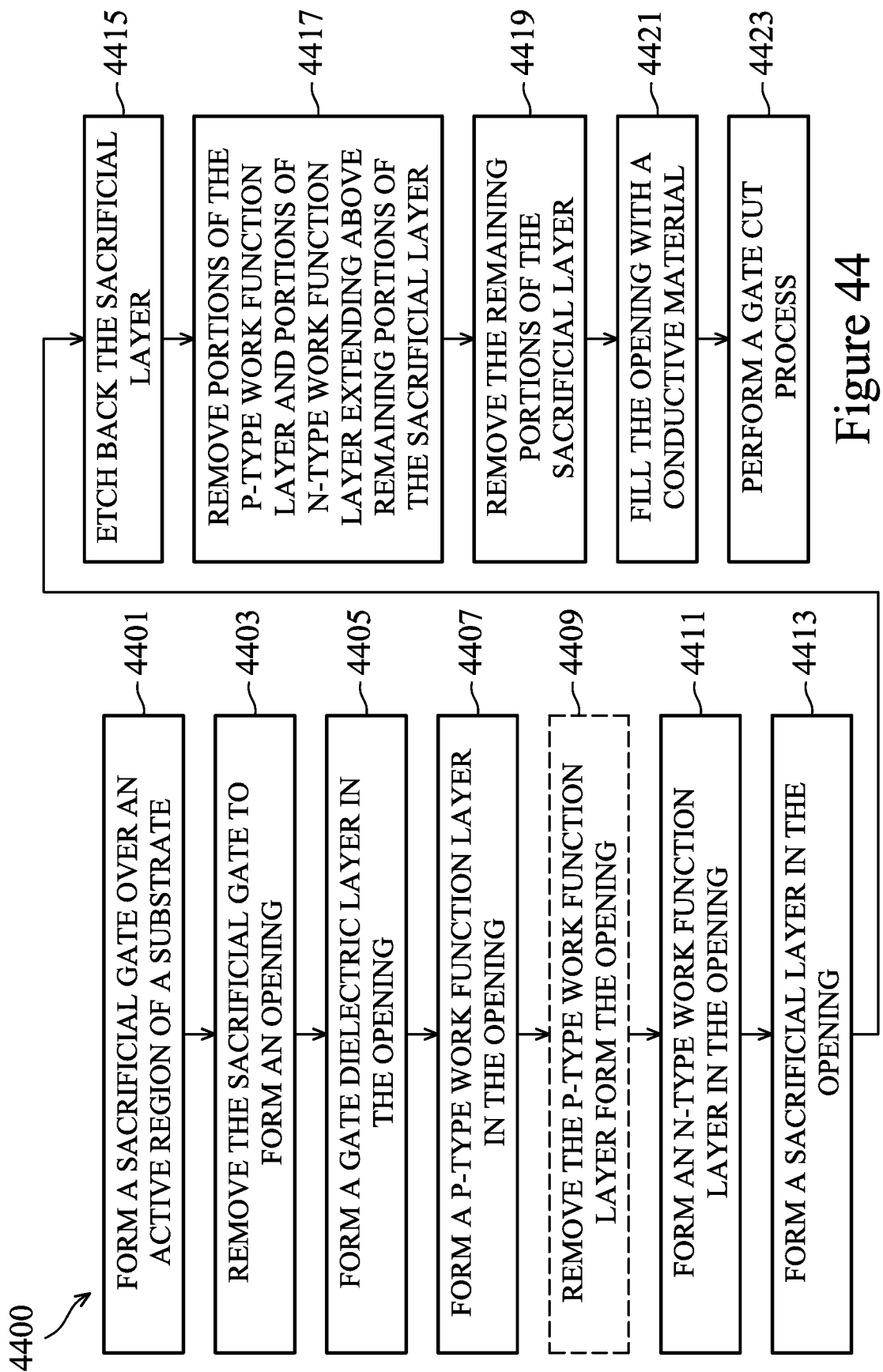
FIG. 44 is a flow diagram illustrating a method of forming a gate structure in accordance with some embodiments.

FIG. 44 is a flow diagram illustrating a method 4400 of forming a semiconductor device in accordance with some embodiments. The method 4400 may be used to form a gate stack in both a p-type device region and an n-type device region of a semiconductor device. In some embodiments when the method 4400 forms a gate stack in an n-type device region of a semiconductor device, all process steps of the method 4400 are performed. In some embodiments when the method 4400 forms a gate stack in a p-type device region of a semiconductor device, all process steps of the method 4400 are performed except for the step 4409. The method 4400 starts with step 4401, where a sacrificial gate (such as the gate 72 illustrated in FIGS. 8A and 8B) is formed over an active region of a substrate (such as the substrate 50 illustrated in FIGS. 8A and 8B) as described above with reference to 8A and 8B. In step 4403, the sacrificial gate is removed to form an opening (such as the opening 90 illustrated in FIGS. 13A and 13B) as described above with reference to 13A and 13B. In step 4405, a gate dielectric layer (such as the gate dielectric layer 92P illustrated in FIG. 20P) is formed in the opening as described above with reference to FIG. 20P. In step 4407, a P-type work function layer (such as the N-type work function layer $94_1$ illustrated in FIG. 21P) is formed in the opening as described above with reference to FIG. 21P. In some embodiments when the method 4400 forms a gate stack in a p-type device region of a semiconductor device, step 4409 is omitted. In some embodiments when the method 4400 forms a gate stack in an n-type device region of a semiconductor device, step 4409 is performed where the P-type work function layer is removed from the opening as described above with reference to FIG. 21N. In step 4411, an N-type work function layer (such as the N-type work function layer $94_2$ illustrated in FIG. 22P) is formed in the opening as described above with reference to FIG. 22P. In step 4413, a sacrificial layer (such as the sacrificial layer 122 illustrated in FIG. 36P) is formed in the opening as described above with reference to FIG. 36P. In step 4415, the sacrificial layer is etched back as described above with reference to FIG. 37P. In step 4417, portions of the P-type work function layer and portions of the P-type work function layer disposed above remaining portions of the sacrificial layer are removed as described above with reference to FIG. 38P. In step 4419, the remaining portions of the sacrificial layer are removed as described above with reference to FIG. 39P. In step 4421, the opening is filled with a conductive material (such as the glue layer $94_5$ and the fill material $94_6$ illustrated in FIG. 40P) as described above with reference to FIG. 40P. In step 4423, a gate cut process is performed as described above with reference to FIGS. 15A, 15B, 15C, 15D, 16A, 16B, 16C, 16D, 17A, 17B, 17C, and 17D.

In accordance with an embodiment, a method includes forming a sacrificial gate over an active region of a substrate. The sacrificial gate is removed to form an opening. A gate dielectric layer is formed on sidewalls and a bottom of the opening. A first work function layer is formed over the gate dielectric layer in the opening. A first protective layer is formed over the first work function layer in the opening. A first etch process is performed to widen an upper portion of the opening. The opening is filled with a conductive material.

In accordance with another embodiment, a method includes forming a sacrificial gate over an active region of a substrate. The sacrificial gate is removed to form an opening. A gate dielectric layer is formed on sidewalls and a bottom of the opening. A first work function layer is formed over the gate dielectric layer in the opening. The opening is filled with a sacrificial layer. The sacrificial layer is etched back to expose an upper portion of the first work function layer within the opening. The upper portion of the first work function layer is removed to expose an upper portion of the gate dielectric layer within the opening. A remaining portion of the sacrificial layer is removed. The opening is filled with a conductive material.

In accordance with yet another embodiment, a device includes a gate stack over an active region of a substrate. The gate stack includes a conductive material, a first protective layer lining sidewalls and a bottom surface of the conductive material, and a second protective layer lining sidewalls and a bottom surface of the first protective layer. The first protective layer and the second protective layer include different materials. The gate stack further includes an N-type work function layer lining sidewalls and a bottom surface of the second protective layer. An upper portion of the N-type work function layer is in physical contact with an upper portion of the first protective layer. The gate stack further includes a gate dielectric layer lining sidewalls and a bottom surface of the N-type work function layer.

In accordance with yet another embodiment, a device includes a gate stack over an active region of a substrate. The gate stack includes a conductive material. The conductive material comprising an upper portion having a first width and a lower portion having a second width. The first width being greater than the second width. An N-type work function layer and P-type work function layer line sidewalls and a bottom surface of the lower portion of the conductive material. The N-type work function layer is interposed between the P-type work function layer and the lower portion of the conductive material. Topmost surfaces of the P-type work function layer and the N-type work function layer are in physical contact with a bottom surface of the upper portion of the conductive material. A gate dielectric layer lines the sidewalls and the bottom surface of the lower portion of the conductive material and sidewalls of the upper portion of the conductive material. The gate dielectric layer is in physical contact with the P-type work function layer and the sidewalls of the upper portion of the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate stack over an active region of a substrate, the gate stack comprising:
   a conductive material;
   a first protective layer lining sidewalls and a bottom surface of the conductive material;
   a second protective layer lining sidewalls and a bottom surface of the first protective layer, the first protective layer and the second protective layer comprising different materials;
   an N-type work function layer lining sidewalls and a bottom surface of the second protective layer, an upper portion of the N-type work function layer being in physical contact with an upper portion of the first protective layer;
   a gate dielectric layer lining sidewalls and a bottom surface of the N-type work function layer;
   a P-type work function layer between the N-type work function layer and the gate dielectric layer; and
   a third protective layer between the N-type work function layer and the P-type work function layer, the upper portion of the N-type work function layer being in physical contact with an upper portion of the P-type work function layer.

2. The device of claim 1, wherein a topmost surface of the first protective layer is level with a topmost surface of the conductive material.

3. A device comprising:
   a gate stack over an active region of a substrate, the gate stack comprising:
   a conductive material;
   a first protective layer lining sidewalls and a bottom surface of the conductive material;
   a second protective layer lining sidewalls and a bottom surface of the first protective layer, the first protective layer and the second protective layer comprising different materials;
   an N-type work function layer lining sidewalls and a bottom surface of the second protective layer, an upper portion of the N-type work function layer being in physical contact with an upper portion of the first protective layer;
   a gate dielectric layer lining sidewalls and a bottom surface of the N-type work function layer; and
   a third protective layer between the gate dielectric layer and the N-type work function layer, the upper portion of the N-type work function layer being in physical contact with an upper portion of the gate dielectric layer.

4. A device comprising:
   a gate stack over an active region of a substrate, the gate stack comprising:
   a conductive material;
   a first protective layer lining sidewalls and a bottom surface of the conductive material;
   a second protective layer lining sidewalls and a bottom surface of the first protective layer, the first protective layer and the second protective layer comprising different materials, wherein a thickness of the second protective layer narrows as the second protective layer extends along the sidewalls of the first protective layer away from the active region of the substrate;
   an N-type work function layer lining sidewalls and a bottom surface of the second protective layer, an upper portion of the N-type work function layer being in physical contact with an upper portion of the first protective layer; and
   a gate dielectric layer lining sidewalls and a bottom surface of the N-type work function layer.

5. The device of claim 4, wherein the upper portion of the N-type work function layer is in physical contact with an upper portion of the gate dielectric layer.

6. The device of claim 4, further comprising a P-type work function layer between the N-type work function layer and the gate dielectric layer.

7. The device of claim 6, further comprising a third protective layer between the N-type work function layer and the P-type work function layer, the upper portion of the N-type work function layer being in physical contact with an upper portion of the P-type work function layer.

8. A device comprising:
a gate stack over an active region of a substrate, the gate stack comprising:
 a conductive material;
 a first protective layer lining sidewalls and a bottom surface of the conductive material;
 a second protective layer lining sidewalls and a bottom surface of the first protective layer;
 an N-type work function layer lining sidewalls and a bottom surface of the second protective layer, an upper portion of the N-type work function layer being in physical contact with an upper portion of the first protective layer;
 a third protective layer lining sidewalls and a bottom surface of the N-type work function layer; and
 a gate dielectric layer lining sidewalls and a bottom surface of the third protective layer, an upper portion of the gate dielectric layer being in physical contact with the upper portion of the N-type work function layer, wherein an upper surface of the first protective layer is level with an upper surface of the gate dielectric layer.

9. The device of claim 8, wherein the third protective layer completely covers a bottom of the N-type work function layer in a cross-sectional view.

10. The device of claim 9, wherein the second protective layer completely covers a bottom of the first protective layer in the cross-sectional view.

11. The device of claim 8, wherein an upper surface of the first protective layer is level with an upper surface of the conductive material.

12. The device of claim 11, wherein an upper surface of the first protective layer is level with the upper surface of the N-type work function layer.

13. The device of claim 8, wherein the conductive material comprises a conductive glue layer and a conductive fill over the conductive glue layer.

14. The device of claim 8, wherein the N-type work function layer completely separates the third protective layer from the second protective layer and the first protective layer in a cross-sectional view.

15. The device of claim 8, wherein a thickness of an upper portion of the gate dielectric layer is greater than a thickness of a lower portion of the gate dielectric layer.

16. A device comprising:
a gate stack over an active region of a substrate, the gate stack comprising:
 a conductive material comprising an upper region and a lower region, a width of the upper region being greater than a width of the lower region;
 an N-type work function layer lining sidewalls and a bottom surface of the lower region of the conductive material; and
 a gate dielectric layer lining sidewalls and a bottom surface of the N-type work function layer, an upper portion of the gate dielectric layer being in physical contact with sidewalls of the upper region of the conductive material, wherein a thickness of the upper portion of the gate dielectric layer is greater than a thickness of a lower portion of the gate dielectric layer.

17. The device of claim 16, further comprising a P-type work function layer between the N-type work function layer and the gate dielectric layer.

18. The device of claim 17, wherein the N-type work function layer completely separates the P-type work function layer and the gate dielectric layer.

19. The device of claim 16, wherein the conductive material comprises a conductive lining layer and a fill material over the conductive lining layer.

20. The device of claim 19, wherein the conductive lining layer physically contacts an uppermost surface of the N-type work function layer in a cross-sectional view.

* * * * *